US009930230B2

(12) United States Patent
Costa

(10) Patent No.: US 9,930,230 B2
(45) Date of Patent: Mar. 27, 2018

(54) HARSH ENVIRONMENT VISION CAMERA SYSTEM

(71) Applicant: Larry Costa, Mooresville, NC (US)

(72) Inventor: Larry Costa, Mooresville, NC (US)

(*) Notice: Subject to any disclaimer, the term of this patent is extended or adjusted under 35 U.S.C. 154(b) by 0 days.

(21) Appl. No.: 15/435,855

(22) Filed: Feb. 17, 2017

(65) Prior Publication Data

US 2017/0230548 A1 Aug. 10, 2017

Related U.S. Application Data

(63) Continuation-in-part of application No. 14/875,317, filed on Oct. 5, 2015, now Pat. No. 9,573,181.

(60) Provisional application No. 62/059,692, filed on Oct. 3, 2014.

(51) Int. Cl.

| | |
|---|---|
| ***H04N 5/225*** | (2006.01) |
| ***G03B 11/04*** | (2006.01) |
| ***G03B 17/55*** | (2006.01) |
| ***H05K 7/20*** | (2006.01) |
| *G06K 7/06* | (2006.01) |

(52) U.S. Cl.

CPC ........... *H04N 5/2252* (2013.01); *G03B 11/04* (2013.01); *G03B 17/55* (2013.01); *H04N 5/2257* (2013.01); *H05K 7/20145* (2013.01); *H04N 2005/2255* (2013.01)

(58) Field of Classification Search

CPC ....... G06K 2007/10524; G06K 7/0004; B23Q 17/2409; B23Q 2230/002; G05B 2219/37009; G05B 2219/37555

USPC .......................................................... 235/441

See application file for complete search history.

(56) References Cited

U.S. PATENT DOCUMENTS 4,317,287 A 3/1982 Sausele
4,687,390 A 8/1987 Samis
4,834,595 A 5/1989 Cacciotti
5,339,188 A 8/1994 Fritzel
5,731,881 A 3/1998 Beuchler
(Continued)

OTHER PUBLICATIONS

Notification of Transmittal of the International Search Report and Written Opinion of the International Searching Authority, or the Declaration, issued by the Korean Intellectual Property Office for PCT/US2017/026460 dated Aug. 11, 2017, 9 pages.
(Continued)

*Primary Examiner* — Claude J Brown

(74) *Attorney, Agent, or Firm* — Perkins Coie LLP

(57) ABSTRACT

A harsh environment camera system. The system can include an enclosure having an electronics compartment and a camera compartment with a camera opening. A camera module is disposed within the camera compartment and one or more electronic components capable of generating heat are positioned in the electronics compartment. A compressed gas connector, connectable to a gas source, can be mounted on the enclosure. A metering orifice having an inlet and an outlet is in fluid communication with the connector. The metering orifice is operative to cool a gas flowing therethrough, thereby condensing moisture from the gas. A gas conduit is in fluid communication with the outlet of the orifice and extends through the electronics compartment to the camera compartment. A portion of the gas conduit is positioned in close proximity to the one or more electronic components, whereby the gas is heated prior to entering the camera compartment.

17 Claims, 81 Drawing Sheets

(56) References Cited

U.S. PATENT DOCUMENTS

| | | | | | |
|---|---|---|---|---|---|
| 6,099,177 | A | 8/2000 | Ito | | |
| 6,802,128 | B1 | 10/2004 | Yang | | |
| 7,093,368 | B1 | 8/2006 | Nelson | | |
| 7,270,277 | B1 | 9/2007 | Koziol | | |
| 7,423,734 | B1 * | 9/2008 | Luik | B23B 31/00 | 356/141.1 |
| 8,953,034 | B1 * | 2/2015 | Milosevic | B23Q 17/2409 | 348/92 |
| 9,573,181 | B2 | 2/2017 | Costa | | |
| 2002/0002885 | A1 * | 1/2002 | Luik | B23B 31/00 | 82/118 |
| 2004/0022430 | A1 * | 2/2004 | Franssen | B21B 38/00 | 382/152 |
| 2007/0128739 | A1 | 6/2007 | Wilson | | |
| 2008/0061473 | A1 | 3/2008 | Laracey | | |
| 2009/0263199 | A1 | 10/2009 | Wang | | |
| 2012/0325781 | A1 | 12/2012 | Gneiting | | |
| 2015/0073584 | A1 * | 3/2015 | Goodale | G05B 19/4097 | 700/186 |
| 2015/0094844 | A1 * | 4/2015 | Kim | G05B 19/401 | 700/160 |
| 2015/0172520 | A1 * | 6/2015 | Lindman | H04N 5/2252 | 382/190 |
| 2015/0185592 | A1 * | 7/2015 | Eineren | G03B 17/02 | 348/375 |
| 2016/0097967 | A1 | 4/2016 | Costa | | |
| 2016/0219192 | A1 | 7/2016 | Rosenberry | | |

OTHER PUBLICATIONS

Wordupmag. “3-axis Synchronous Belt Drive Carbon Fiber Camera Mount with GS-9257MG Servos” YourTube (https//www.youtub.com/watch?v=jCeMGGZ17Pk>), Apr. 12, 2013.

* cited by examiner

Contact Wired and or Wireless Spindle Bar-code Reader / Vision Tool
Mounted in Interchangeable Tool Holder
Lens Cover Closed, Top-Left ISO View Contact Wired and or Wireless Spindle Bar-code Reader / Vision Tool
Mounted in Interchangeable Tool Holder
Lens Cover Open, Top-Left ISO View Contact Wired and or Wireless Spindle Bar-code Reader / Vision Tool
Top-Left ISO External Components and Devices Exploded View Contact Wired and or Wireless Spindle Bar-code Reader / Vision Tool
Lens Cover Open, Top-Left ISO Cutaway View Contact Wired and or Wireless Spindle Bar-code Reader / Vision Tool
Top-Left ISO Internal Modules and Devices View Contact Wired and or Wireless Spindle Bar-code Reader / Vision Tool
With an External Induction Re-Charger Module
Top-Left ISO Internal Modules and Devices Exploded View Contact Wired and or Wireless Spindle Bar-code Reader / Vision Tool
Mounted In Interchangeable Tool Holder
With an Induction Re-charger Module and Electrical Contacts
Lens Cover Closed, Lower-Back-Right ISO View Contact Wired and or Wireless Spindle Bar-code Reader / Vision Tool
Mounted In Interchangeable Tool Holder
With an Induction Re-charger Module and Electical Contacts
Lens Cover Closed, Top and Side Section Views Contact Wired and or Wireless Spindle Bar-code Reader / Vision Tool
Mounted In Interchangeable Tool Holder
With an Induction Re-charger Module and Electrical Contacts
Lens Cover Closed, Side and Top Section Views Contact Wired and or Wireless Spindle Bar-code Reader / Vision Tool
Mounted in Interchangeable Tool Holder, Top-Left ISO View
Communications and Electrical Interface Configuration Options Contact Wired and or Wireless Spindle Bar-code Reader / Vision Tool
Mounted in Interchangeable Tool Holder
With Electrical Contacts and or Re-charger Module
Lens Cover Closed, Lower-Back-Right ISO View Contact Wired and or Wireless Spindle Bar-code Reader / Vision Tool
Mounted in Interchangeable Tool Holder
With an Electrical Contacts Re-charger Module
Lens Cover Closed, Top and Side Section Views Contact Wired and or Wireless Spindle Bar-code Reader / Vision Tool
Mounted in Interchangeable Tool Holder
With an Electical Contacts Re-charger Module
Lens Cover Closed, Side and Top Section Views

| Item | Qty | Name |
|---|---|---|
| 9 | 1 | VISION_CAMERA_LENS_UCS |
| 9.10 | 1 | 2-CONTACT_ENCLOSURE |
| 9.10.2 | 1 | ENCLOSURE_LENS_COVER |
| 9.10.1 | 1 | 2-CONTACT_CUT-AWAY_ENCLOSURE |
| 9.100 | 1 | 4-CONTACT_DIRECT_INTERCONNECTION_MODULE |
| 9.101 | 1 | NO-CONTACT_INDUCTION_INTERCONNECTION_MODULE |
| 9.102 | 1 | 2-CONTACT_DIRECT_INTERCONNECTION_MODULE |
| 9.103 | 1 | 4-CONTACT_ENCLOSURE |
| 9.104 | 1 | NO-CONTACT_ENCLOSURE |
| 9.108 | 1 | WIRED_COMMUNICATIONS_MODULE |
| 9.109 | 1 | 2-CONTACT_AND_INDUCTION_CHARGING_MODULE |
| 9.11.1 | 1 | MOUNTING_STEM |
| 9.11.2 | 2 | 20MM_O-RING |
| 9.110 | 2 | HEXAGON SOCKET SET SCREW - ISO 4028 - M6X16 |
| 9.111 | 1 | INDUCTION_CHARGING_MODULE |
| 9.112 | 1 | 2-CONTACT_CHARGING_MODULE |
| 9.113 | 6 | HEXAGON SOCKET SET SCREW - ISO 4028 - M6X30 |
| 9.114 | 1 | 4-CONTACT_CHARGING_MODULE |
| 9.12 | 2 | KJS02-M3 |
| 9.13 | 1 | HEXAGON SOCKET SET SCREW - ISO 4027 - M5X5 |
| 9.14 | 2 | HEXAGON SOCKET SET SCREW - ISO 4027 - M3X5 |
| 9.15 | 4 | HEXAGON SOCKET SET SCREW - ISO 4026 - M3X3 |
| 9.16 | 1 | AIR_PRESSURE_SWITCH |
| 9.17 | 1 | VENT_MBO-1032M-10-SS |
| 9.18 | 1 | STEM_ROTATIONAL_LOCATOR |
| 9.19 | 4 | PIN - HARDENED GROUND MACHINE DOWEL - ANSI B18.8.2 - 1/2 X 1 |
| 9.20.1 | 1 | LIGHT-RING |
| 9.20 | 1 | CAMERA-MODULE |
| 9.21 | 1 | HEXAGON SOCKET SET SCREW - ISO 4026 - M12X12 |
| 9.22 | 1 | LENS-COVER_PIVOT-HINGE-MOUNT |
| 9.23 | 1 | 2ND_CYLINDER_ROD_MOUNT |
| 9.24 | 2 | USR-08-2_CYLINDER |
| 9.25 | 2 | USR-08-2_ROD |
| 9.26 | 2 | CYLINDER_PIVOT_SPACER |
| 9.27 | 2 | HEXAGON SOCKET SHOULDER SCREW - ISO 7379 - 6.5 X 12 |
| 9.28 | 4 | 6MM_O-RING |
| 9.29 | 2 | HEXAGON SOCKET SET SCREW - ISO 4026 - M5X6 |
| 9.30 | 1 | 2-CONTACT_INDUCTION_INTERCONNECTION_MODULE |
| 9.31 | 2 | HEX NUT - ISO 4035 - M5 |
| 9.32 | 1 | 1ST_CYLINDER_ROD_MOUNT |
| 9.33 | 1 | CYLINDER_ROD_PIVOT |
| 9.34 | 4 | EXTERNAL TYPE-3AM1 - ANSI B27.7 - 6 |
| 9.35 | 1 | LENS_COVER_PIVOT |
| 9.36 | 8 | HEXAGON SOCKET BUTTON HEAD SCREW - ISO 7380 - M5X10 |
| 9.37 | 4 | CONTACT_SHOULDER_SCREW_DIN-921_M6X8 |
| 9.38 | 1 | CAMERA_AIR_FEED |
| 9.39 | 9 | HEX NUT - ISO 4035 - M6 |
| 9.40 | 1 | WIRELESS_COMMUNICATIONS_MODULE |
| 9.41 | 3 | INDUCTION_COIL |
| 9.50 | 6 | TLP-93311-A-SM_LTC-HLC-BATTERY |
| 9.7 | 1 | LENS_SHROUD |
| 9.90 | 1 | E2S0A_S84_20275_20MM_CAT-50_TOOL_HOLDER |
| 9.91 | 1 | RETENTION_KNOB_REP |
| 9.93 | 2 | COMPRESSED_COMPRESSION_SPRING - 1.000000 X 11.500000 X 31.940000 |
| 9.94 | 2 | EXTENDED_COMPRESSION_SPRING - 1.000000 X 11.700000 X 81.940000 |
| 9.98 | 1 | LASER_DISTANCE_SENSOR |
| 9.99 | 1 | LASER_BAR-CODE_READER |
| 9.118 | 2 | TRANSMIT_IR-LED |
| 9.119 | 2 | RECEIVE_IR-SENSOR |

Contact Wired and or Wireless Spindle Bar-code Reader / Vision Tool
Mounted in Interchangeable Tool Holder
Bill Of Materials

Figure-14

Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted In Interchangeable Tool Holder
Lens Cover Closed, Top-Left ISO View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted In Interchangeable Tool Holder
Lens Cover Open, Top-Left ISO View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Top-Left ISO External Components and Devices Exploded View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Lens Cover Open, Top-Left ISO Cutaway View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Top-Left ISO Internal Modules and Devices View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
With an External Induction Re-Charger Module
Top-Left ISO Internal Modules and Devices Exploded View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder
With an Induction Re-charger Module and Electrical Contacts
Lens Cover Closed, Lower-Back-Right ISO View

A–A

Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder
With an Induction Re-charger Module and Electical Contacts
Lens Cover Closed, Top and Side Section Views Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted In Interchangeable Tool Holder
With an Induction Re-charger Module and Electrical Contacts
Lens Cover Closed, Side and Top Section Views Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder, Top-Left ISO View
Communications and Electrical Interface Configuration Options Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder
With Electrical Contacts and or Re-charger Module
Lens Cover Closed, Lower-Back-Right ISO View Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder
With an Electical Contacts Re-charger Module
Lens Cover Closed, Top and Side Section Views Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder
With an Electrical Contacts Re-charger Module
Lens Cover Closed, Side and Top Section Views

| Item | Qty | Name |
|---|---|---|
| 9 | 1 | VISION_CAMERA_LENS_UCS |
| 9.100 | 1 | 4-CONTACT_DIRECT_INTERCONNECTION_MODULE |
| 9.10.1 | 1 | 2-CONTACT_CUT-AWAY_ENCLOSURE |
| 9.10.2 | 1 | ENCLOSURE_LENS_COVER |
| 9.10 | 1 | 2-CONTACT_ENCLOSURE |
| 9.101 | 1 | NO-CONTACT_INDUCTION_INTERCONNECTION_MODULE |
| 9.102 | 1 | 2-CONTACT_DIRECT_INTERCONNECTION_MODULE |
| 9.103 | 1 | 4-CONTACT_ENCLOSURE |
| 9.104 | 1 | NO-CONTACT_ENCLOSURE |
| 9.108 | 1 | WIRED_COMMUNICATIONS_MODULE |
| 9.109 | 1 | 2-CONTACT_AND_INDUCTION_CHARGING_MODULE |
| 9.11.2 | 2 | 20MM_O-RING |
| 9.11.1 | 1 | MOUNTING_STEM |
| 9.110 | 2 | HEXAGON SOCKET SET SCREW - ISO 4028 - M6X16 |
| 9.111 | 1 | INDUCTION_CHARGING_MODULE |
| 9.112 | 1 | 2-CONTACT_CHARGING_MODULE |
| 9.113 | 6 | HEXAGON SOCKET SET SCREW - ISO 4028 - M6X30 |
| 9.114 | 1 | 4-CONTACT_CHARGING_MODULE |
| 9.115 | 1 | LASERCHECK_8826_HEAD |
| 9.116 | 1 | AIR_BLOW-OFF_KNIFE |
| 9.117 | 1 | IR-TEMPERATURE_SENSOR |
| 9.118 | 2 | TRANSMIT_IR-LED |
| 9.119 | 2 | RECEIVE_IR-SENSOR |
| 9.12 | 2 | KJS02-M3 |
| 9.13 | 1 | HEXAGON SOCKET SET SCREW - ISO 4027 - M5X5 |
| 9.14 | 2 | HEXAGON SOCKET SET SCREW - ISO 4027 - M3X5 |
| 9.15 | 4 | HEXAGON SOCKET SET SCREW - ISO 4026 - M3X3 |
| 9.16 | 1 | AIR_PRESSURE_SWITCH |
| 9.17 | 1 | VENT_MBO-1932N-10-SS |
| 9.18 | 1 | STEM_ROTATIONAL_LOCATOR |
| 9.19 | 4 | PIN - HARDENED GROUND MACHINE DOWEL - ANSI B18.8.2 - 1/2 X 1 |
| 9.20 | 1 | CAMERA-MODULE |
| 9.20.1 | 1 | LIGHT-RING |
| 9.21 | 1 | HEXAGON SOCKET SET SCREW - ISO 4026 - M12X12 |
| 9.22 | 1 | LENS-COVER_PIVOT-HINGE-MOUNT |
| 9.23 | 1 | 2ND_CYLINDER_ROD_MOUNT |
| 9.24 | 2 | USR-08-2_CYLINDER |
| 9.25 | 2 | USR-08-2_ROD |
| 9.26 | 2 | CYLINDER_PIVOT_SPACER |
| 9.27 | 2 | HEXAGON SOCKET SHOULDER SCREW - ISO 7379 - 6.5 X 12 |
| 9.28 | 4 | 6MM_O-RING |
| 9.29 | 2 | HEXAGON SOCKET SET SCREW - ISO 4026 - M5X6 |
| 9.30 | 1 | 2-CONTACT_INDUCTION_INTERCONNECTION_MODULE |
| 9.31 | 2 | HEX NUT - ISO 4035 - M5 |
| 9.32 | 1 | 1ST_CYLINDER_ROD_MOUNT |
| 9.33 | 1 | CYLINDER_ROD_PIVOT |
| 9.34 | 4 | EXTERNAL TYPE-3AM1 - ANSI B27.7 - 6 |
| 9.35 | 1 | LENS_COVER_PIVOT |
| 9.36 | 8 | HEXAGON SOCKET BUTTON HEAD SCREW - ISO 7380 - M5X10 |
| 9.37 | 4 | CONTACT_SHOULDER_SCREW_DIN-921_M6X8 |
| 9.38 | 1 | CAMERA_AIR_FEED |
| 9.39 | 9 | HEX NUT - ISO 4035 - M6 |
| 9.40 | 1 | WIRELESS_COMMUNICATIONS_MODULE |
| 9.41 | 3 | INDUCTION_COIL |
| 9.50 | 6 | TLP-93311-A-SM_LTC-HLC-BATTERY |
| 9.7 | 1 | LENS_SHROUD |
| 9.90 | 1 | E2504_584_20275_20MM_CAT-50_TOOL_HOLDER |
| 9.91 | 1 | RETENTION_KNOB_REP |
| 9.93 | 2 | COMPRESSED_COMPRESSION_SPRING - 1.000000 X 11.500000 X 31.140000 |
| 9.94 | 2 | EXTENDED_COMPRESSION_SPRING - 1.000000 X 11.700000 X 81.940000 |
| 9.98 | 1 | LASER_DISTANCE_SENSOR |
| 9.99 | 1 | LASER_BAR-CODE_READER |

Contact Wired and or Wireless Non-contact Work piece Data Collection Spindle Tool
Infrared Temperature Probe, Laser Surface Roughness Gauge, Laser Distance & Edge Finder,
Bar-code Reader, 2D & 3D Vision Metrologies
Mounted in Interchangeable Tool Holder
Bill Of Materials

Figure-28

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 1 = Spindle Data - Metrology Tool in Storage Chain Pocket, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 2 = Spindle Data - Metrology Tool in 1st Pivot Xfer Pocket, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 3 = Spindle Data - Metrology Tool Rotated in 1st Pivot Xfer Pocket, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 4 = Spindle Data - Metrology Tool at Middle of Rotation to Next Tool Position in 1st Pivot Xfer Pocket, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 5 = Spindle Data - Metrology Tool in Next Tool Pivot Xfer Pocket, Top-Left ISO View Work Piece Data Collection Spindle Tool used In CNC HMC with Chain Tool Stroage Pocket System
For Work Piece Infrared Temperature Probe, Laser Surface Roughness Gauge,
Laser Distance & Edge Finder, Bar-code Reader, 2D & 3D Vision Metrologies
Step 6 = Spindle Data - Metrology Tool Powered and Programmed in Next Tool Pivot Xfer Pocket, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 7 = Spindle Data - Metrology Tool Cleared in Next Tool Pivot Xfer Pocket and Enclosure Open, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 8 = 3-Arm Engaging Spindle Data - Metrology Tool in Next Tool Pivot Xfer Pocket and Spindle Tool, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 9 = S-Arm Removing Spindle Data - Metrology Tool in Next Tool Pivot Xfer Pocket and Spindle Tool, Top-Left ISO View

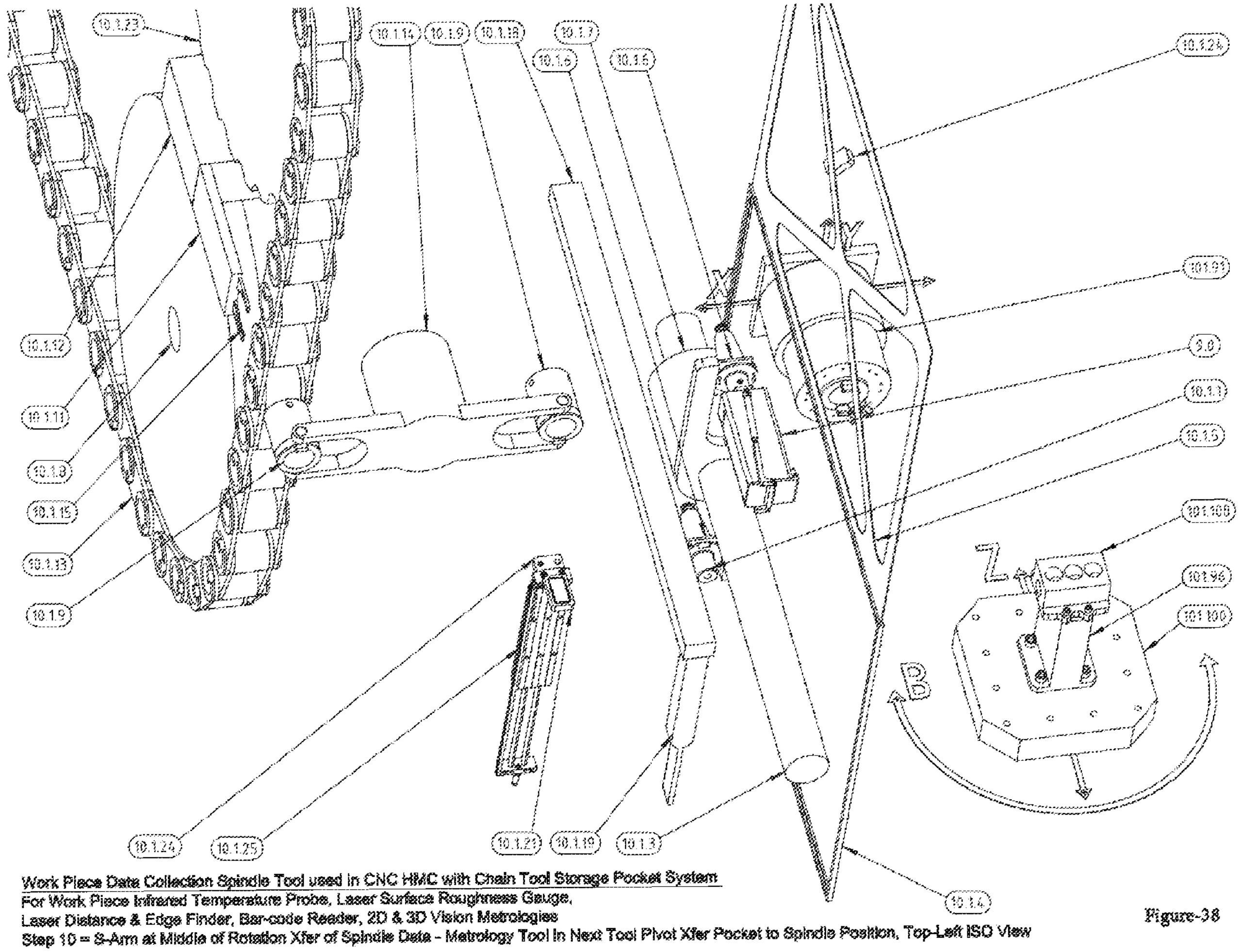

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 10 = S-Arm at Middle of Rotation Xfer of Spindle Data - Metrology Tool in Next Tool Pivot Xfer Pocket to Spindle Position, Top-Left ISO View

Figure-38

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 11 = S-Arm Xfered Spindle Data - Metrology Tool from Next Tool Pivot Xfer Position to Spindle Position, Top-Left ISO View

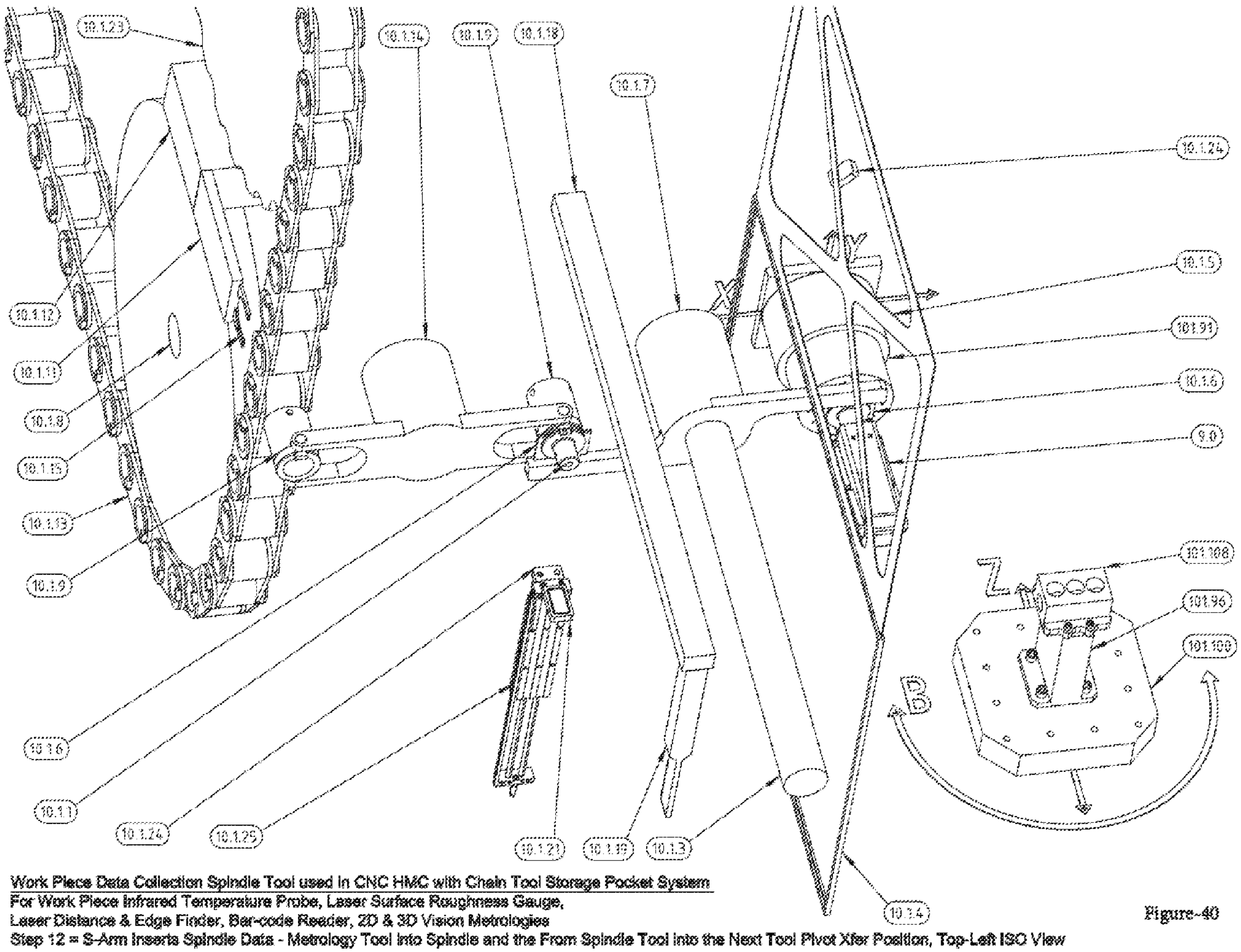

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 12 = S-Arm Inserts Spindle Data - Metrology Tool into Spindle and the From Spindle Tool into the Next Tool Pivot Xfer Position, Top-Left ISO View

Figure-40

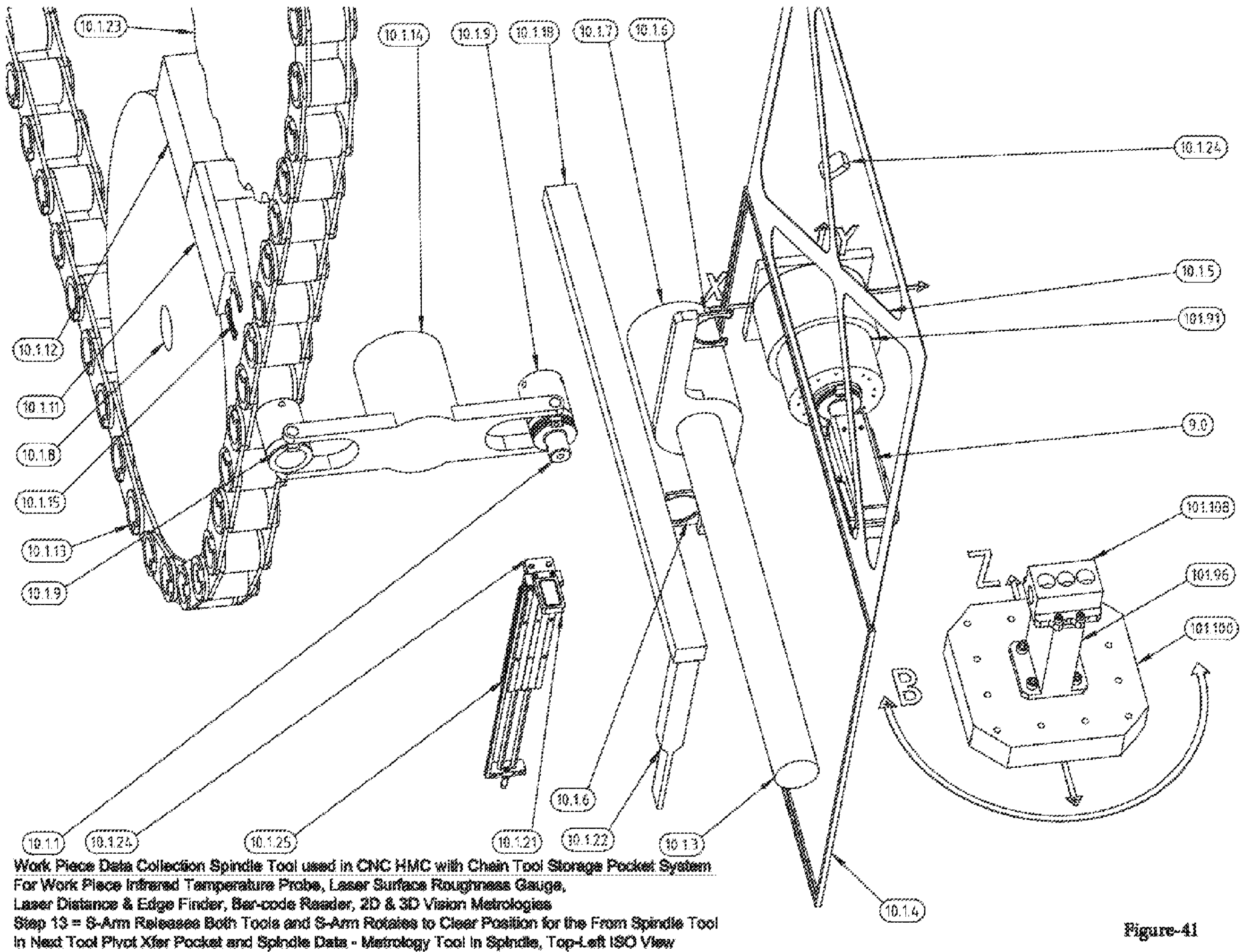

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 13 = S-Arm Releases Both Tools and S-Arm Rotates to Clear Position for the From Spindle Tool
In Next Tool Pivot Xfer Pocket and Spindle Data - Metrology Tool In Spindle, Top-Left ISO View

Figure-41

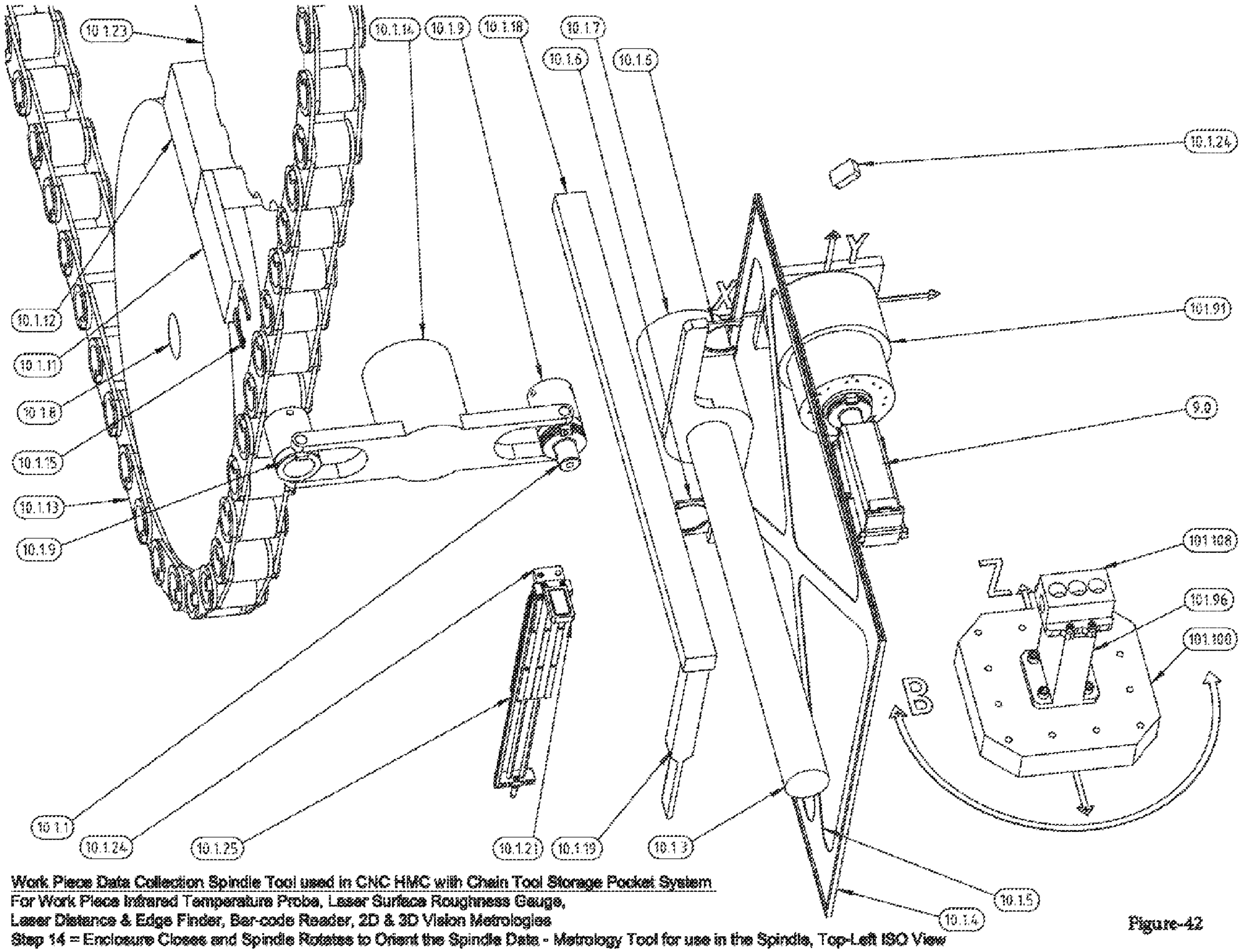

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 14 = Enclosure Closes and Spindle Rotates to Orient the Spindle Data - Metrology Tool for use in the Spindle, Top-Left ISO View

Figure-42

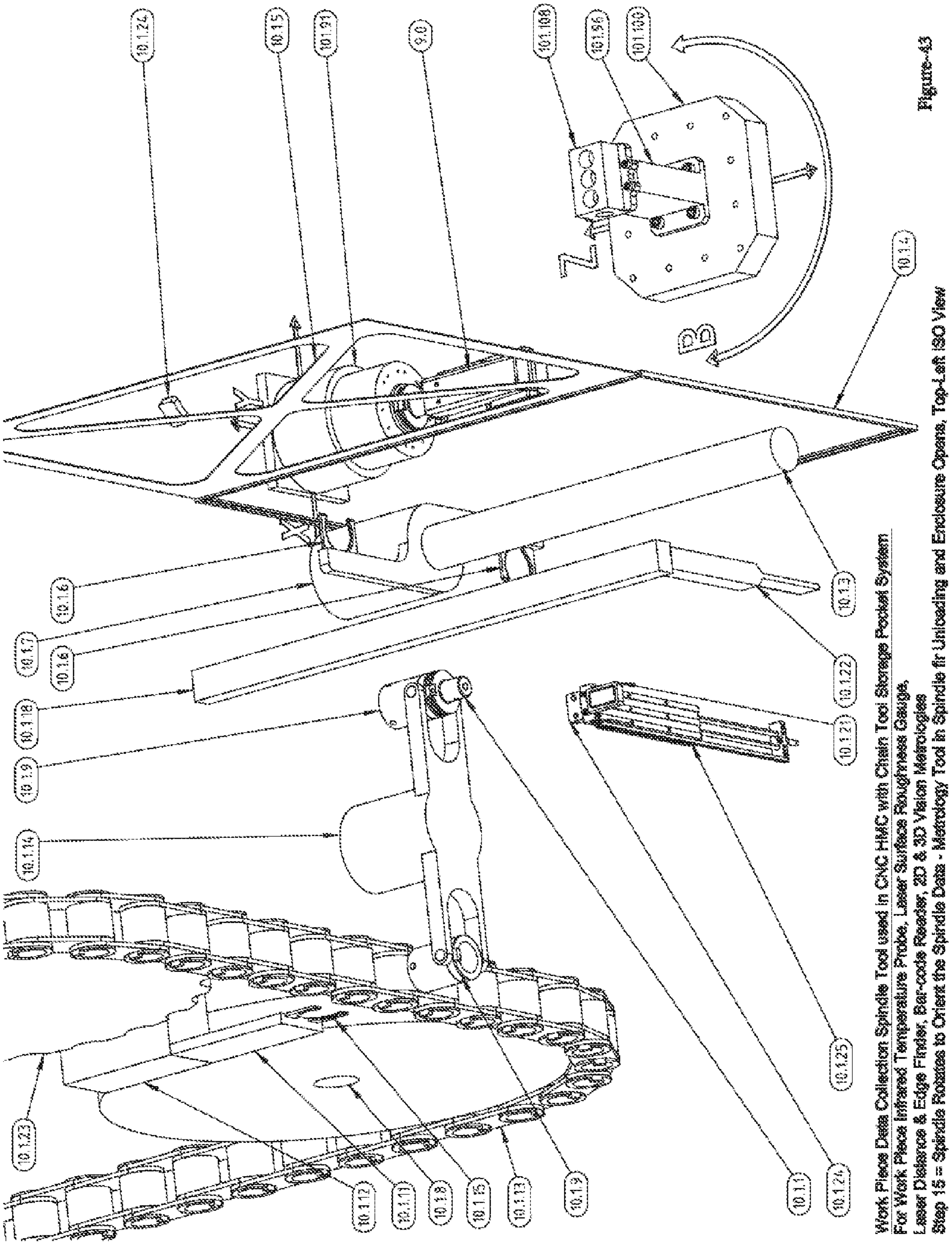

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 15 = Spindle Rotates to Orient the Spindle Data - Metrology Tool in Spindle fr Unloading and Enclosure Opens, Top-Left ISO View

Figure-43

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 16 = S-Arm Engaging Tool in Next Tool Pivot Xfer Pocket and Spindle Data - Metrology in Spindle, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 17 = S-Arm Removing Tool from Next Tool Pivot Xfer Pocket and Spindle Data - Metrology Tool from Spindle, Top-Left ISO View

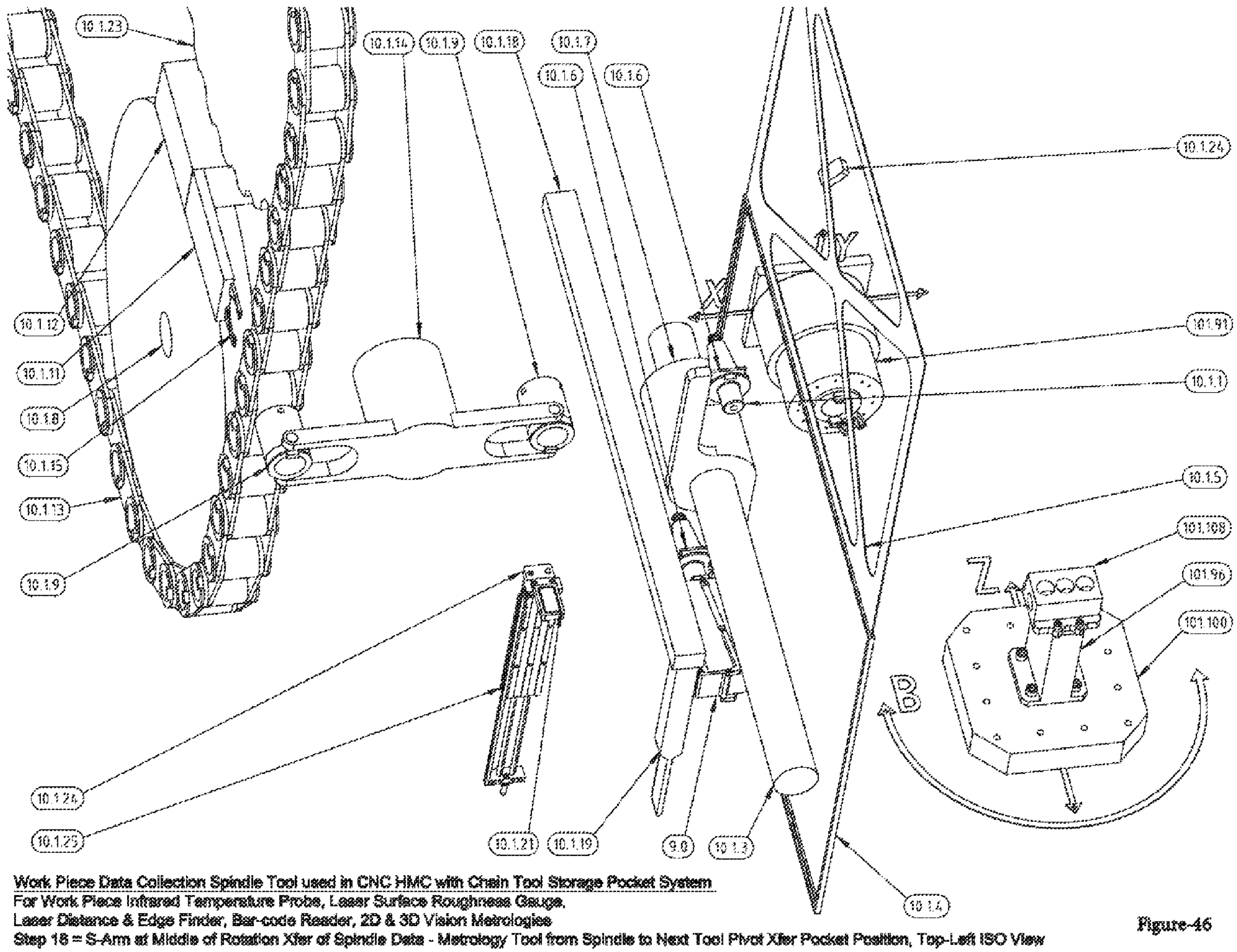

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 18 = S-Arm at Middle of Rotation Xfer of Spindle Data - Metrology Tool from Spindle to Next Tool Pivot Xfer Pocket Position, Top-Left ISO View

Figure-46

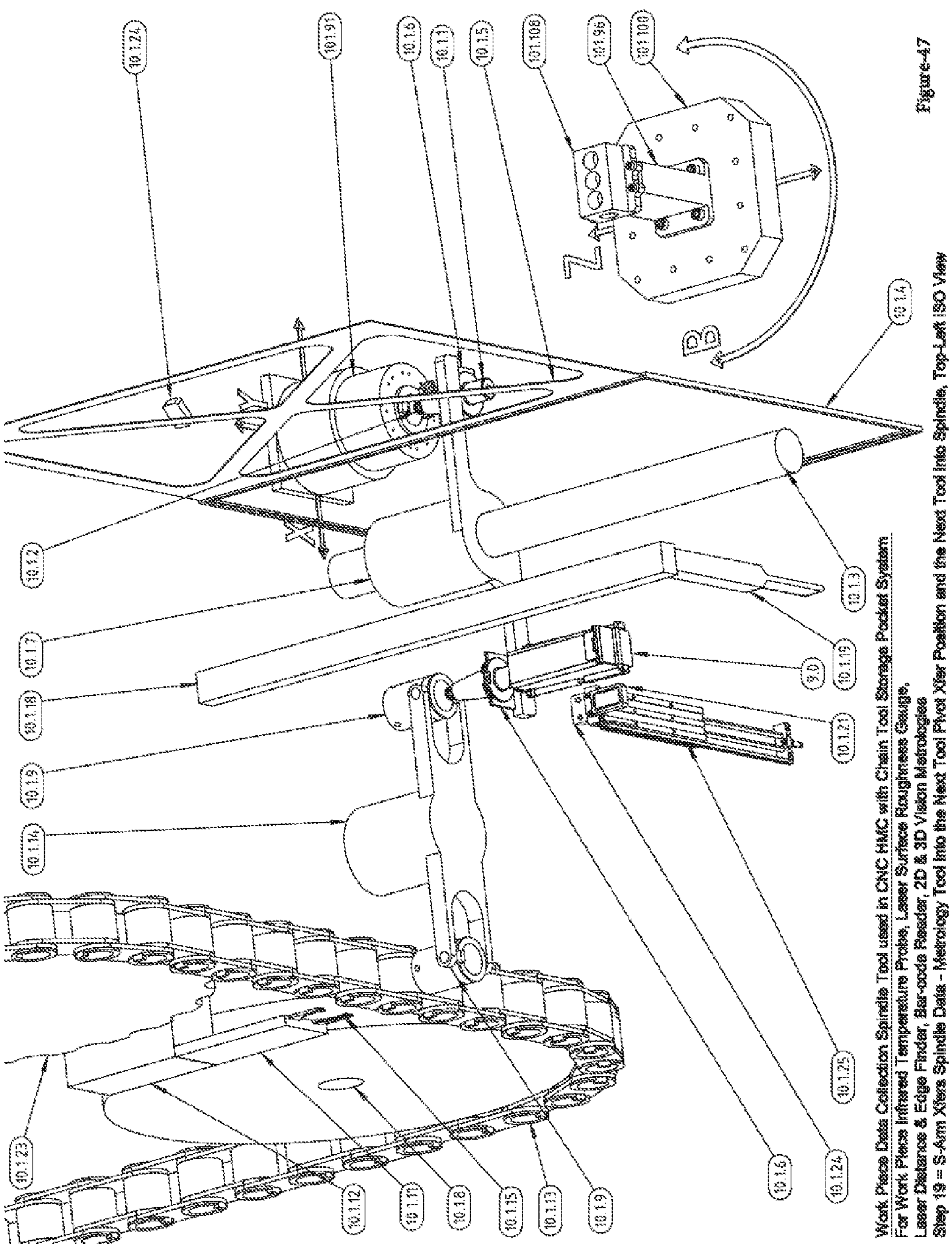

Figure-47

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 19 = S-Arm Xfers Spindle Data - Metrology Tool into the Next Tool Pivot Xfer Position and the Next Tool Into Spindle, Top-Left ISO View

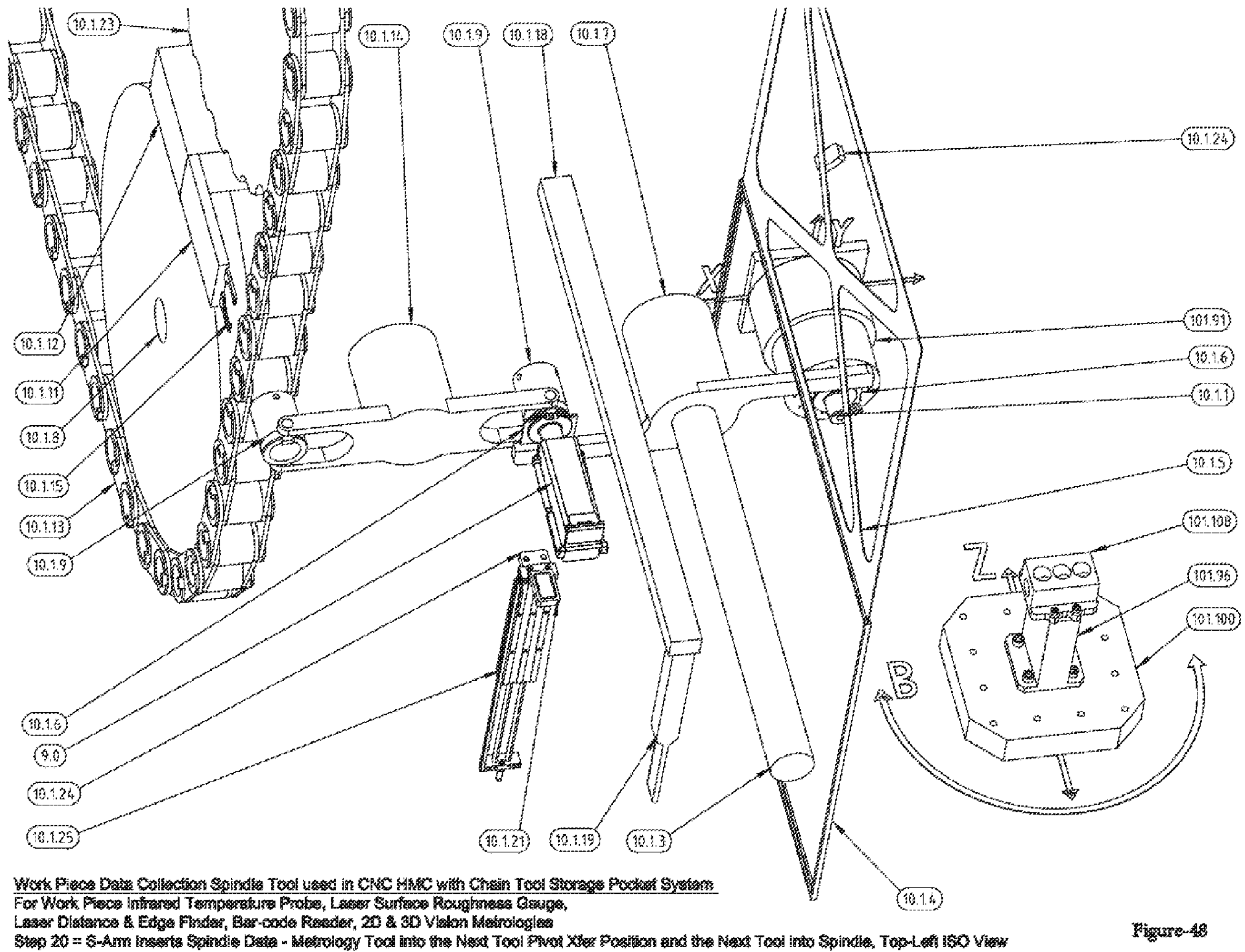

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 20 = S-Arm Inserts Spindle Data - Metrology Tool into the Next Tool Pivot Xfer Position and the Next Tool into Spindle, Top-Left ISO View

Figure-48

Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 21 = S-Arm Releases Both Tools, S-Arm Rotates to Clear Position, and Enclosure Closes, Top-Left ISO View Work Piece Data Collection Spindle Tool used in CNC HMC with Chain Tool Storage Pocket System
For Work Piece Infrared Temperature Probe, Laser Surface Roughness Gauge,
Laser Distance & Edge Finder, Bar-code Reader, 2D & 3D Vision Metrologies
Step 22 = Spindle Data - Metrology Tool Powered and Data-Collected In Next Tool Pivot Xfer Pocket, Top-Left ISO View Work Piece Data Collection Spindle Tool used in CNC HMC with Magazine Storage Pocket System
For Work Piece Infrared Temperature Probe, Laser Surface Roughness Gauge,
Laser Distance & Edge Finder, Bar-code Reader, 2D & 3D Vision Metrologies
Step 1 = Powered and Programming the Spindle Data - Metrology Tool in Magazine Storage Pocket #21, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 2 = Spindle Data - Metrology Tool at the Pocket Grip Position of the Magazine Storage Pocket #21, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 3 = Spindle Data - Metrology Tool at the Pocket Removal Position of the Magazine Storage Pocket #21, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 4 = Spindle Data - Metrology Tool at the Pocket Removed Position of the Magazine Storage Pocket #21, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 5 = Spindle Data - Metrology Tool in Next Tool Position with IR Communications, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 6 = Spindle Data - Metrology Tool Ready in Next Tool Position and Enclosure Open, Top-Left ISO View

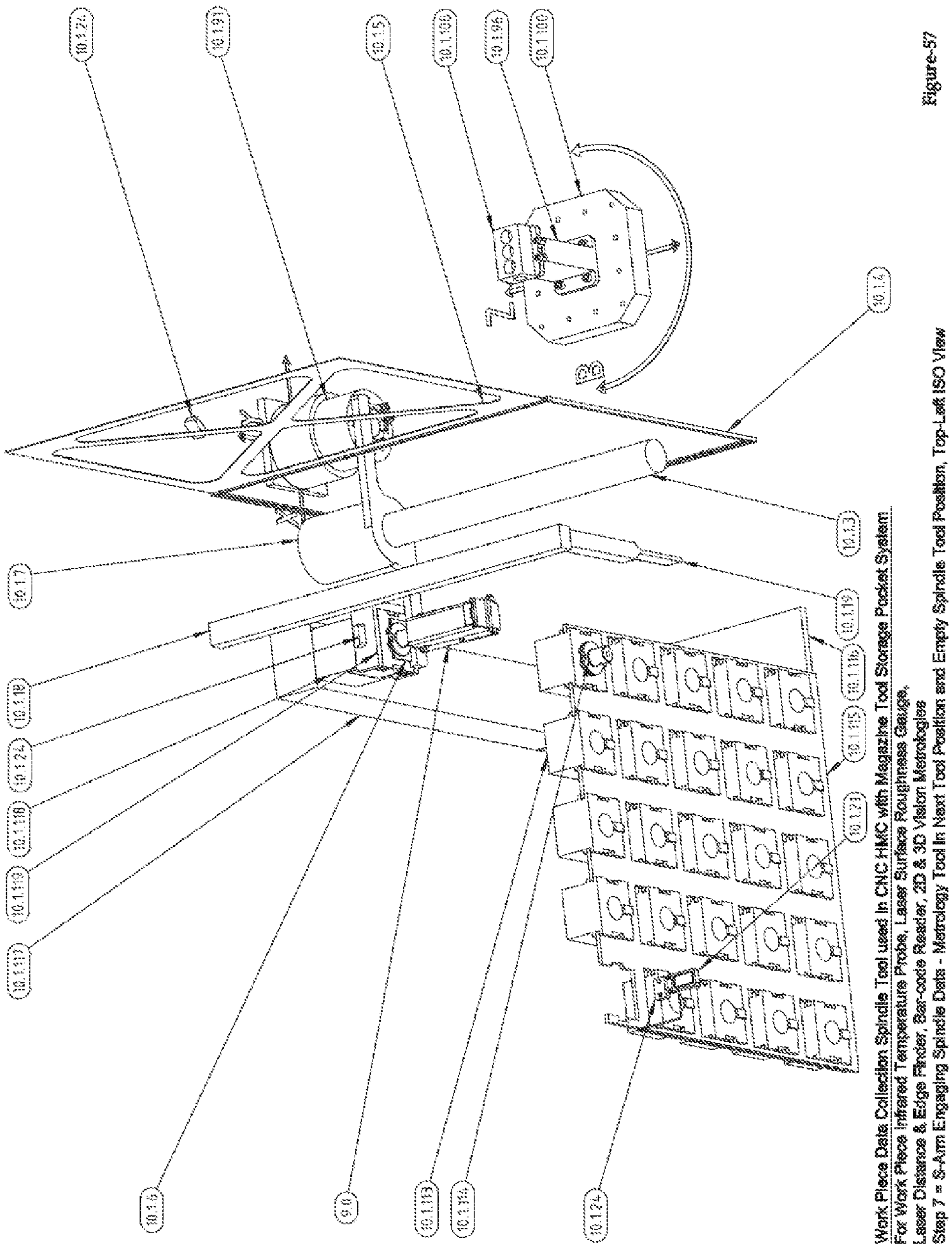
Figure-57
Z
B
Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 7 = S-Arm Engaging Spindle Data - Metrology Tool In Next Tool Position and Empty Spindle Tool Position, Top-Left ISO View

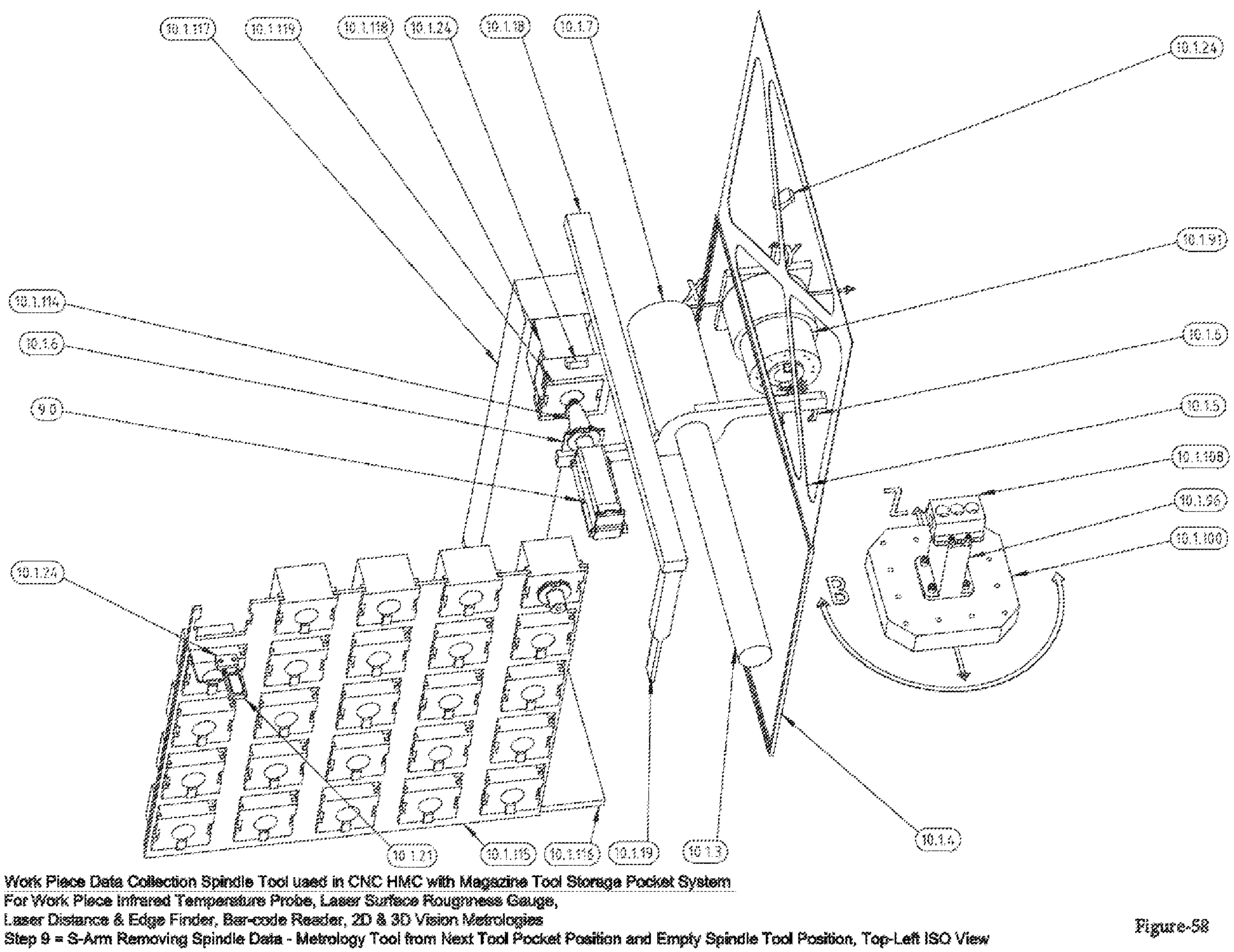

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 9 = S-Arm Removing Spindle Data - Metrology Tool from Next Tool Pocket Position and Empty Spindle Tool Position, Top-Left ISO View

Figure-58

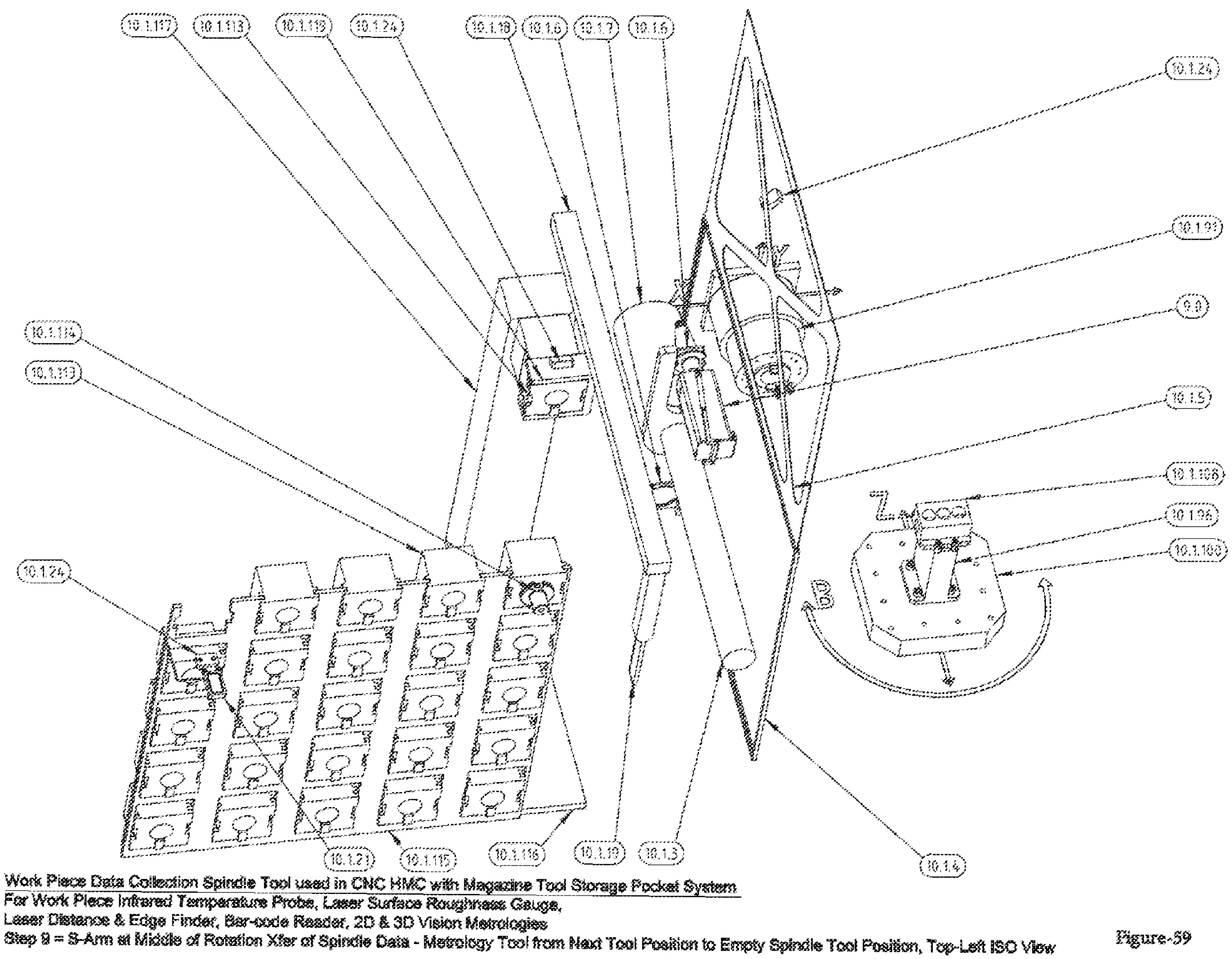

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 9 = S-Arm at Middle of Rotation Xfer of Spindle Data - Metrology Tool from Next Tool Position to Empty Spindle Tool Position, Top-Left ISO View

Figure-59

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 10 = S-Arm Xfered Spindle Data - Metrology Tool from Next Tool Position to Spindle Position, Top-Left ISO View

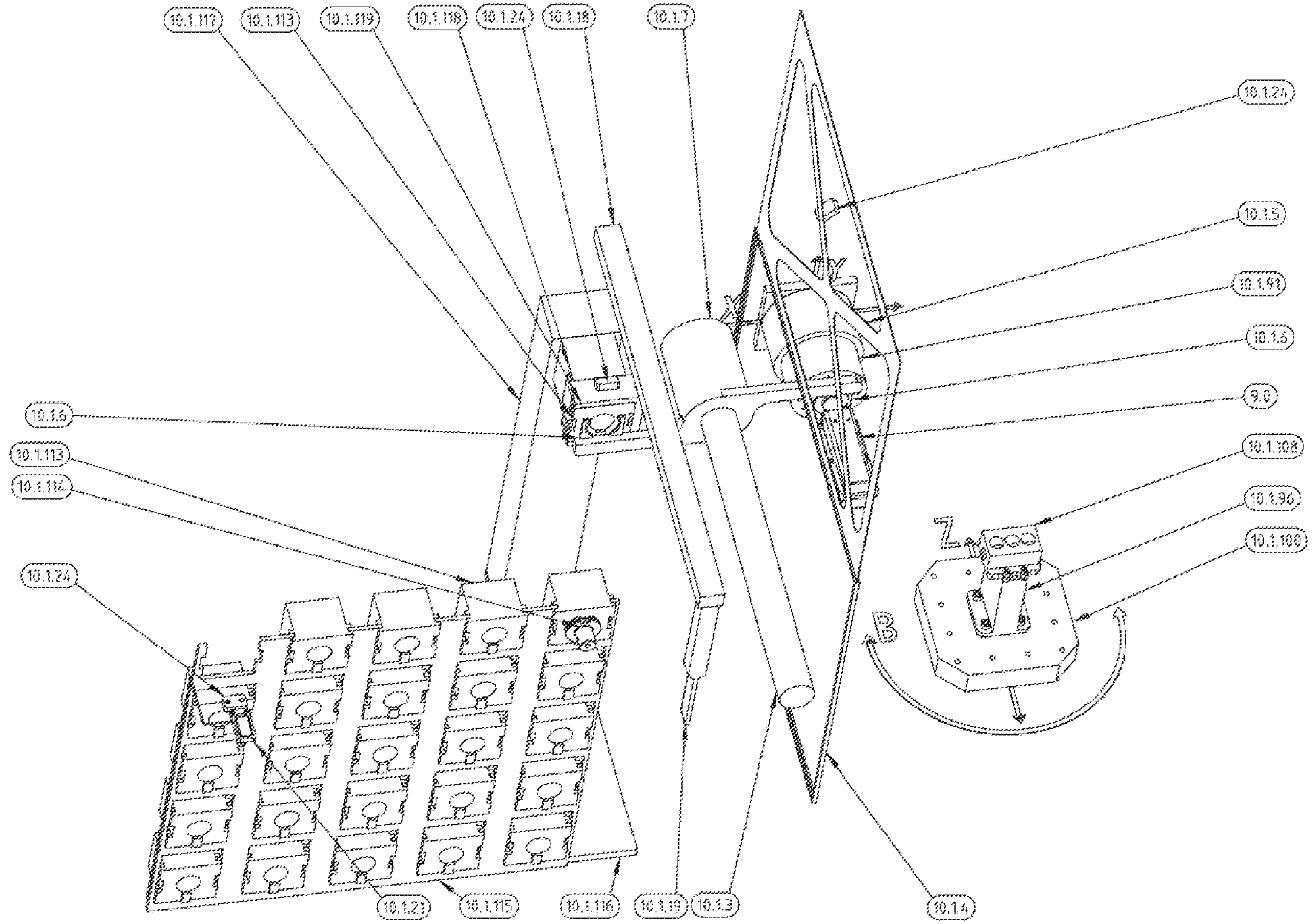

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 11 = S-Arm Inserts Spindle Data - Metrology Tool into Spindle and the Empty from Spindle Tool into the Next Tool Position, Top-Left ISO View

Figure-61

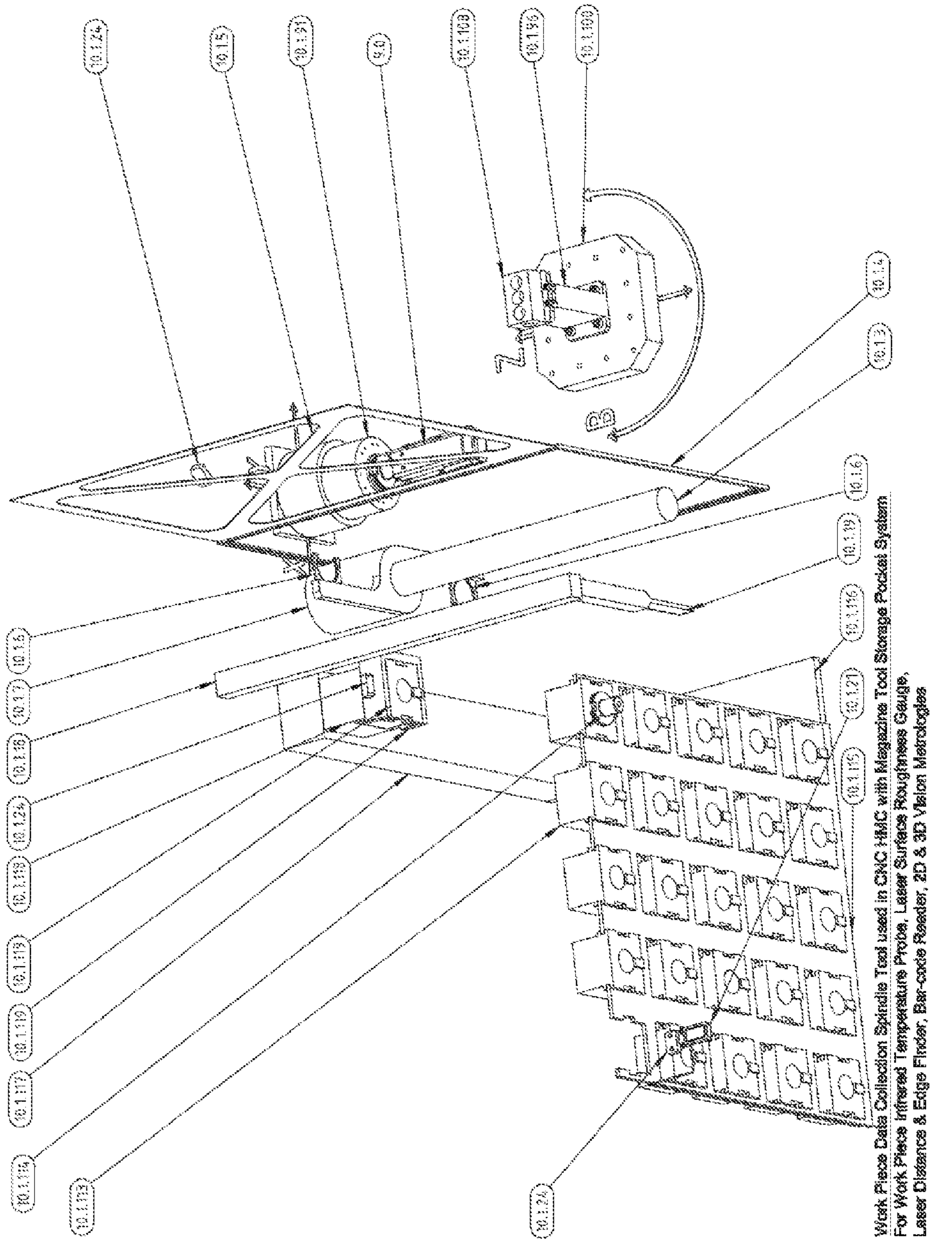

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 12 = S-Arm Releases Both Tools and S-Arm Rotates to Clear Position for the From Spindle Tool
In Next Tool Pivot Xfer Pocket and Spindle Data - Metrology Tool In Spindle, Top-Left ISO View

Figure-62

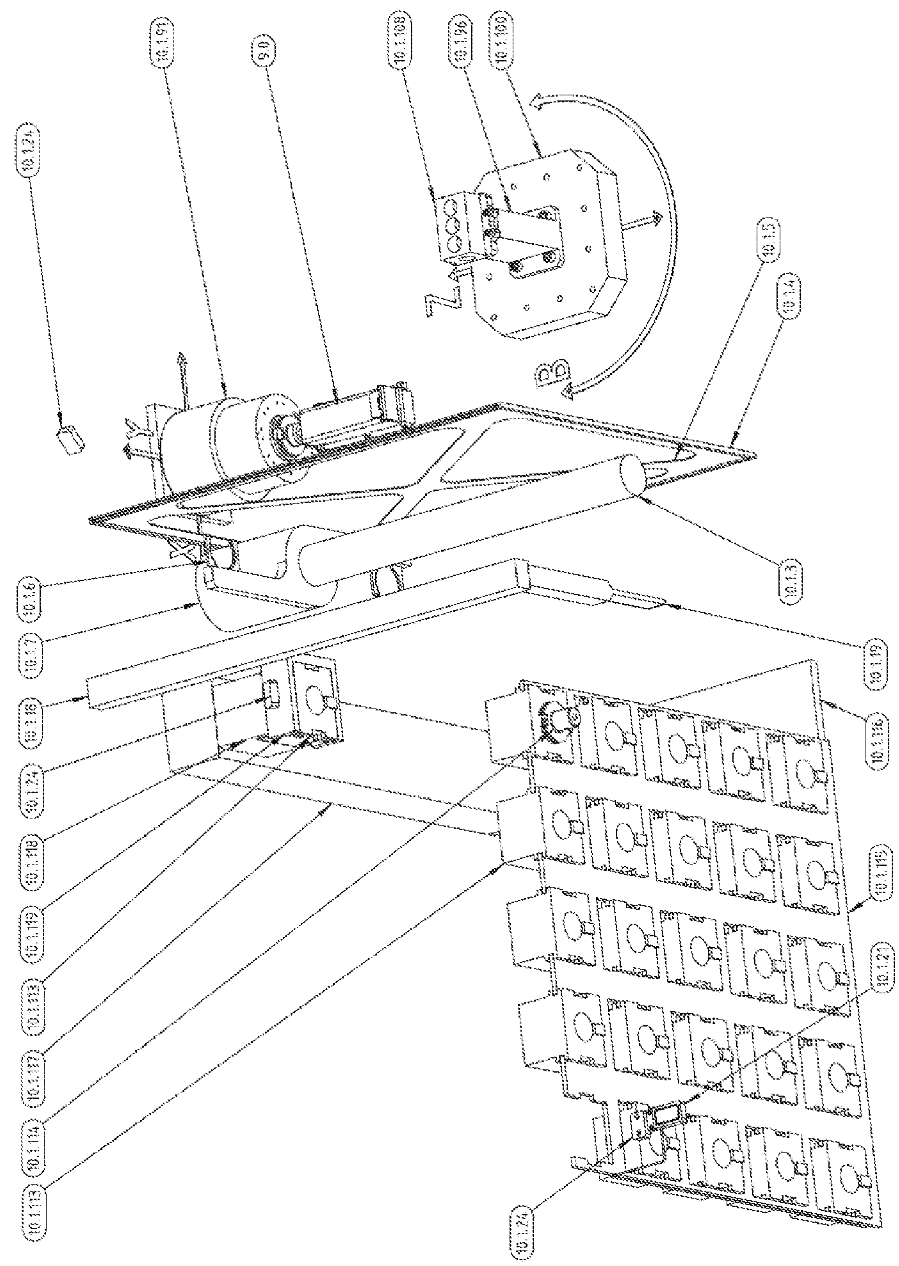

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 13 = Enclosure Closes and Spindle Rotates to Orient the Spindle Data - Metrology Tool in Spindle with IR Communications, Top-Left ISO View

Figure-63

Work Piece Data Collection Spindle Tool used In CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 14 = Spindle Rotates to Orient the Spindle Data - Metrology Tool in Spindle and Enclosure Opens, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 15 = S-Arm at Empty Next Tool Pocket Position and Spindle Data - Metrology Tool in Spindle Position, Top-Left ISO View Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 16 = S-Arm Removing from Empty Next Tool Pocket and Spindle Data - Metrology Tool from Spindle, Top-Left ISO View

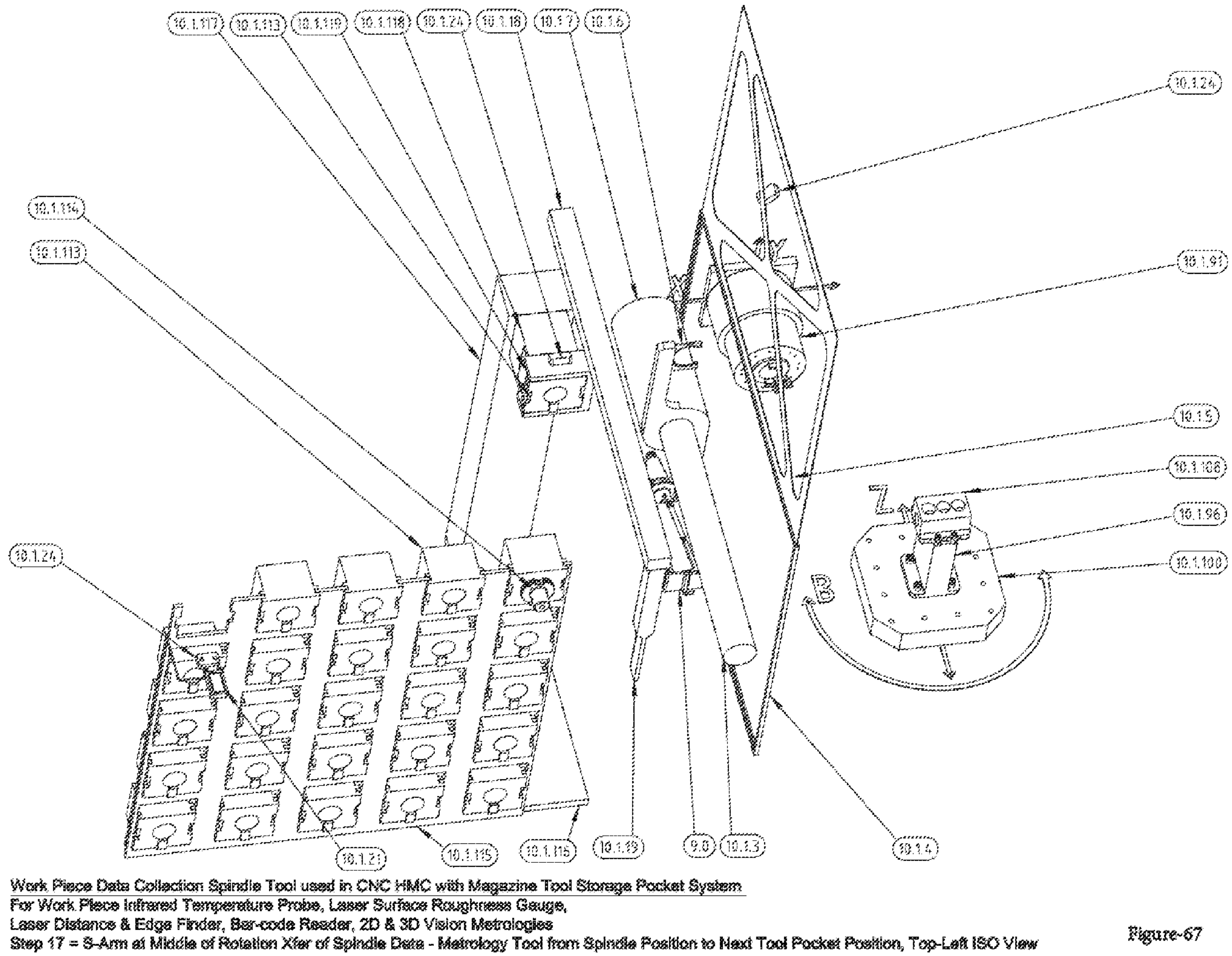

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 17 = S-Arm at Middle of Rotation Xfer of Spindle Data - Metrology Tool from Spindle Position to Next Tool Pocket Position, Top-Left ISO View

Figure-67

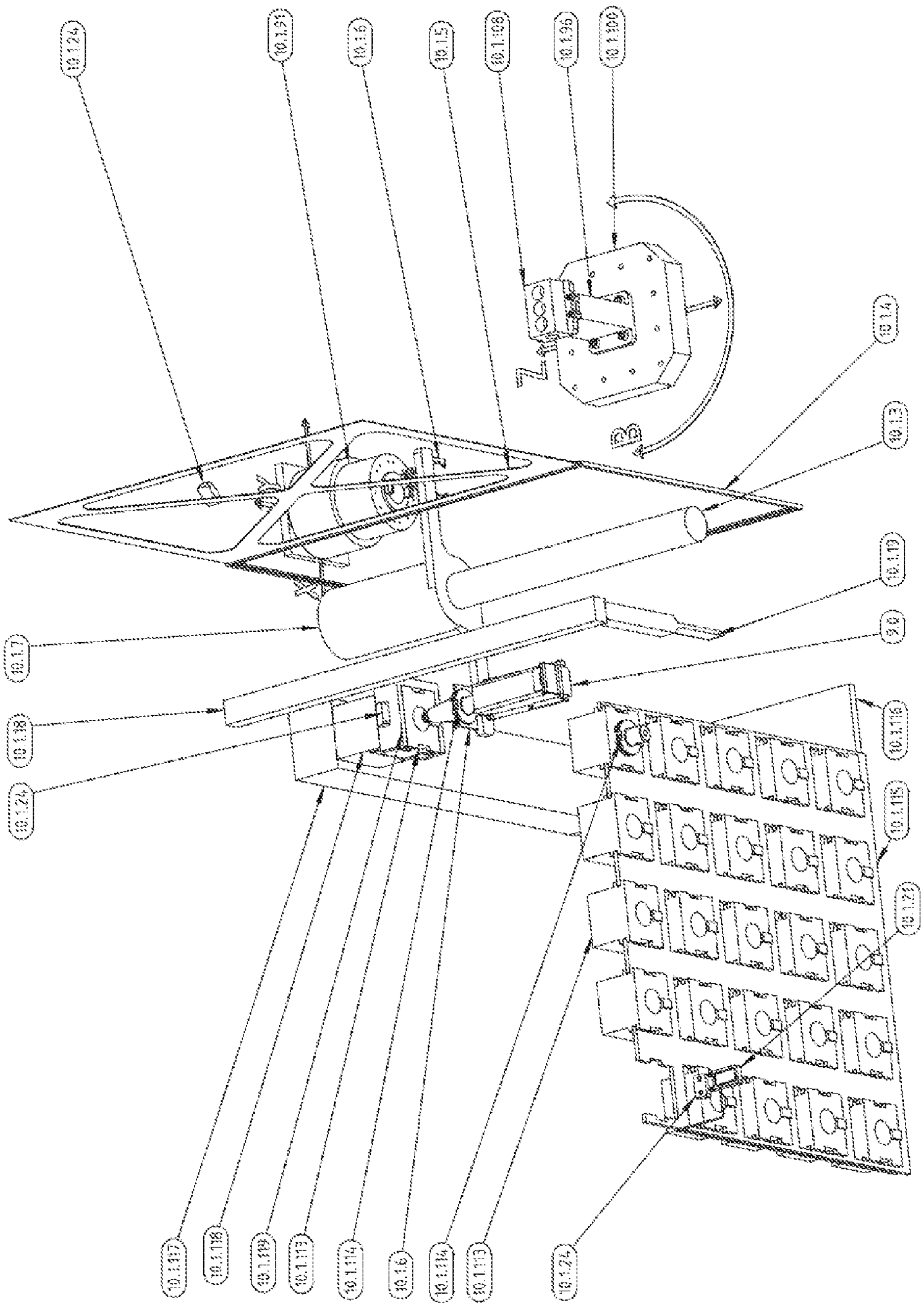

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 18 = S-Arm Xfers Spindle Data - Metrology Tool into the Next Tool Position and the Empty Next Tool to the Spindle Position, Top-Left ISO View

Figure-68

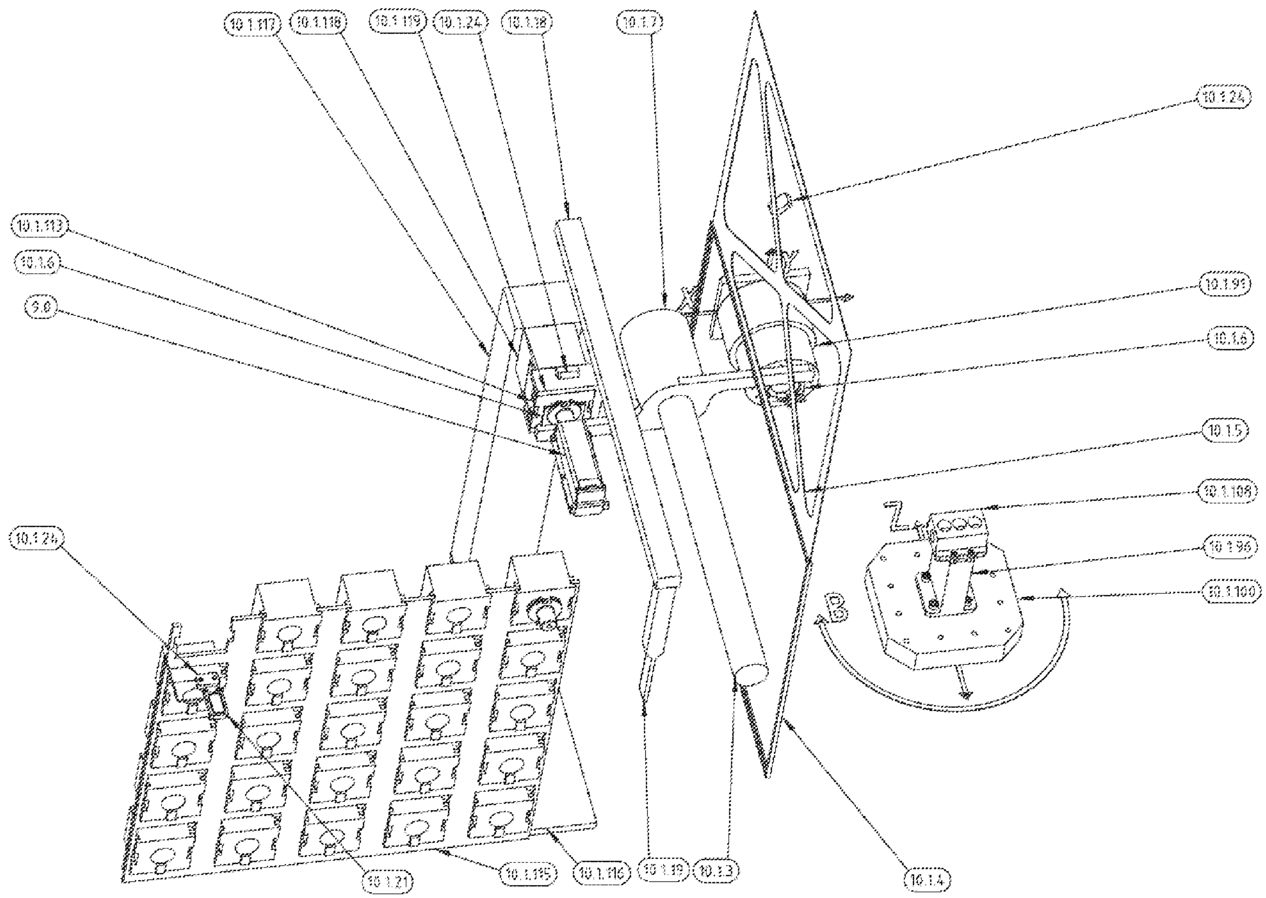

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 19 = S-Arm Inserts Spindle Data - Metrology Tool into the Next Tool Position and the Empty Next Tool into Spindle Position, Top-Left ISO View

Figure-69

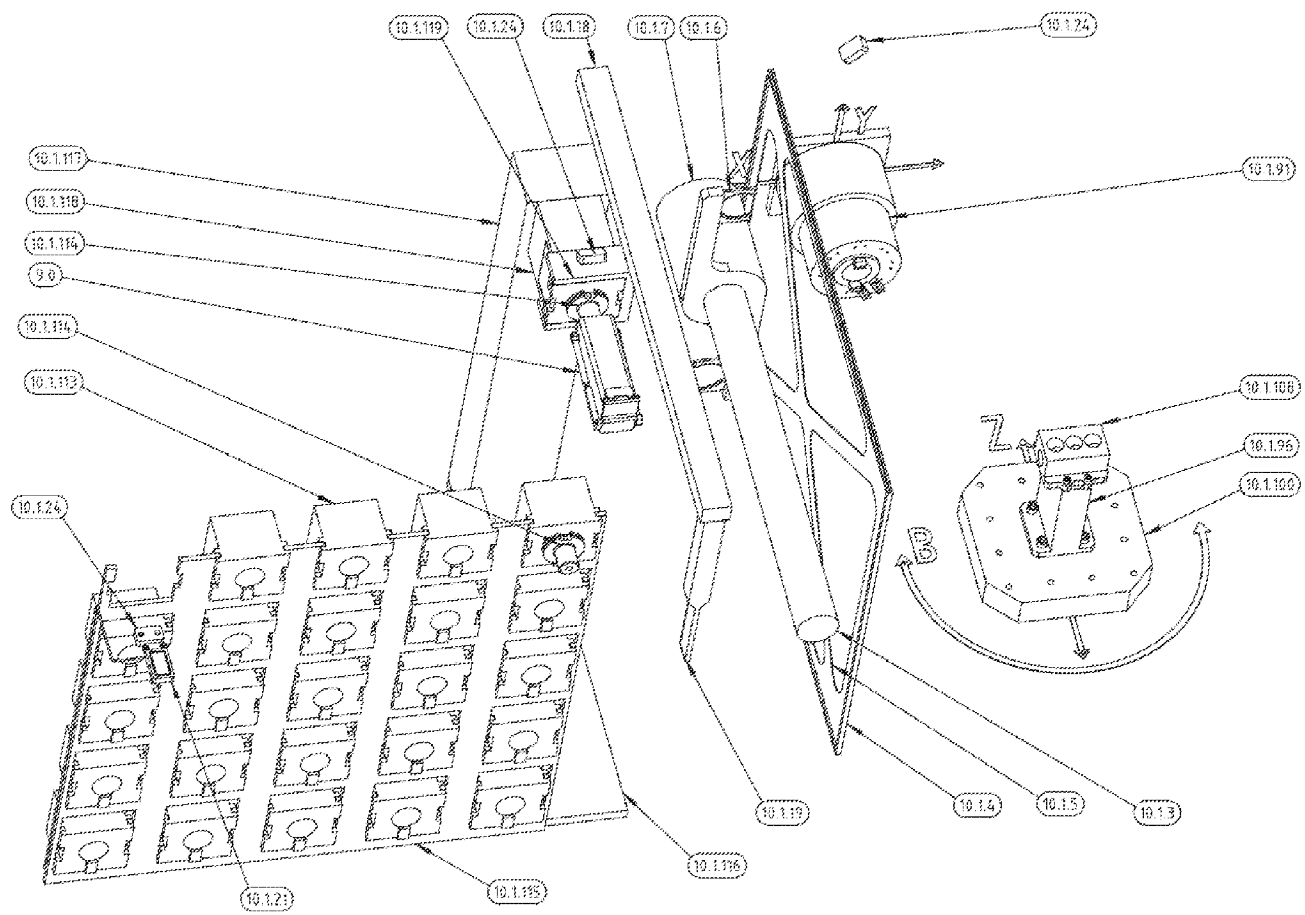

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 20 = S-Arm Releases Tools at Next Tool with IR Communications and Spindle Positions, S-Arm Rotates to Clear Position, and Enclosure Closes, Top-Left ISO View

Figure-70

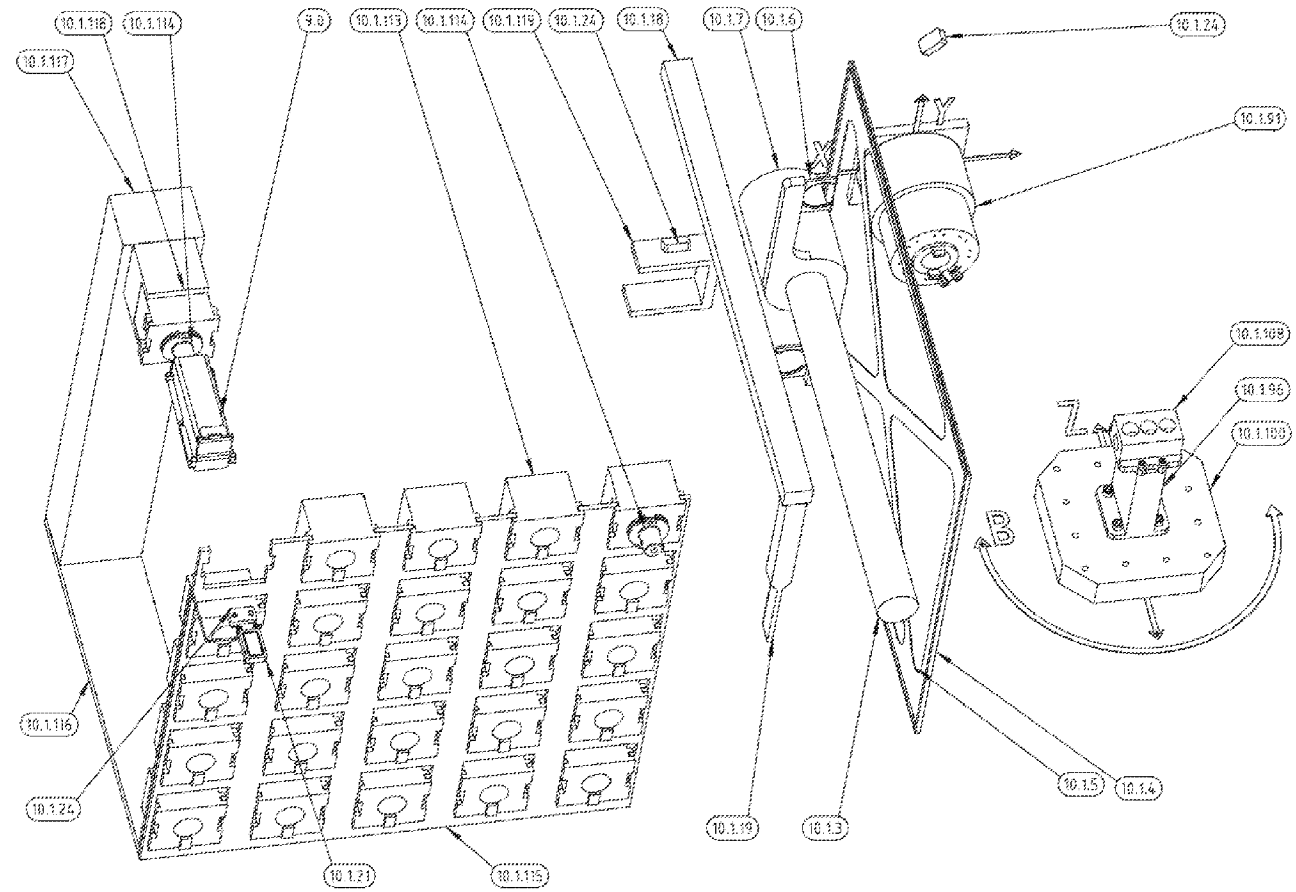

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 21 = Spindle Data - Metrology Tool moved to column of the the Magazine Storage Pocket #21 from the Next Tool Position, Top-Left ISO View

Figure-71

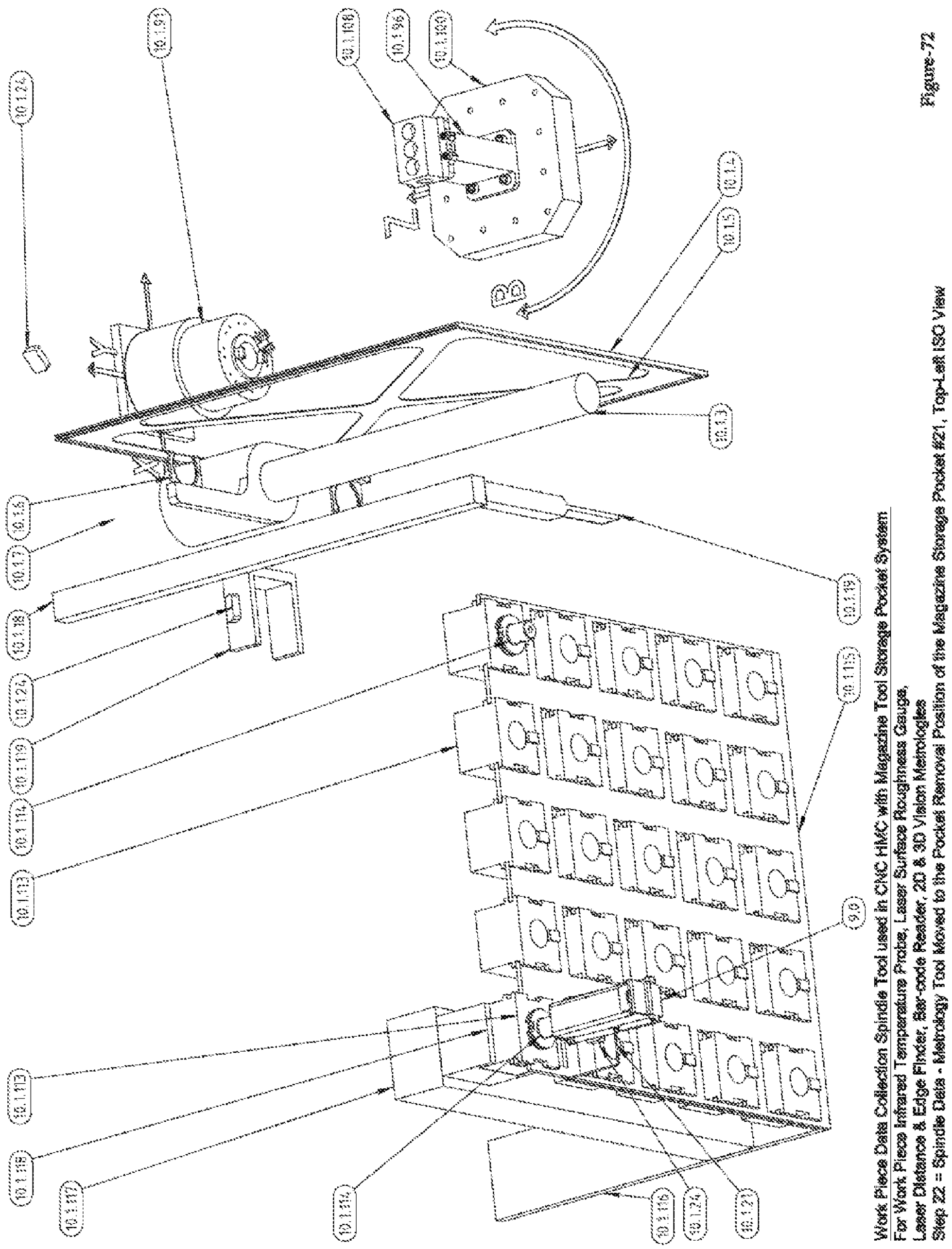

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 22 = Spindle Data - Metrology Tool Moved to the Pocket Removal Position of the Magazine Storage Pocket #21, Top-Left ISO View

Figure-72

Work Piece Data Collection Spindle Tool used in CNC HMC with Magazine Tool Storage Pocket System
For Work Piece Infrared Temperature Probe, Laser Surface Roughness Gauge,
Laser Distance & Edge Finder, Bar-code Reader, 2D & 3D Vision Metrologies
Step 23 = Spindle Data - Metrology Tool at the Storage Position of the Magazine Storage Pocket #21, Top-Left ISO View Work Piece Data Collection Spindle Tool used in CNC HMC with Magazine Storage Pocket System
For Work Piece Infrared Temperature Probe, Laser Surface Roughness Gauge,
Laser Distance & Edge Finder, Bar-code Reader, 2D & 3D Vision Metrologies
Step 24 = Powered and Data Collected from the Spindle Data - Metrology Tool in Magazine Storage Pocket #21, Top-Left ISO View

HARSH ENVIRONMENT VISION CAMERA SYSTEM

CROSS-REFERENCE TO RELATED APPLICATIONS

This application is a Continuation-In-Part of U.S. patent application Ser. No. 14/875,317, titled "SPINDLE MOUNTABLE CAMERA SYSTEM," filed Oct. 5, 2015, U.S. Pat. No. 9,573,181, which claims the benefit of U.S. Provisional Application No. 62/059,692, filed Oct. 3, 2014, the disclosures of which are hereby incorporated by reference in their entirety. This application is related to U.S. patent application Ser. No. 14/875,239, titled "MULTI-STYLUS ORBITAL ENGRAVING TOOL," filed Oct. 5, 2015, and which is hereby incorporated by reference in its entirety. This application is related to U.S. patent application Ser. No. 14/875,284, titled "METHOD AND APPARATUS FOR ENCODING DATA ON A WORK PIECE," filed Oct. 5, 2015, and which is hereby incorporated by reference in its entirety.

BACKGROUND

The identification means of work pieces utilized for its identification and traceability throughout the manufacturing process and product life cycle has become a necessity for the high productivity required by the increasingly competitive global manufacturing operations having multiple part variants within a products' family, using multiple work-piece part work holding fixtures, and at multiple manufacturing locations, being produced via sequential machining-manufacturing operations, and manufacturing processes. As the work-piece part's identification data is frequently required by the Manufacturer's Quality Plan, Industrial Standards Organizations, Regulatory Agencies, customer(s) specifications, etc., such as for patient specific replacement(s), the work-piece part's design revisions, the product's assembly of multiple work-piece parts having a combined tolerance stack-up, a work-piece part's/Article's certificate of origin, Department of Defense components, product recall campaigns, forensic identification, etc.

Traditional Direct Part Marking Via the Manual Direct Work-Piece Marking and Identification Via Impacting Stamps Manual work-piece direct part marking may not be desirable, and or suitable, for most modern manufacturing processes. Because it is susceptible to human error(s) for correctly marking the work-piece part/article, with errors negating the intended purpose of the work-piece parts'/articles' identification, and potentially injurious to personnel, via using a hammer to impact the hardened steel character forming stamp(s) onto the work piece's surface, to a semi-controlled depth, to indent and displace the surface material of the work-piece part/article to create a readable character and or symbol causing the displaced material to project above the previously smooth surface.

As a Secondary Operation Via the Semi-Automatic Direct Work-Piece Marking and Identification Semi-automatic work-piece direct part marking can be done as a secondary operation to the primary manufacturing process that may not be desirable, and or suitable, for manufacturing processes that requires integrity of the data because it is susceptible to error(s) for correctly marking the corresponding work-piece part/article with the required data, with errors negating the intended purpose of the work-piece part's/article's identification.

Automatic Point-Of-Manufacture Work-Piece Marking and Identification

Automatic point-of-manufacture work-piece part/article engraving for marking/identification minimizes the opportunities for data error(s) and eliminates the potential for injuring personnel.

Automatic point-of-manufacture Work-piece Engraving is desirable at the point of manufacturing the work-piece part/article because of its being an integral operation of the production process to ensure the product's work-piece part/article marking and identification data integrity.

Automatic Work-piece Engraving is desirable to reduce the operator's potential for injury by eliminating the use of having to manually impact the hardened character forming stamp(s) against the work-piece part/article.

Existing Engraving Methods:

Currently, there are two common methodologies for Automatic point-of-manufacture direct work-piece marking spindle tooling used within Computer Numerically Controlled (CNC) Machine Tools, both having a different single point tool for either cutting material from the work-piece surface or impacting the work-piece part/article to indent and displace the work-piece part's/article's base material to create a readable character and or symbol:

Single Point Cutting Tools:

Cutting material from the work-piece surface using one rotating fluted cutting tool being plunged into the work-piece to a specific depth for the tool's cutting land(s) to remove the material from the work-piece surface while it's being moved parallel to the work-piece part's/article's surface by the motion of the CNC machine tool, to "write" the segments of a character via the removed material of the work piece's cutout profile cross section at specific location(s) and or along a path of lines and or curves on the work-piece part's surface to engrave a readable character and or symbol.

Single Point Impacting Tools:

Impacting via the "dot-peen" or scribing via the "Square-Dot" methodologies onto the work-piece part to indent and displace the work-piece material using a percussion motion to plunge a single point stylus into the work-piece to a depth to displace the material of the work piece's surface with the tool being lifted from the work-piece part's/article's surface as the tool is being moved parallel to the work-piece surface by the CNC machine tool to the next specific location(s) to "write" the character via the visually contiguous/adjacent pointed stylus at a specific location(s) or along a path of lines and or curves on the work-piece part's surface making a readable character and or symbol.

Multiple Point Impacting Tools:

Impacting the work-piece to indent and displace the work-piece material using a percussion motion to plunge multiple single point styluses into the work-piece to a depth to displace the material of the work piece's surface with the tool being lifted from the work-piece surface to "write" the next character via the visually contiguous/adjacent multiple pointed styluses impact "dots or dot-peen" at a specific location(s), or along a path of lines and or curves on the work-piece part's surface making a readable character and or symbol.

Disadvantages of the Existing Work-Piece Part Engraving Methods:

Both of the single stylus direct part marking processes described above have the same initial limitation for the Automatic point-of-manufacture work-piece direct part marking and identification operation, as that of being a time consuming operation for an expensive machine tool and manufacturing process via being constrained by their respective single point tooling for the work-piece part's surface material displacement.

The higher manufacturing costs and reduced tool life for the rotating Cutting tool method of engraving are comparable to the standard single point CNC cutting tools.

The Impacting pointed stylus direct part marking devices are more expensive and potentially damaging to the CNC machine tool's precision spindle bearings. While the smoothness of the work-piece surface is disrupted by the impacting of the pointed stylus potentially affecting its assembly to an adjacent work-piece part, while the displaced work-piece surface material can become a source of contamination in the application of the work-piece part(s) in its assembly.

Disadvantages of Marking Inks and Printed Labels:

The use of a "permanent" marking pens and inks to mark/identify the work-piece has multiple limitations such as:

A) The manual method of pen marking the readable character and or symbol to the corresponding work-piece part is subject to human operator error and the readers' interpretation of the data.

B) The marking ink may not adhere to the machined work-piece part's surface because of the machine tool's cutting fluid and or protective coating on the work-piece part.

C) The vibratory fluidic and or aggregate stone processes used to de-burr/remove the sharp edges of the machined work-piece part can also remove the marking ink from the work piece, requiring the remarking of the work-piece after its de-burring operation.

D) The agitated and or high pressure washing and rinsing processing operation(s) of the machined work-piece part can remove the marking ink from the work-piece part.

E) The corrosion resistant/preservative coating fluid used for storing and shipping the work-piece part can remove the marking ink from the work-piece part.

F) The marking ink may need to be removed from the work-piece part at the components' assembly point to prevent contamination of the assembled product.

G) The marking ink would not be readily detectable on the work-piece part beneath the assembled components' painted surface.

H) The initial marking ink's information prior to the machining operation may be critical to the documentation required for the traceability of the work-piece part and its data that may need to be captured before its removal from the work-piece part.

I) The marking ink's information after the machining operation may be critical to the documentation required for the traceability of the work-piece part and its data that may need to be captured before its removal from the work-piece part.

The use of an adhesive backed printed label to mark/identify the work-piece has multiple limitations such as:

A) The manual application of the correct adhesive backed printed label to the corresponding work-piece part is subject to human operator error.

B) The adhesive backed printed label may not adhere to the machined work-piece part because of the machine tool's cutting fluid on the work-piece part.

C) The vibratory fluidic and or aggregate stone processes used to de-burr/remove the sharp edges of the machined work-piece part can also remove the adhesive backed printed label from the work-piece part.

D) The agitated and or high pressure washing and rinsing processing operation(s) of the machined work-piece part can also remove the adhesive backed printed label from the work-piece part.

E) The corrosion resistant/preservative coating fluid used for storing and shipping the work-piece part can remove the adhesive backed printed label from the work-piece part.

F) The adhesive backed printed label may need to be removed from the work-piece part for the assembly of the components as required to prevent contamination of the assembled product part.

G) The adhesive backed printed label may need to be removed from the work-piece part for the assembly of the components as required for the proper fit-up with the adjacent components.

H) The adhesive backed printed label may need to be removed from the work-piece part after the components' assembly to facilitate painting.

I) The adhesive backed printed label would not be readily detectable beneath the surface of the components' painted surface.

J) The initial printed label's information prior to the machining operation may be critical to the documentation required for the traceability of the work-piece part and its data that may need to be captured before its removal from the work-piece part.

K) The printed label's information after the machining operation may be critical to the documentation required for the traceability of the work-piece part and its data that may need to be captured before its removal from the work-piece part.

Considerations for the productive machining of work piece parts and the increased necessity for the automatic point-of-manufacture Direct Work-piece Marking and Identification:

The automatic point-of-manufacture direct work-piece part marking operation is an additional machining operation that requires its minimization to reduce the CNC machine's overall cycle time to a minimum, as the cost basis for CNC Machining is a combination of cost effective equipment utilization, the quality, and the quantity of work-piece parts/articles being produced in the shortest time possible.

A. The higher quantity of work-piece parts increases the opportunities for manual work-piece part marking operation errors and operator injuries using impacting stamps.

B. The higher productivity of the high speed/high production output advanced machine tools' increases the opportunities for manufacturing defects via increasing the quantity of defective work-piece parts that could be produced in a shorter time span.

C. The higher productivity of machine tools increases the quantity of work-piece parts that need to be identified via the work-piece part marking operation of the manufacturing process.

D. The higher productivity of the high speed machining for advanced machine tools can be attributed to a combination of advances in (a) cutting tool technologies (materials, designs, & coatings) to facilitate rough machining in only one pass for the maximum work-piece material stock removal and then using the same cutting tool for the finishing pass for a "mirror like" surface finish or one pass for the maximum work-piece material stock removal and simultaneously producing a "mirror like" surface finish, (b) the higher speed computer processors, digital inputs, and outputs directly increasing the speed of the machine tools' driven axes and spindles, (c) the improved machine tool designs' utilization of full-time pressure lubricated recirculating bearings ways, ceramic elements, closed loop liquid temperature management, and thermal compensating algorithms to manage its heat generating mechanisms, (d) the machine tools' NC-Programming productivity simulation software and "chip thinning" machining methodologies being utilized to increase cutting feed rates within a tool's operational machining path, etc.

E. The high speed machining of multiple work-piece parts causes heating of the work-piece part that in turn causes dimensional changes from work-piece to work-piece over a period of time and or within a group of multiple work-piece parts being machined via the same machining cycle.

F. The machining of work pieces, especially at high speed, causes heating of the work-piece that causes dimensional changes from work-piece to work-piece over a period of time being caused by changing ambient and work-piece temperatures and the stress-relief/normalization caused by the removal of the raw work-piece material. This can necessitate the Coordinate Measurement Machine's dimensional inspection of the machined work-piece part being delayed, 22 hours or more for some applications.

G. The higher productivity of high speed machining increases the opportunities for manufacturing defects via increasing the thermal dimensional changes of the finished work pieces. These errors are corrected by the Coordinate Measurement Machine's dimensional inspection of the work-piece part(s) having been machined at a specific time and fixture location(s), then using the corresponding work piece's CMM inspection data for correcting the corresponding machine tools' work-piece part machining NC-Program as required. The improved high speed machining of aluminum work-piece parts has resulted in the machining cycle time for 4 parts being machined in one operation on 2 sides being reduced from 97 minutes when the manufacturing operations were developed in the 1990s, to 9:36 minutes in 2013 via the NC-Program O0602.

H. The dimensional changes of the finished work-piece part caused by thermal changes during machining can be combined with those caused by the stress-relief/normalization of the raw work-piece material that are then corrected by the Coordinate Measurement Machine's dimensional inspection of the work-piece part having been machined at a specific time and fixture location(s), then using the corresponding work piece's CMM inspection data for correcting the corresponding machine tools' work-piece part machining NC-Program as required. The improved high speed 6 sided machining of one cast iron work-piece part "317" has resulted in the machining cycle time being reduced from 390 minutes being done via 4 machining operations on a 4 work-piece part locating fixtures on 3 different CNC machines when the manufacturing process was developed in the 1990s, to 112 minutes on 2 work-piece part locating fixtures on 1 CNC machine in 2011 via the NC-Programs O3170, O3171, and O3173.

I. The specific work-piece part being sequentially machined at specific location(s) of a high density multiple position work-piece holding fixture need to be uniquely and correctly identified to facilitate that work-piece parts' correct sequential transfer to the next subsequent machining location(s) of the fixture and for the appropriate and corresponding corrective action(s).

J. The multiple sources and suppliers for the incoming raw work-piece parts to be machined increases the opportunities for manufacturing defects via the increasing variability of the raw work-piece parts coming from multiple casting patterns and or suppliers such as those having a specific date stamp identification for a specific group of raw work-piece parts and or having various suppliers for those work-piece parts.

K. Multiple work-piece parts having been potentially machined at numerous locations of a multiple position work-piece holding fixture, having the variables as in paragraph J above, will need to be uniquely and correctly identified to facilitate the corresponding work-piece parts' correlation to the specific machine tool(s) used for machining, the cutting tool(s) that were used, and the specific location(s) of the work holding fixture(s) for the corresponding corrective action(s) that may be required for that specific work-piece part.

L. The cell of multiple automatic machine tools, which includes the transferring of multiple pre-loaded work pieces pallets, and the machine tools' specific pre-installed initial and sometimes multiple backup tools that are automatically selected after the initial tools' specific operational usage limit is reached to facilitate automated manufacturing operations, relies on the tracking and serialization data of the work-piece parts for the traceability of defects and for the corresponding corrective action(s).

M. The automatic point-of-manufacture direct work-piece part marking/engraving operation within the machine tool becomes a portion of the machine's cycle time, increasing the machine's overall cycle time, and increases the machining cost of the work-piece part/article.

However, the total manufacturing costs for the high productivity sequential machining of multiple work-piece parts will increase when the shorter cycle time of not marking the work-piece parts causes the erroneous sequential transferring of work-piece parts between the sequential machining operations and the increased difficulty for the root cause defect analysis and the corresponding corrective action required for eliminating defective and out of tolerance work pieces. The sequential machining of multiple work-piece parts, correctly via multiple operations, can be dependent upon using the same manual transfer sequence for the work-piece parts from one of the previous sequential work-piece parts' fixture location to the next sequential work-piece parts' fixture location for the next machining/manufacturing operation.

SUMMARY

This Summary is provided to introduce a selection of concepts in a simplified form that are further described below in the Detailed Description. This Summary, and the foregoing Background, is not intended to identify key aspects or essential aspects of the claimed subject matter. Moreover, this Summary is not intended for use as an aid in determining the scope of the claimed subject matter.

A harsh environment camera system is disclosed. The disclosed technology can facilitate reliable operation of camera vision systems within the harsh environments of the machine tool industry as well as outdoor environments and applications, such as drones and autonomous vehicles, for example. In one aspect of the present technology, the system provides dried air to the system's camera module, lens, and/or cover to prevent fogging and wetting of the lens and covers. In an embodiment, the system can include an enclosure having an electronics compartment and a camera compartment with a camera opening. A camera module is disposed within the camera compartment and one or more electronic components capable of generating heat are positioned in the electronics compartment. A compressed gas connector, connectable to a gas source, can be mounted on the enclosure. A metering orifice having an inlet and an outlet is in fluid communication with the connector. The metering orifice is operative to cool a gas flowing therethrough, thereby condensing moisture from the gas. A gas conduit is in fluid communication with the outlet of the orifice and extends through the electronics compartment to the camera compartment. A portion of the gas conduit is positioned in close proximity to the one or more electronic components, whereby the gas is heated prior to entering the camera compartment.

A spindle mountable camera system connectable to a CNC machine for work piece inspection and identification is disclosed. The disclosed technology facilitates real-time point-of-use in-process collection and transfer of data to and from a work piece to improve its manufacturability and traceability. The camera system includes a mounting stem connectable to a CNC machine tool holder. The mounting stem includes an air passage connectable to an air supply of the CNC machine. An enclosure is attached to the mounting stem and includes a camera opening. A camera module is disposed within the enclosure. In some embodiments, an air supply line is connected between the mounting stem and the camera module. An enclosure cover is pivotably mounted to the enclosure proximate the camera opening. One or more pneumatic cylinders are connected to the air passages and extend between the enclosure and the enclosure cover to move the enclosure cover between an open position and a closed position.

These and other aspects of the present system and method will be apparent after consideration of the Detailed Description and Figures herein. It is to be understood, however, that the scope of the invention shall be determined by the claims as issued and not by whether given subject matter addresses any or all issues noted in the Background or includes any features or aspects recited in this Summary.

DRAWINGS

Non-limiting and non-exhaustive embodiments of the present invention, including the preferred embodiment, are described with reference to the following figures, wherein like reference numerals refer to like parts throughout the various views unless otherwise specified.

FIG. 1 basic/multi-functional Spindle work piece data collection vision inspection lens closed.

FIG. 2 basic/multi-functional Spindle work piece data collection spindle vision inspection lens open.

FIG. 3 basic/multi-functional Spindle work piece data collection vision inspection external lens open—external components exploded view.

FIG. 4 basic/multi-functional Spindle work piece data collection vision lens open—internal components cut-away view.

FIG. 5 basic/multi-functional Spindle work piece data collection internal modules and devices.

FIG. 6 basic/multi-functional Spindle work piece data collection internal modules and devices exploded view.

FIG. 7 basic/multi-functional Spindle work piece data collection induction Recharger and electrical contacts.

FIG. 8 basic/multi-functional Spindle work piece data collection induction Recharger top and section views.

FIG. 9 basic/multi-functional Spindle work piece data collection induction Recharger side and section views.

FIG. 10 basic/multi-functional Spindle work piece data collection communication-electrical interface options.

FIG. 11 basic/multi-functional Spindle work piece data collection electrical contacts and or Recharger.

FIG. 12 basic/multi-functional Spindle work piece data collection electrical contact Recharger top and section views.

FIG. 13 basic/multi-functional Spindle work piece data collection electrical contact Recharger side and section views.

FIG. 14 basic/multi-functional Spindle work piece data collection spindle vision bill of material.

For the advanced multi-functionality Spindle Tooling for Work piece verification, data collection, utilization, and exchange as shown by:

FIG. 15 advanced multi-functionality Spindle work piece metrology data collection spindle vision lens closed.

FIG. 16 advanced multi-functionality Spindle work piece metrology data collection spindle vision lens open.

FIG. 17 advanced multi-functionality Spindle work piece metrology data collection vision inspection external lens open—external components exploded view.

FIG. 18 advanced multi-functionality Spindle work piece metrology data collection vision lens open—internal components cut-away view.

FIG. 19 advanced multi-functionality Spindle work piece metrology data collection internal modules and devices.

FIG. 20 advanced multi-functionality Spindle work piece metrology data collection internal modules and devices exploded view.

FIG. 21 advanced multi-functionality Spindle work piece metrology data collection induction Recharger and electrical contacts.

FIG. 22 advanced multi-functionality Spindle work piece metrology data collection induction Recharger top and section views.

FIG. 23 advanced multi-functionality Spindle work piece metrology data collection induction Recharger side and section views.

FIG. 24 advanced multi-functionality Spindle work piece metrology data collection communication-electrical interface options.

FIG. 25 advanced multi-functionality Spindle work piece metrology data collection electrical contacts and or Recharger.

FIG. 26 advanced multi-functionality Spindle work piece metrology data collection electrical contact Recharger top and section views.

FIG. 27 advanced multi-functionality Spindle work piece metrology data collection electrical contact Recharger side and section views.

FIG. 28 advanced multi-functionality Spindle work piece metrology data collection spindle vision bill of material.

FIG. 29 through FIG. 50 the spindle mountable camera inspection/metrology system 9.0 being utilized in a typical 4 axis CNC machine tool having a multiple pockets chain style tool storage system for the automatic tool changer with the camera inspection/metrology system being in its respective tool storage pocket.

FIG. 30 the spindle mountable camera inspection/metrology system 9.0 being removed from its tool storage pocket and positioned in the dual pivoting rotating tool exchange transfer device 10.1.14.

FIG. 31 the spindle mountable camera inspection/metrology system 9.0 being rotationally pivoted in the dual pivoting rotating tool exchange transfer device 10.1.14

FIG. 32 the spindle mountable camera inspection/metrology system 9.0 being at its rotational transfer mid-position for being transferred in the dual pivoting rotating tool exchange transfer device 10.1.14 to the spindle load-unload rotating transfer device 10.1.7.

FIG. 33 the spindle mountable camera inspection/metrology system 9.0 being at its exchange position for being transferred from the dual pivoting rotating tool exchange transfer device 10.1.14 to the spindle load-unload rotating transfer device 10.1.7.

FIG. 34 the spindle mountable camera inspection/metrology system 9.0 being recharged and/or communicated with via its appropriate coupling device 10.1.25 while at the transfer exchange position before its subsequent transfer from the dual pivoting rotating tool exchange transfer device 10.1.14 to the spindle load-unload rotating transfer device 10.1.7.

FIG. 35 the spindle mountable camera inspection/metrology system 9.0 having been recharged and/or communicated with via its appropriate coupling device 10.1.25 while at the transfer exchange position before its subsequent transfer from the dual pivoting rotating tool exchange transfer device 10.1.14 to the spindle load-unload rotating transfer device 10.1.7 in its home/clearance position with the machine tool's machining enclosure door 10.1.5 being opened for the tools' subsequent simultaneous loading and unloading of the machine tool's spindle.

FIG. 36 the spindle mountable camera inspection/metrology system 9.0 being transferred at the exchange position from the dual pivoting rotating tool exchange transfer device 10.1.14 to the spindle load-unload rotating transfer device 10.1.7.

FIG. 37 the spindle mountable camera inspection/metrology system 9.0 being removed from the dual pivoting rotating tool exchange transfer device 10.1.14 via the spindle load-unload rotating transfer device 10.1.7 while it is simultaneously removing the spindle's tool 10.1.1 from the spindle 101.91.

FIG. 38 the spindle mountable camera inspection/metrology system 9.0 at its midpoint of being exchanged via the spindle load-unload rotating transfer device 10.1.7 simultaneously with the spindle's tool 10.1.1 having been removed from the spindle 101.91.

FIG. 39 the spindle mountable camera inspection/metrology system 9.0 at its spindle 101.91 load position via the spindle load-unload rotating transfer device 10.1.7 having simultaneously moved the spindle's tool 10.1.1 to its transfer position into the dual pivoting rotating tool exchange transfer device 10.1.14.

FIG. 40 the spindle mountable camera inspection/metrology system 9.0 is loaded into the spindle 101.91 via the spindle load-unload rotating transfer device 10.1.7 having simultaneously transferred/loaded the spindle's tool 10.1.1 to into the dual pivoting rotating tool exchange transfer device 10.1.14.

FIG. 41 the spindle mountable camera inspection/metrology system 9.0 is simultaneously secured in the spindle 101.91 and tool 10.1.1 is secured in the dual pivoting rotating tool exchange transfer device 10.1.14 for the load-unload rotating transfer device 10.1.7 to move to its home/clearance position.

FIG. 42 having the spindle mountable camera inspection/metrology system 9.0 is secured in the spindle 101.91 and the tool exchange access door is closed for the machine tool to operate as required and having activated the spindle mountable camera inspection/metrology system rotated via the spindle as may be required for its activation and/or orientation and it's being repositioned utilizing the axes XYZ and B and any other axis as may be required for the inspection of work piece 101.108 via an external control system operably connected to the machine tool communicating via an IR transmitter and receiver 10.1.24 within the machine tools enclosure and/or wirelessly and/or any other means as required.

FIG. 43 through FIG. 49 the spindle mountable camera inspection/metrology system 9.0 is sequentially transferred to the exchange position for the dual pivoting rotating tool exchange transfer device 10.1.14 for being recharged and/or communicated with via its appropriate coupling device 10.1.25.

FIG. 50 the spindle mountable camera inspection/metrology system having been recharged and/or communicated with via its appropriate coupling device 10.1.25 while at the exchange position, before its subsequent transfer from the dual pivoting rotating tool exchange transfer device 10.1.14 and its subsequent return to the multiple pockets chain style tool storage system's 1.1.13 respective tool storage pocket.

FIG. 51 through FIG. 74 shows the spindle mountable camera inspection/metrology system 9.0 being utilized in a typical 4 axis CNC machine tool having a multiple pockets magazine style tool storage system for the automatic tool changer with the camera inspection/metrology system being in its respective tool storage pocket.

FIG. 51 the spindle mountable camera inspection/metrology system 9.0 retained in the tool storage pocket 10.1.113 that is retained at its tool storage pocket and multiple pocket magazine 1.1.115 storage position while being recharged and/or communicated with via its appropriate coupling device 10.1.24 and/or 10.1.21.

FIG. 52 the spindle mountable camera inspection/metrology system 9.0 retained in the tool storage pocket 10.1.113 while it is being secured at its tool storage position via the tool storage pocket gripper 10.1.118 4 its subsequent removal from the multiple pocket storage magazine 1.1.115.

FIG. 53 the spindle mountable camera inspection/metrology system 9.0 retained in the tool storage pocket 10.1.113 while it is being removed from its tool pocket magazine storage position via the tool storage pocket gripper 10.1.118 after its having been recharged and/or communicated with via its appropriate coupling device 10.1.24 and/or 10.1.21.

FIG. 54 the spindle mountable camera inspection/metrology system 9.0 is transferred while in the tool storage pocket 10.1.113 via is being removed from its tool pocket magazine storage position via the tool storage pocket gripper 10.1.118.

FIG. 55 the spindle mountable camera inspection/metrology system 9.0 is transferred while in the tool storage pocket 10.1.113 via is being repositioned via the tool storage pocket gripper 10.1.118 into the stationary tool exchange transfer device 10.1.118.

FIG. 56 the spindle mountable camera inspection/metrology system 9.0 having been retained in the stationary tool exchange transfer device 10.1.118, having the spindle load-unload rotating transfer device 10.1.7 in its home/clearance position with the machining enclosure door 10.1.5 being opened for the tools' subsequent simultaneous loading and unloading, if required, the machine tool's spindle 10.1.91.

FIG. 57 the spindle mountable camera inspection/metrology system 9.0 being transferred from stationary tool exchange transfer device 10.1.18 to the spindle load-unload rotating transfer device 10.1.7.

FIG. 58 the spindle mountable camera inspection/metrology system 9.0 being removed from the stationary tool exchange transfer device 10.1.18 via the spindle load-unload rotating transfer device 10.1.7, and, if required, while it is simultaneously removing the spindle's tool from the spindle 101.91.

FIG. 59 the spindle mountable camera inspection/metrology system 9.0 at its midpoint of being exchanged via the spindle load-unload rotating transfer device 10.1.7, and, if required, simultaneously with the spindle's tool having been removed from the spindle 101.91.

FIG. 60 the spindle mountable camera inspection/metrology system 9.0 at its spindle 101.91 load position via the spindle load-unload rotating transfer device 10.1.7, and having, if required, simultaneously moved the spindle's tool to its transfer position into the stationary tool exchange transfer device 10.1.18.

FIG. 61 the spindle mountable camera inspection/metrology system 9.0 is loaded into the spindle 101.91 via the spindle load-unload rotating transfer device 10.1.7 having, if required, simultaneously transferred the spindle's tool to into the stationary tool exchange transfer device 10.1.18.

FIG. 62 the spindle mountable camera inspection/metrology system 9.0 is secured in the spindle 101.91, and, if required, the spindle's removed tool is secured simultaneously in the dual pivoting rotating tool exchange transfer device 10.1.14, for having the load-unload rotating transfer device 10.1.7 to move to its home/clearance position.

FIG. 63 having the spindle mountable camera inspection/metrology system 9.0 is secured in the spindle 101.91 and the tool exchange access door is closed for the machine tool to operate as required and having activated the spindle mountable camera inspection/metrology system rotated via the spindle as may be required for its activation and/or orientation and it's being repositioned utilizing the axes XYZ and B and any other axis as may be required for the inspection of work piece 101.108 via an external control system operably connected to the machine tool communicating via an IR transmitter and receiver 10.1.24 within the machine tools enclosure and/or wirelessly and/or any other means as required.

FIG. 64 through FIG. 73 the spindle mountable camera inspection/metrology system 9.0 is sequentially transferred to, and from the exchange position for the stationary tool exchange transfer device 10.1.18, and subsequently returned into its tool storage position in the multiple tooling pockets storage magazine 10.1.115.

FIG. 74 the spindle mountable camera inspection/metrology system 9.0 having been returned into its tool storage position for being recharged and/or communicated with via its appropriate coupling device 10.1.24 and/or 10.1.21.

DETAILED DESCRIPTION

Embodiments are described more fully below with reference to the accompanying figures, which form a part hereof and show, by way of illustration, specific exemplary embodiments. These embodiments are disclosed in sufficient detail to enable those skilled in the art to practice the invention. However, embodiments may be implemented in many different forms and should not be construed as being limited to the embodiments set forth herein. The following detailed description is, therefore, not to be taken in a limiting sense.

Spindle Mountable Camera System:

With reference to FIGS. 1-14, a spindle mountable camera system according to a representative embodiment is disclosed. The spindle mountable camera system is connectable to the spindle of a CNC machine for work piece inspection and identification. The camera system includes a mounting stem 9.11.1 connectable to a CNC machine tool holder 9.90, which can be connected to the spindle of a CNC machine (not shown). When the camera system is mounted to the spindle of the CNC machine, the CNC machine can move the camera system around a work center to inspect work piece(s) mounted therein.

Figure 4:
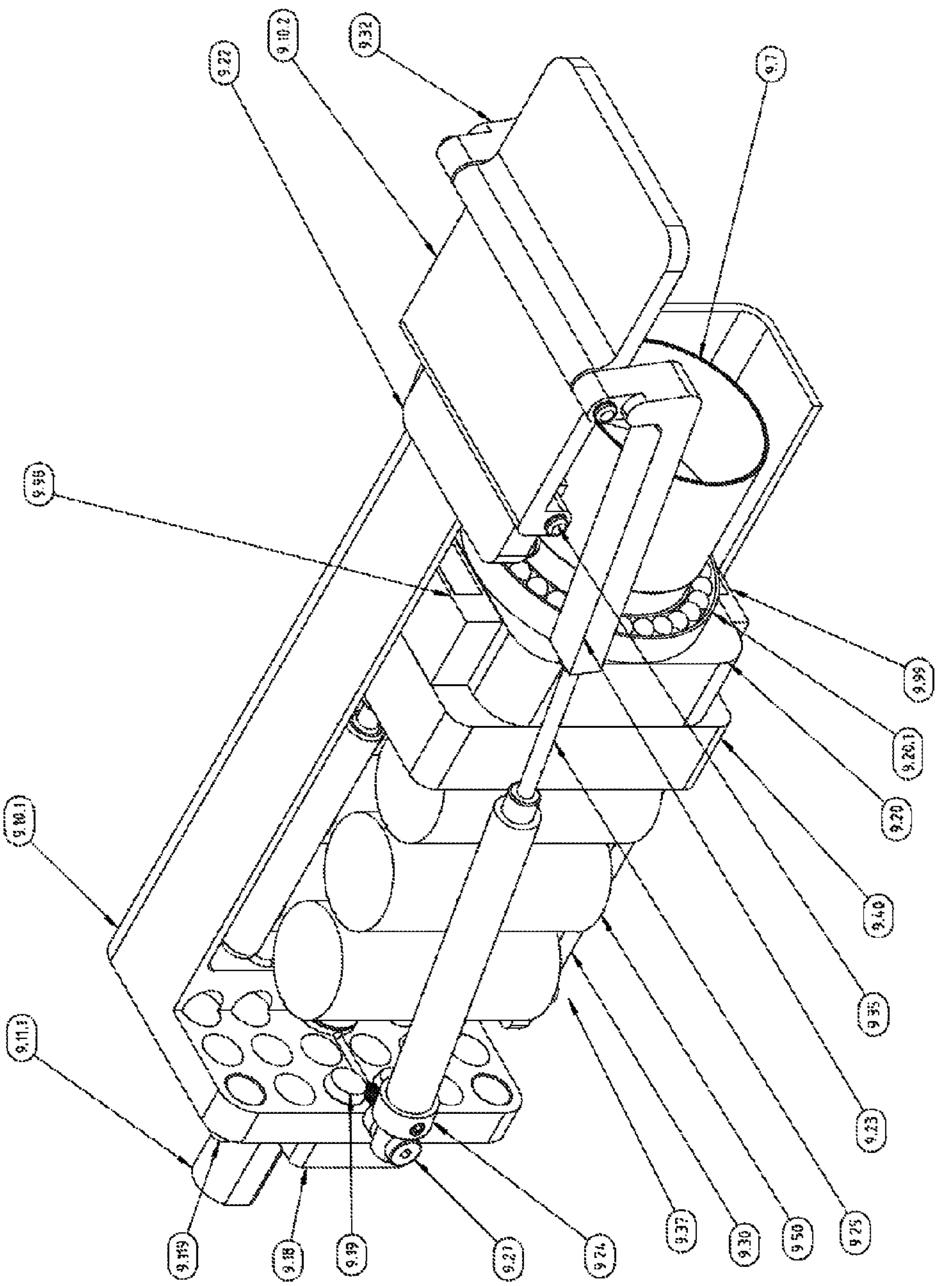
Figure 5:
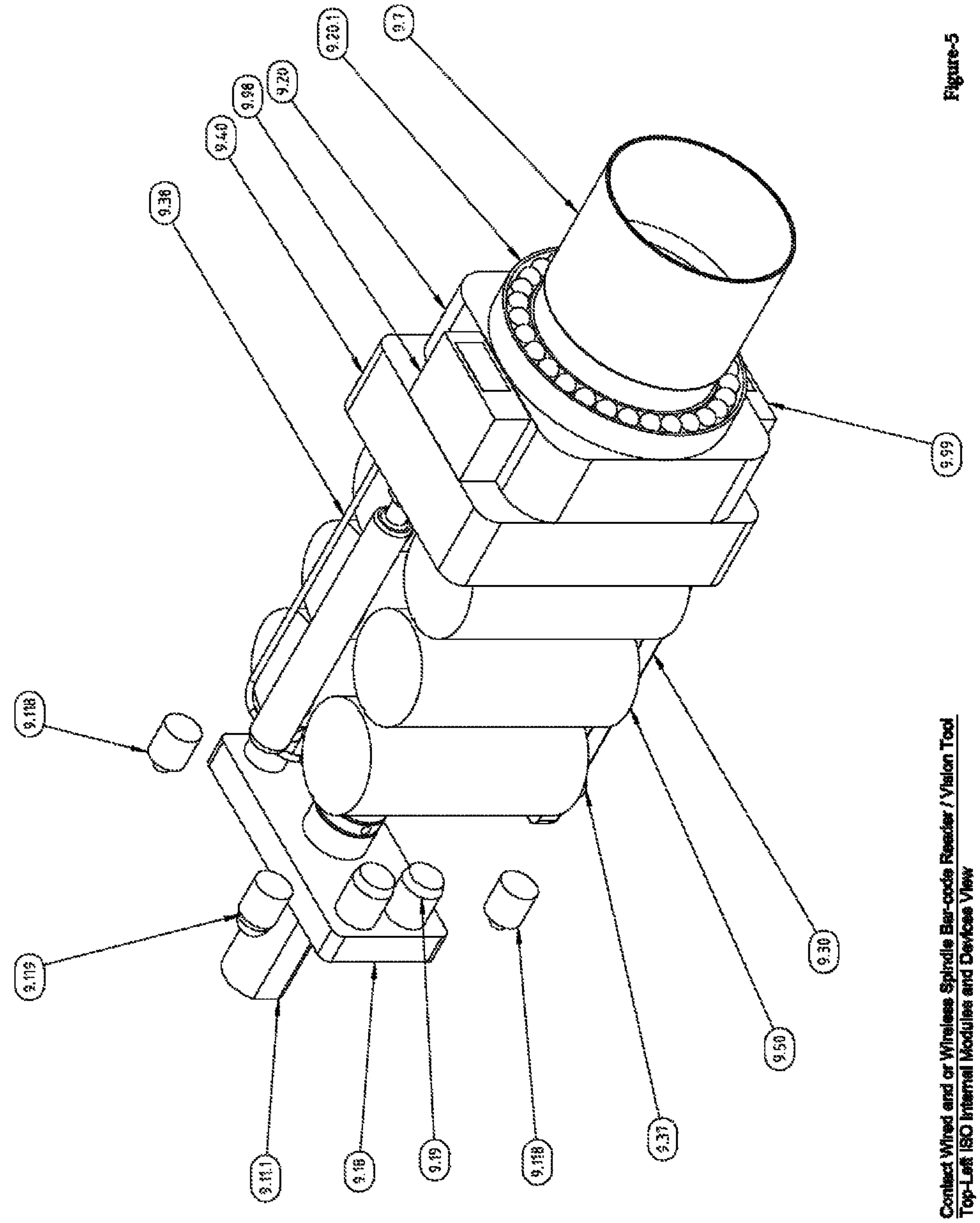
Figure 6:
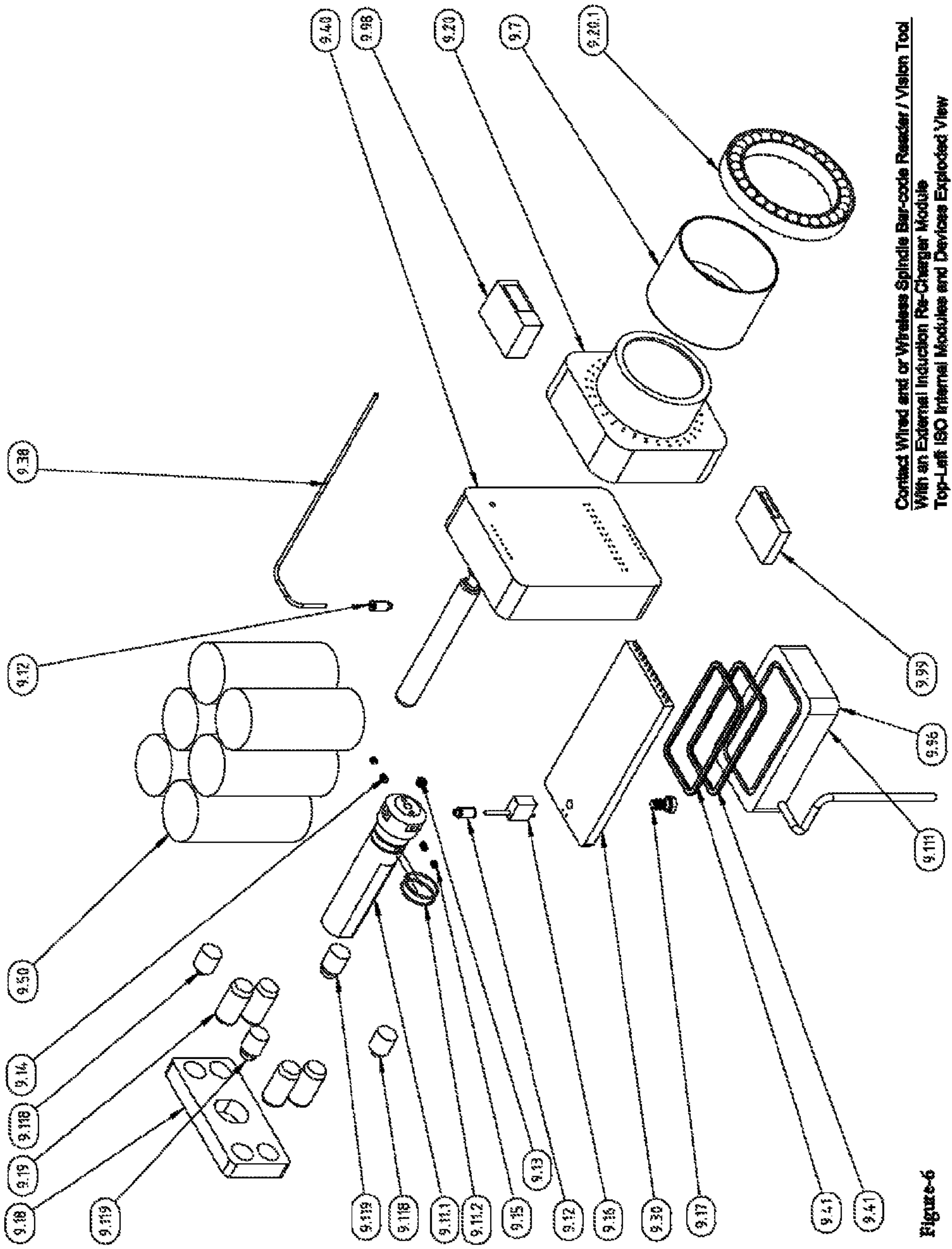
Figure 7:
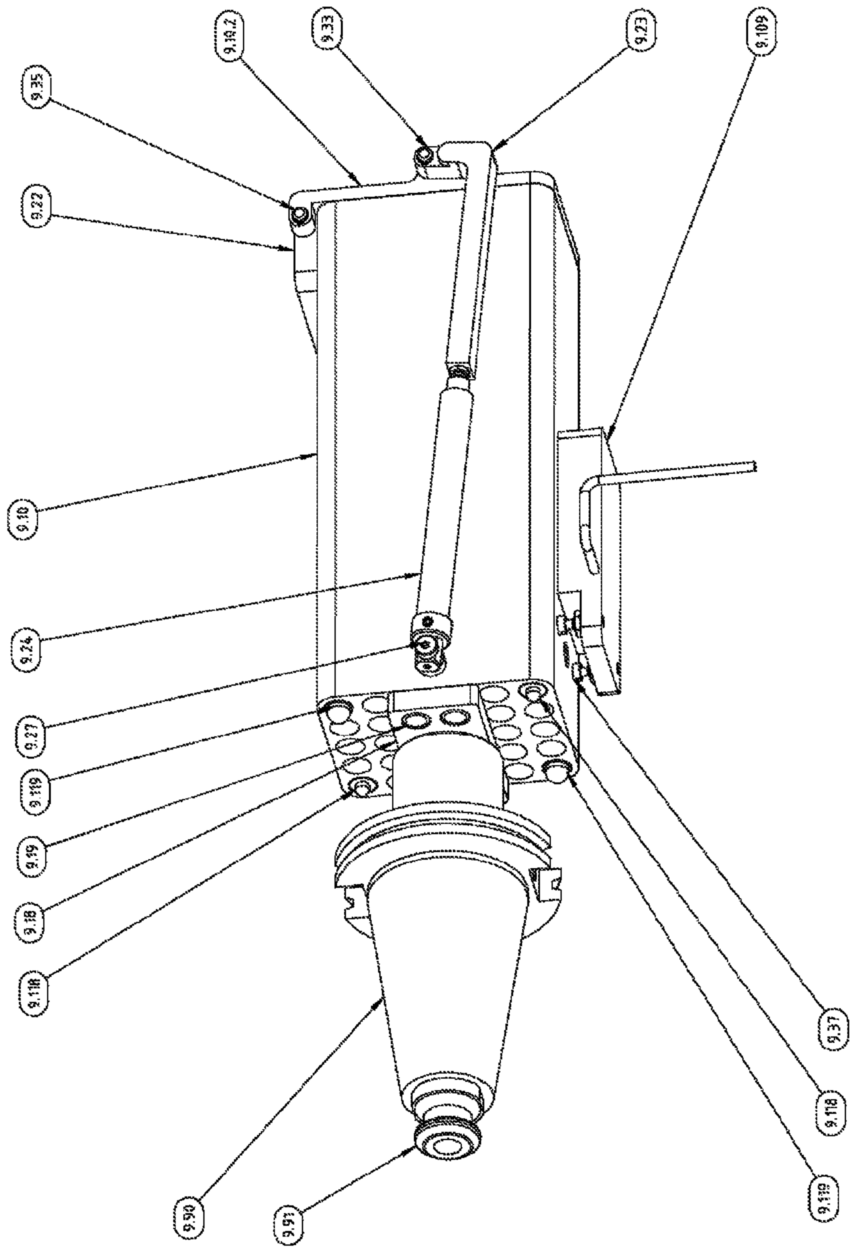
Figure 8:
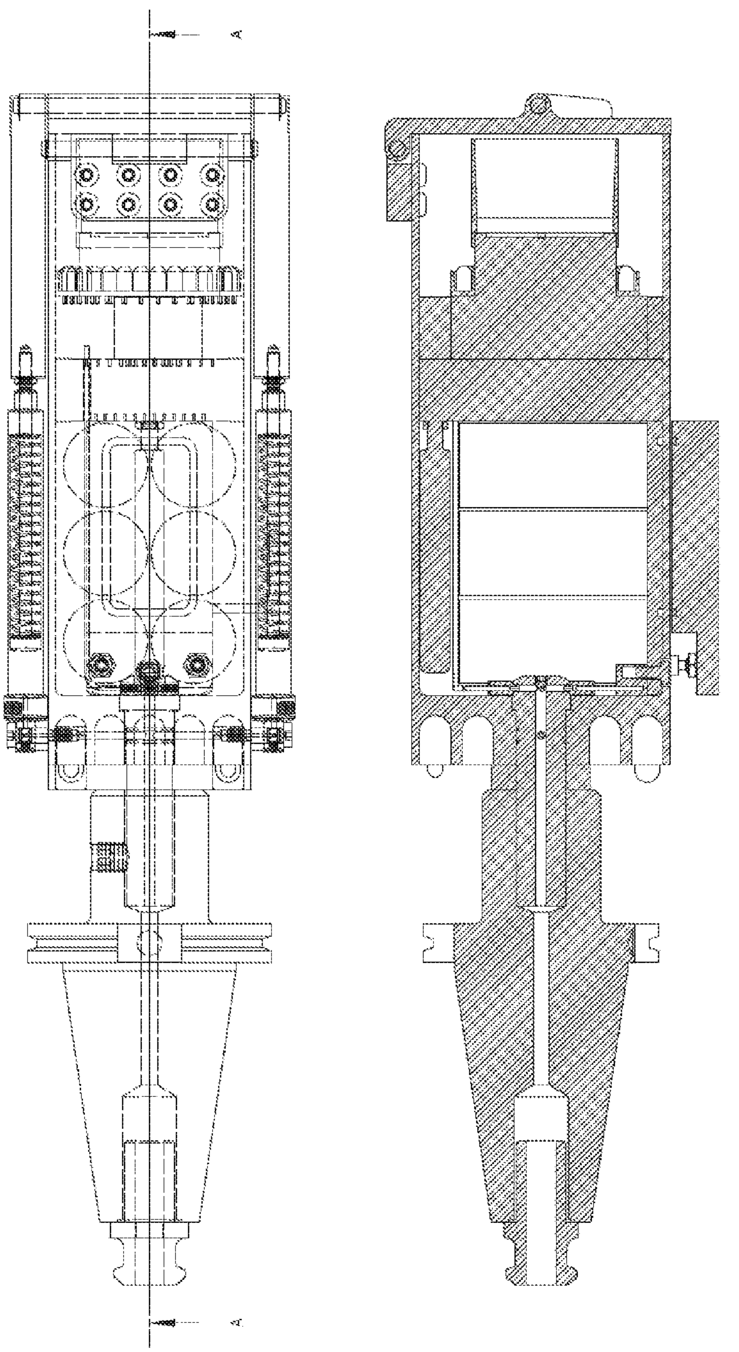
Figure 9:
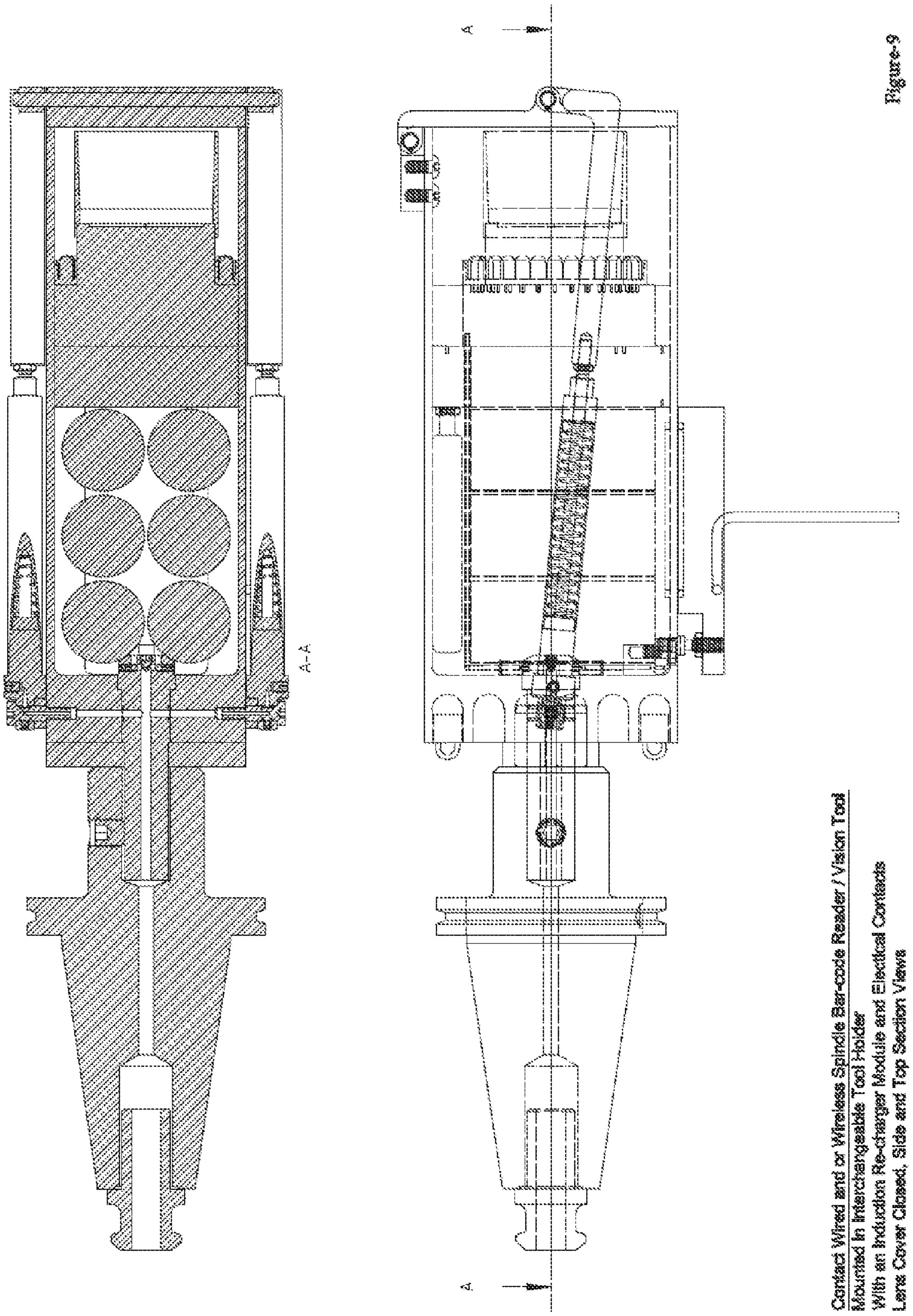
Figure 10:
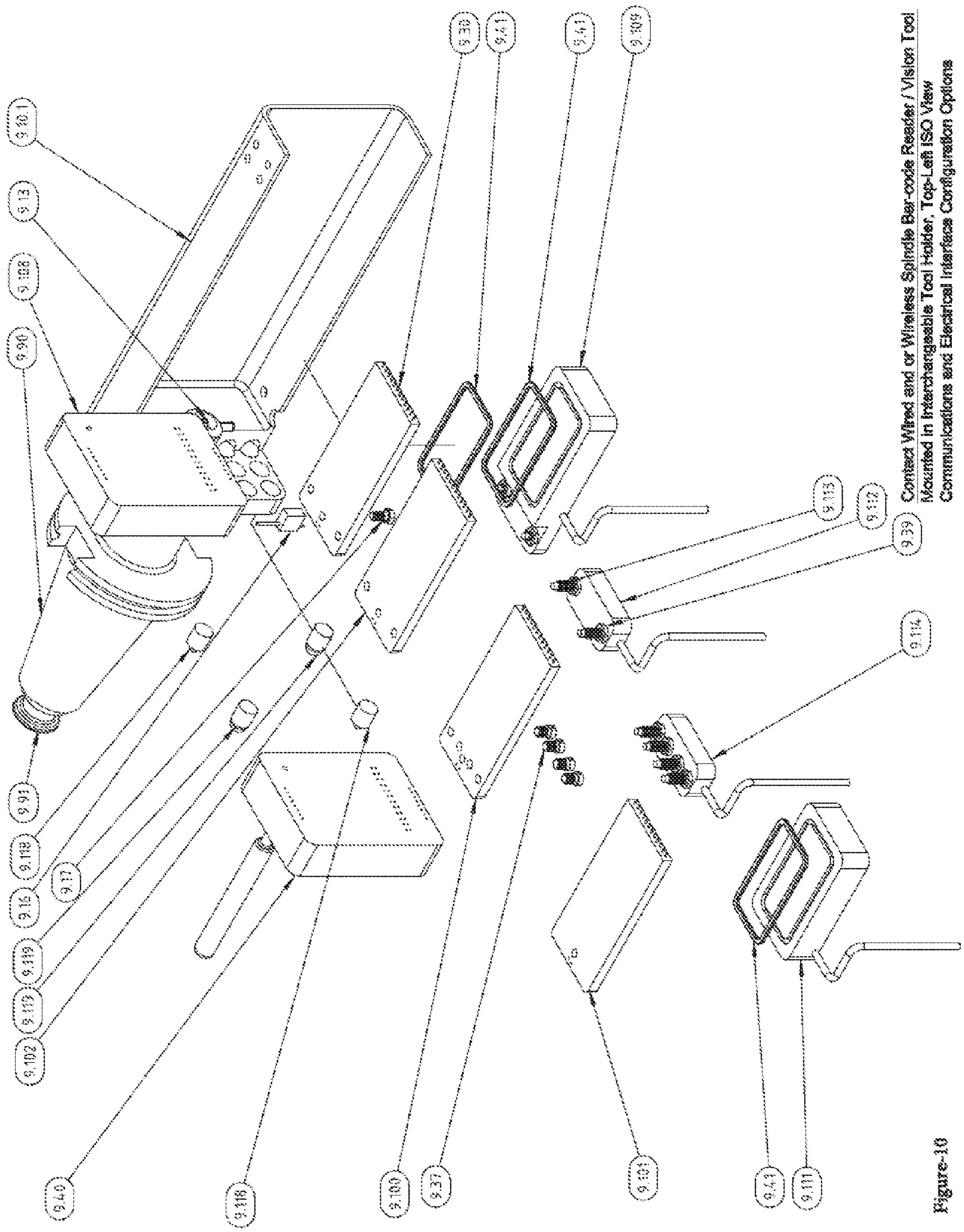
Figure 11:
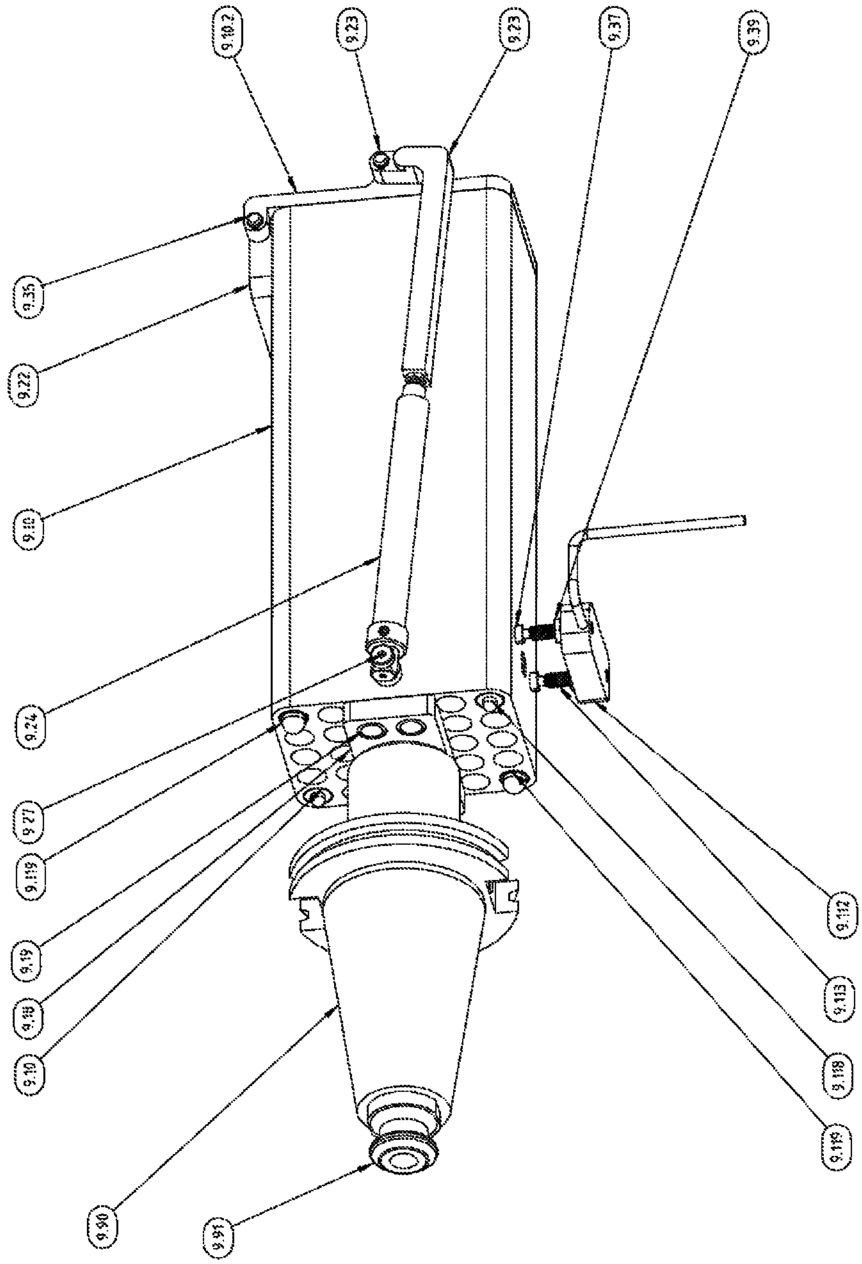
Figure 12:
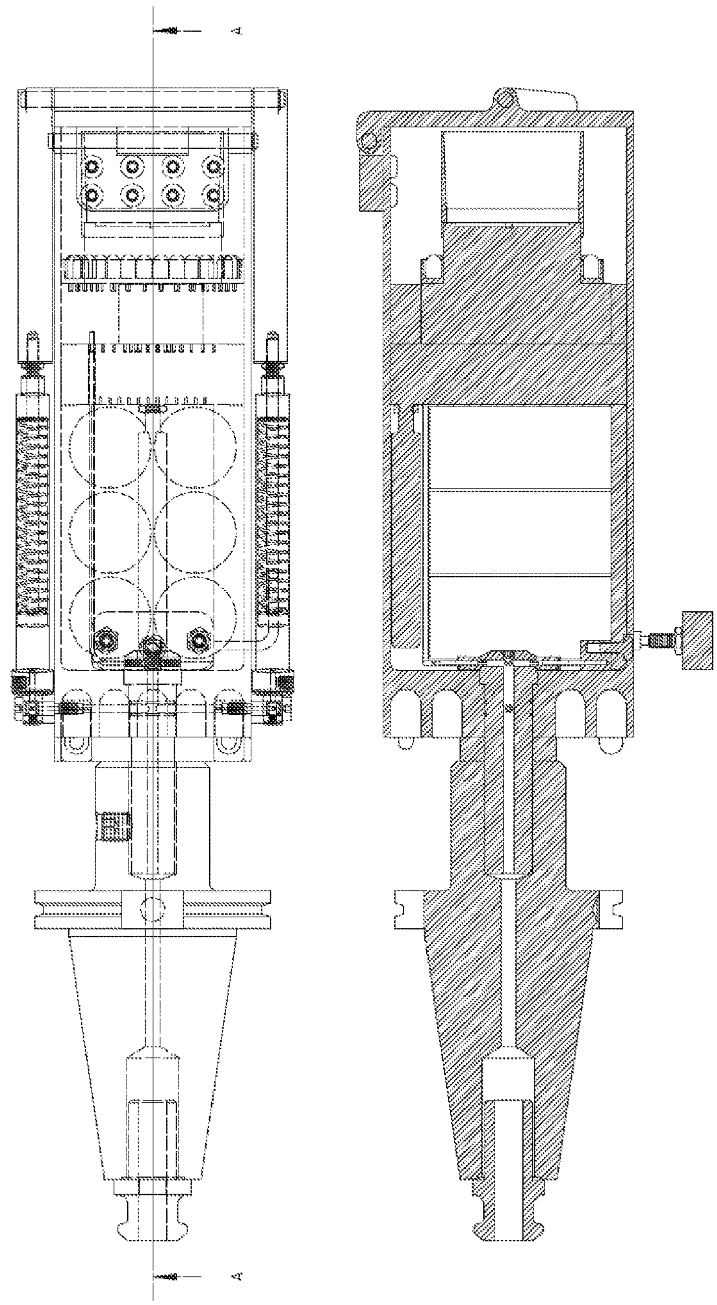
Figure 13:
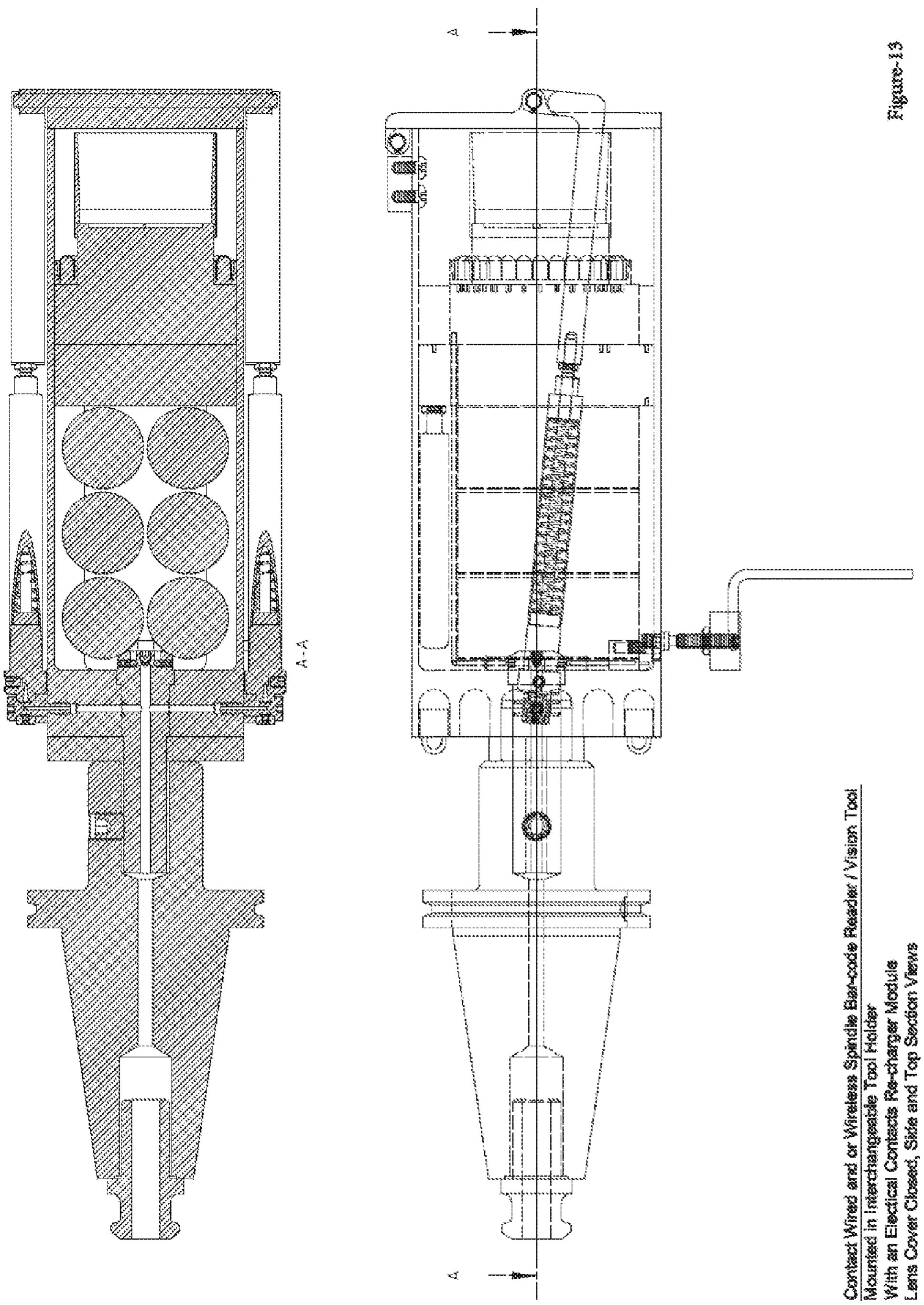

The camera system includes an enclosure 9.10 including a proximal end portion attached to the mounting stem 9.11.1 and a distal end portion including a camera opening (see e.g., FIG. 4 at 9.7). A camera module 9.20 is disposed within the distal end portion of the enclosure 9.10. In some embodiments, a light ring 9.20.1 is disposed around the camera module 9.20.

The mounting stem 9.11.1 includes an air passage (see e.g., Section A-A, FIG. 8) connectable to an air supply of the CNC machine when the tool holder 9.90 is attached to the spindle. In some embodiments, an air supply line 9.38 is connected between the mounting stem 9.11.1 and the camera module 9.20. The air supply line 9.38 supplies air from the CNC machine's air supply system to cool the camera module 9.20.

An enclosure cover 9.10.2 is pivotably mounted to the enclosure 9.10 proximate the camera opening and moveable between an open position (FIG. 2) wherein the camera opening is uncovered and a closed position (FIG. 1) wherein the camera opening is covered. The enclosure 9.10 and enclosure cover 9.10.2 protect the camera module 9.20 and other components (e.g., sensors) from cutting fluid and other debris associated with machining a work piece. One or more (e.g., a pair) pneumatic cylinders 9.24 are connected to the air passages and extend between the enclosure 9.10 and the enclosure cover 9.10.2 to move the enclosure cover 9.10.2 between the open position and the closed position. In some embodiments, an air switch 9.16 is interconnected between the one or more air passages and the one or more pneumatic cylinders 9.24 and is operative to selectively control an air flow to the one or more pneumatic cylinders 9.24. Although the embodiments are described herein with respect to pneumatic cylinders 9.24, other suitable actuators can be used.

In some embodiments, the camera system includes one or more additional sensors, such as a laser bar code reader 9.99 disposed within the distal portion of the enclosure 9.10 adjacent the camera opening. In some embodiments, the camera system also includes a plurality of batteries 9.50 disposed in the enclosure 9.10 and connected to the camera module 9.20, light ring 9.20.1, and/or additional sensors, such as laser bar code reader 9.99.

Figure 15:
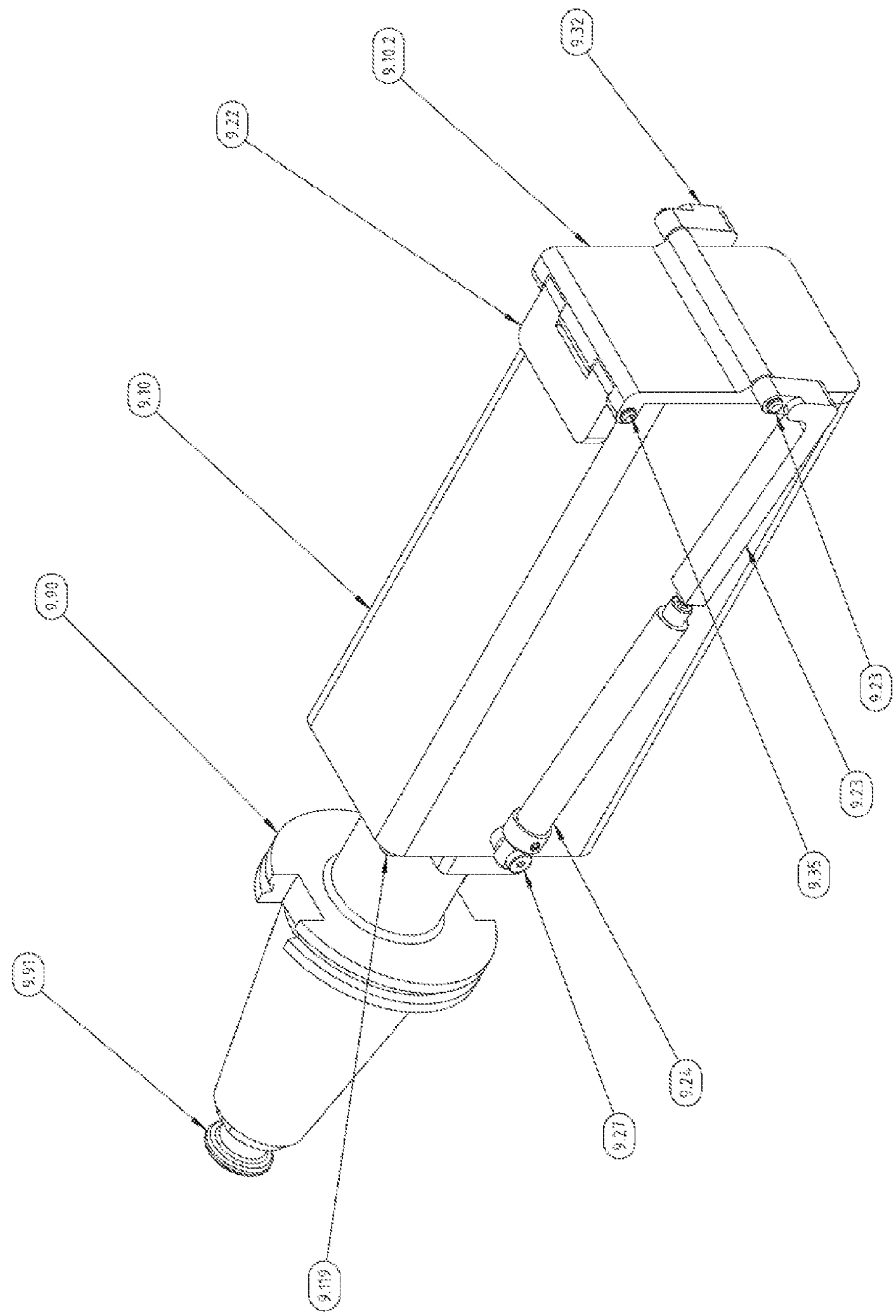

FIG. 15 shows the spindle mountable camera inspection/metrology system being configured as having multiple sensor data acquisition systems for the data acquisition/inspection of multiple features and/or variables of the work piece while it is located in the machining position of the machine tool.

Figure 16:
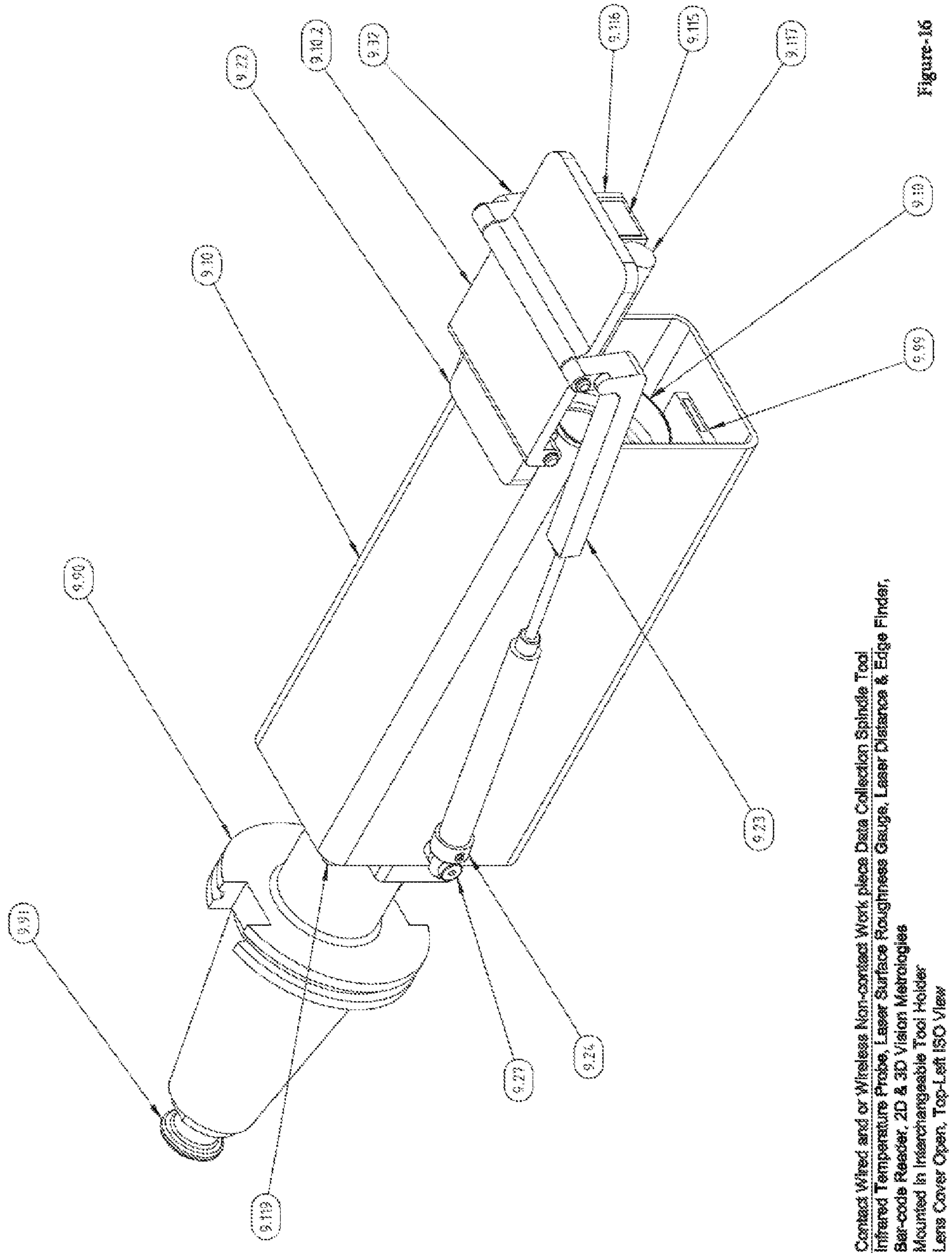

FIG. 16 shows the spindle mountable camera inspection/metrology system of FIG. 15 having the enclosure's actuated door in its open position for the multiple data acquisition sensors to inspect the workpiece as required for the work piece's surface inspection and analysis via a standard laser surface metrology sensor as shown by device 9.115 or surface finish gauge or equivalent having an air blow-off knife as shown by device 9.1164 optionally drying/cleaning the area of the work piece surface prior to its inspection, a standard work piece noncontact infrared temperature sensor as shown by device 9.117 or by a work piece contacting thermocouple probe or equivalent, a standard laser bar code reader as required for high resolution near field data acquisition and/or long-distance data acquisition of FIG. 15.

Figure 17:
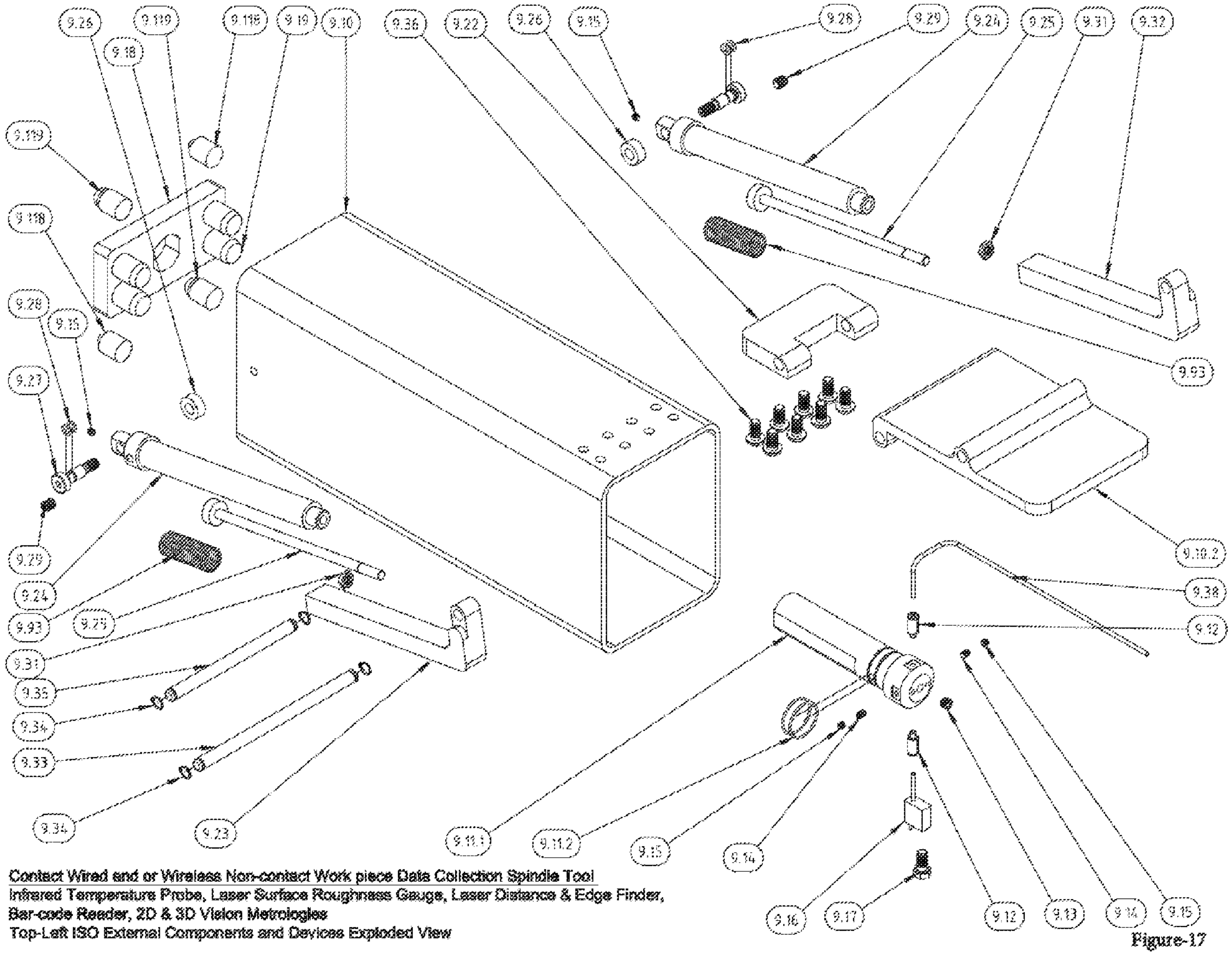

FIG. 17 shows the exploded view of the external components and devices for the spindle mountable camera multiple sensor data acquisition/inspection system of FIG. 15.

Figure 18:
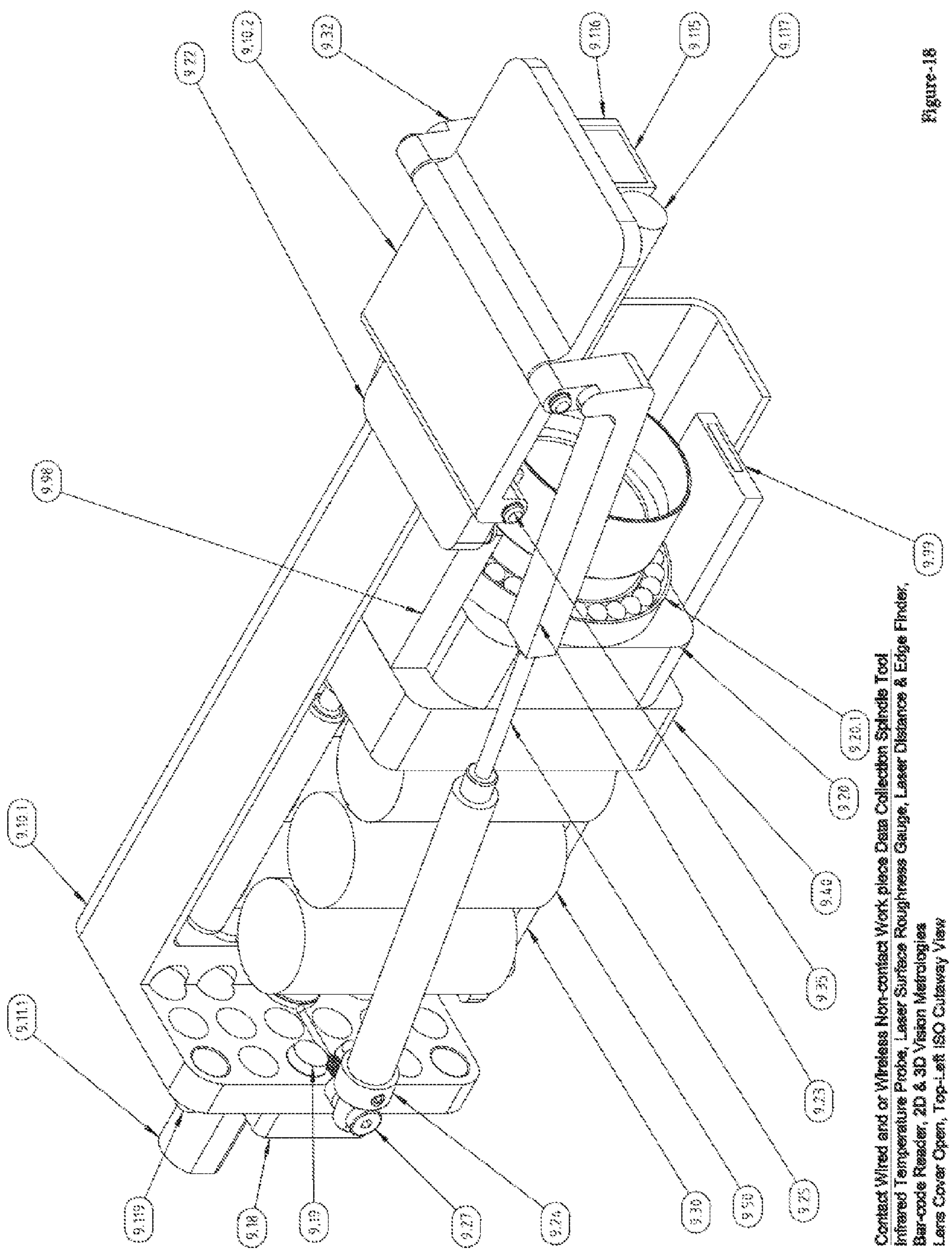

FIG. 18 shows the enclosure 9.10.1 cutaway view of the external components and devices for the spindle mountable camera multiple sensor data acquisition/inspection system of FIG. 15.

Figure 19:
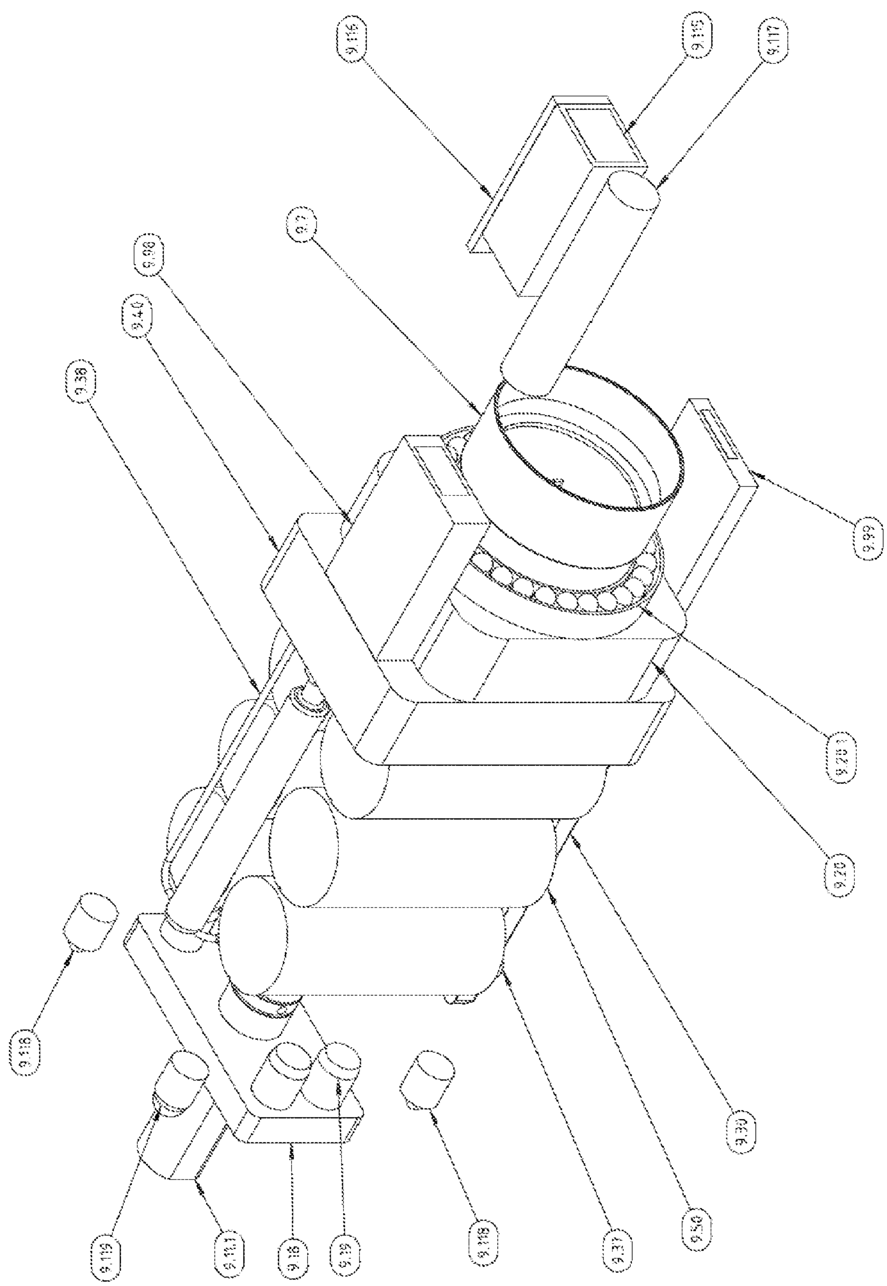

FIG. 19 shows the assembled view internal modules and devices for the spindle mountable camera multiple sensor data acquisition/inspection system of FIG. 15 with the addition of a laser projection and inspection module 9.98 for calculating distances and various metrology measurements of the work piece.

Figure 20:
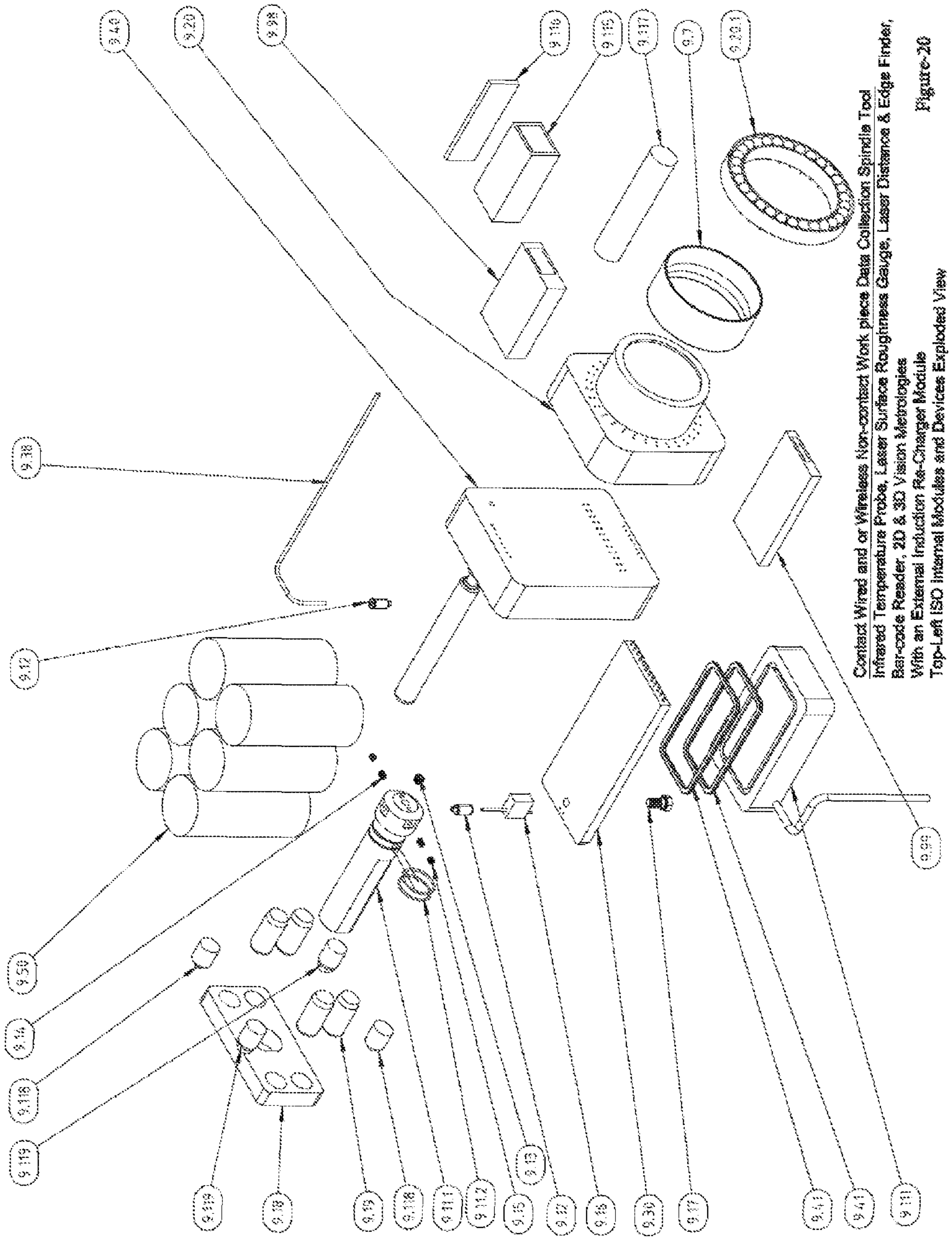

FIG. 20 shows the exploded view of the internal modules and devices for the spindle mountable camera multiple sensor data acquisition/inspection system of FIG. 15.

Figure 21:
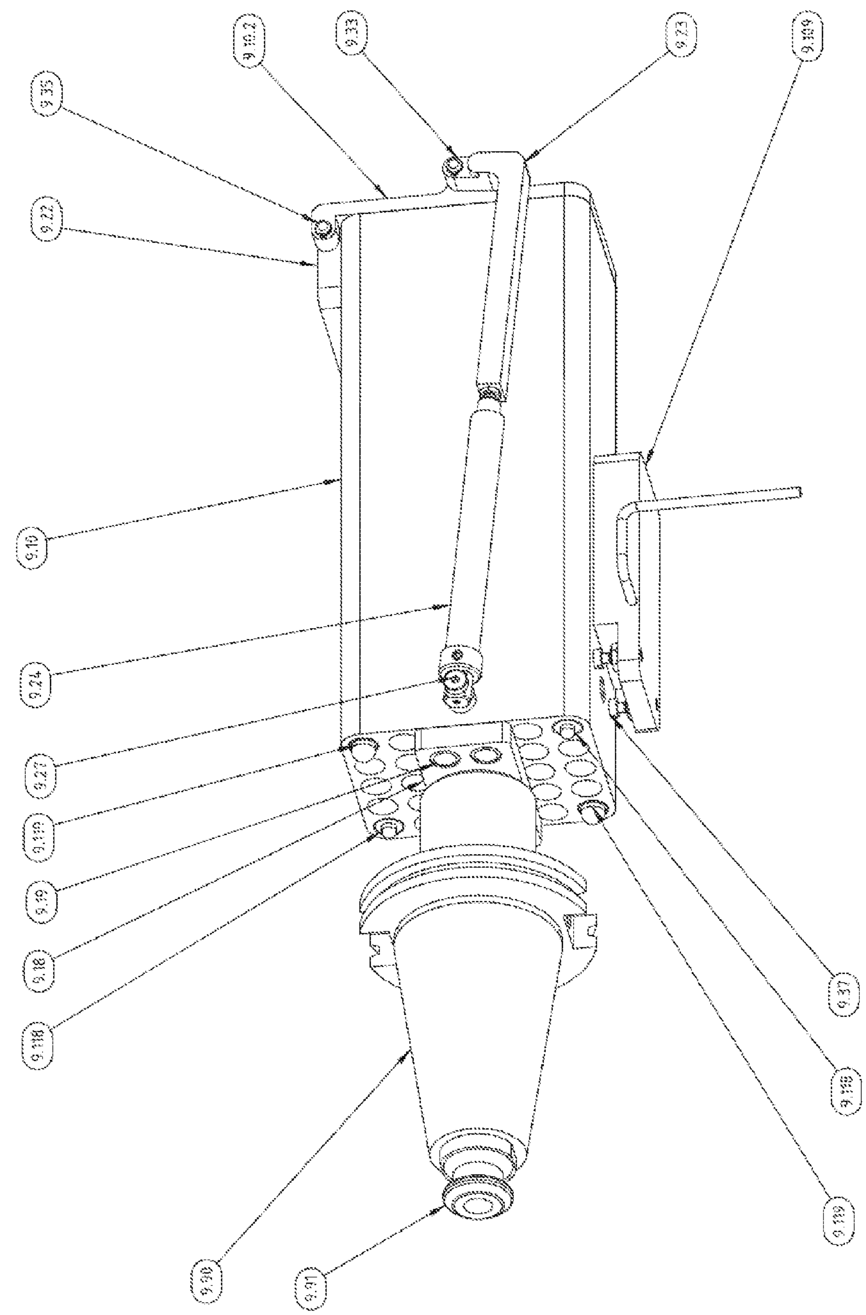

FIG. 21 shows the multiple interfaces for the spindle mountable camera multiple sensor data acquisition/inspection system to the machine tool for system's acquisition/inspection data and/or its programming via IR emitters 9.118 and IR receivers 9.119 and/or contact probes 9.37, or the internal wireless antenna, with internal batteries' recharging via contact probes 9.37 and/or the induction coil 9.109.

Figure 22:
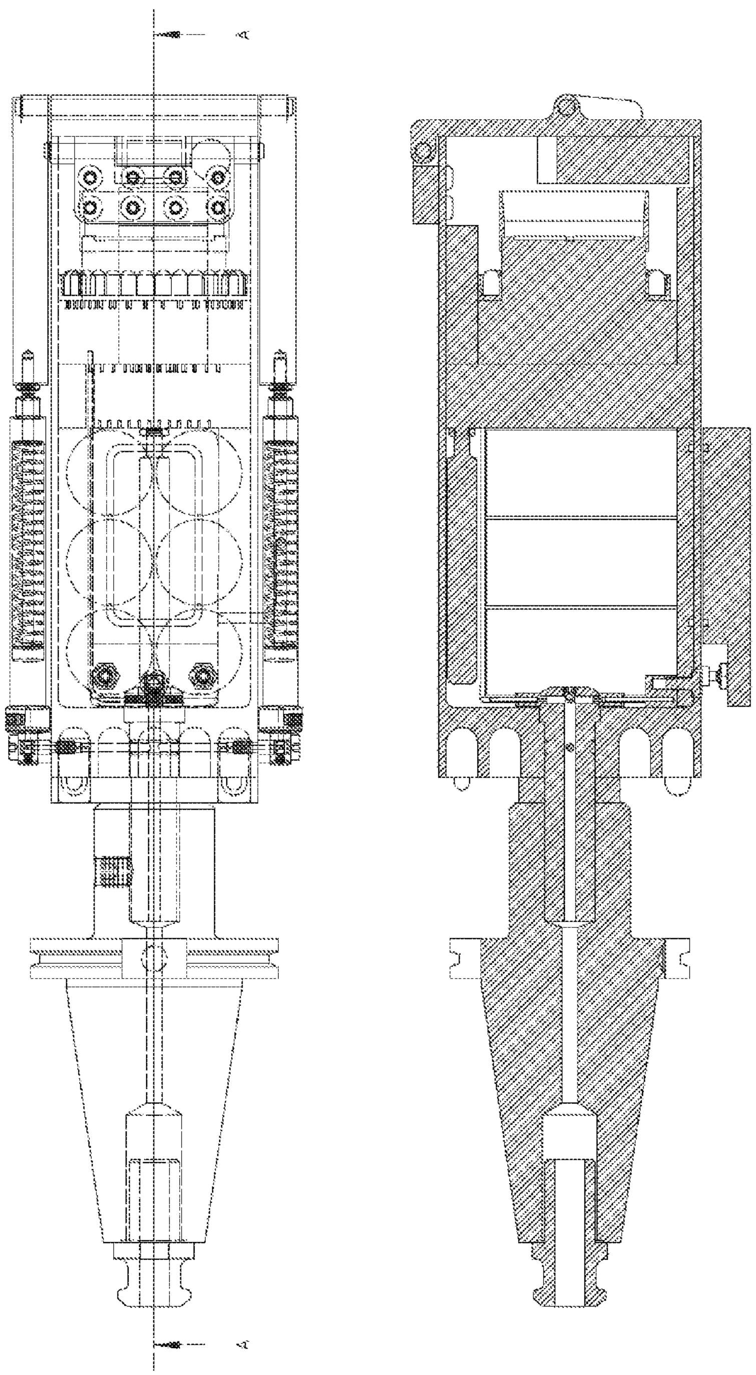
Figure 23:
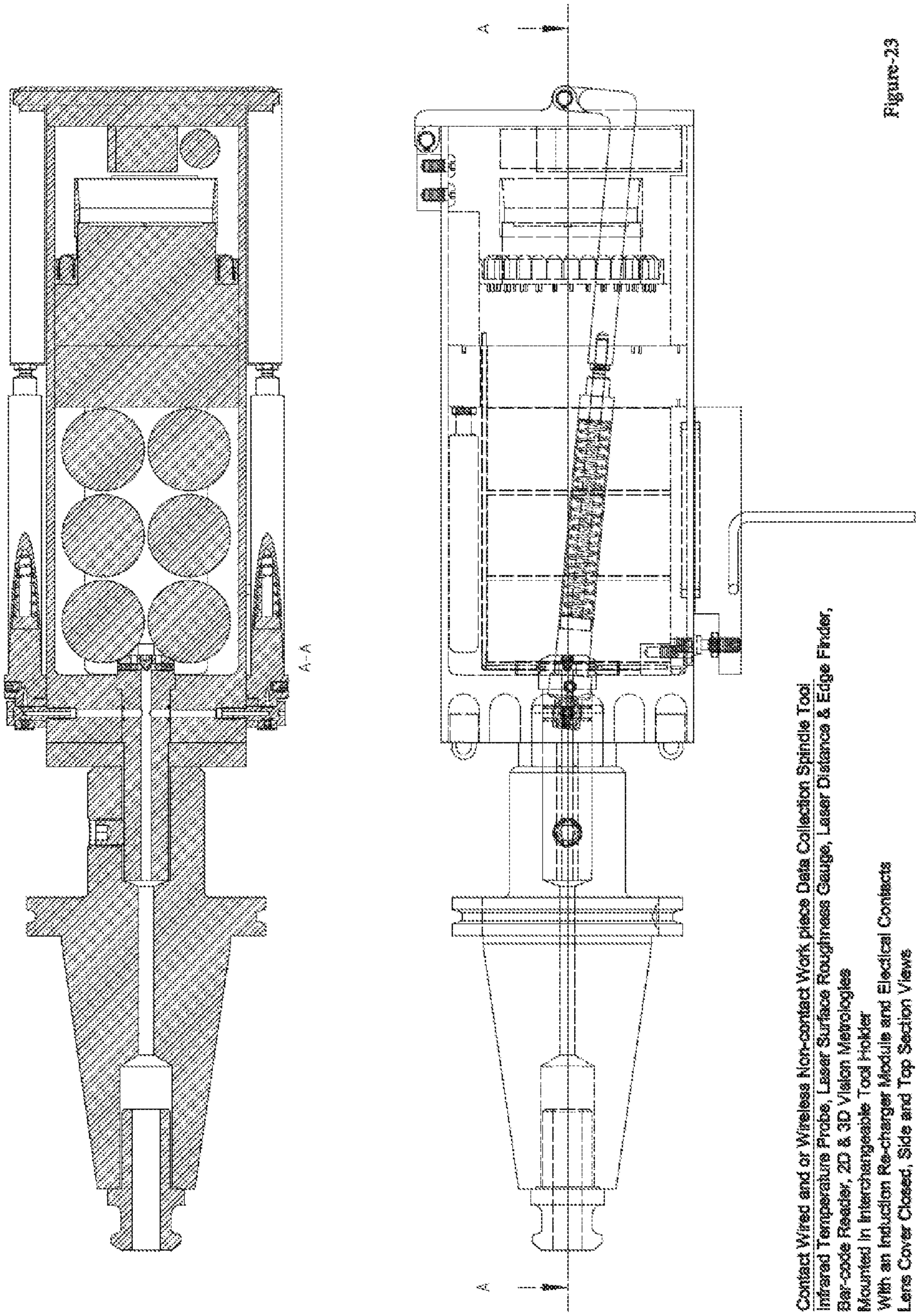

FIG. 22 and FIG. 23 shows the hidden and cutaway views for the internal modules and devices for the spindle mountable camera multiple sensor data acquisition/inspection system of FIG. 15 having the combination induction and/or contact recharging module 9.109.

Figure 24:
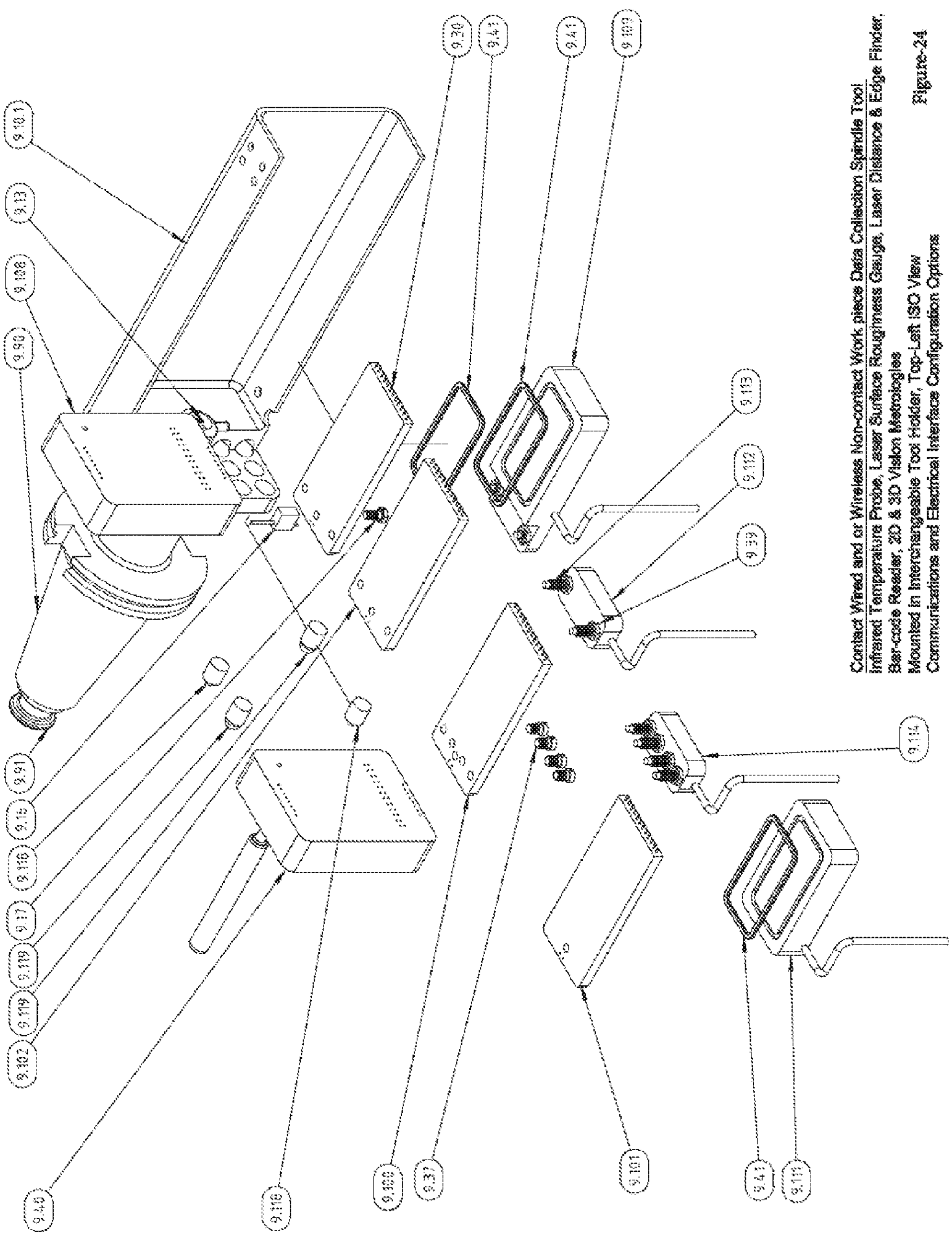

FIG. 24 shows the exploded and cutaway views for the internal modules and devices for the spindle mountable camera multiple sensor data acquisition/inspection system of FIG. 15 having multiple internal battery recharging means via electrical induction power transmission utilizing the emitter induction coil 9.41 to transmit power to the system's corresponding receiving induction coil 9.41 that is operably connected to the non-contact induction interconnection charging control module 9.101, or direct contact charging via the contact probes 9.113 of module 9.114 that is utilized for both battery charging and communications as required that is to transmit power to the system's corresponding 4 contact interconnection charging control module 9.100, or direct contact charging via the contact probes module 9.112 that is utilized for both battery charging that is to transmit power to the system's corresponding 2 contact probes 9.113 to transmit power to the system's interconnection charging control module 9.102, or the combination induction and/or contact recharging module 9.109.

Figure 25:
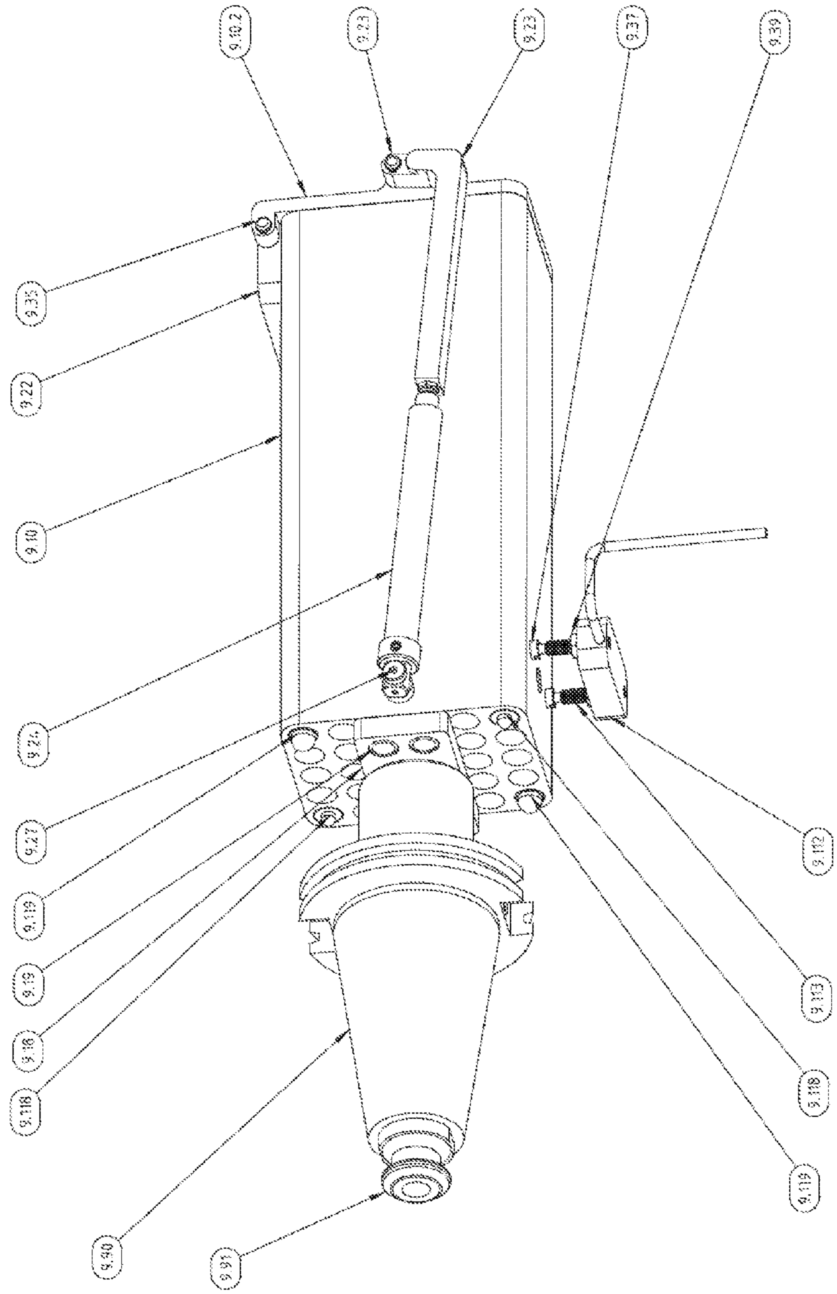

FIG. 25 shows the multiple interfaces for the spindle mountable camera multiple sensor data acquisition/inspection system to the machine tool for system's acquisition/inspection data and/or its programming via IR emitters 9.118 and IR receivers 9.119 and/or contact probes 9.37, or the internal wireless antenna, with internal batteries' recharging via contact probes 9.37 electrical contact module 9.112.

Figure 26:
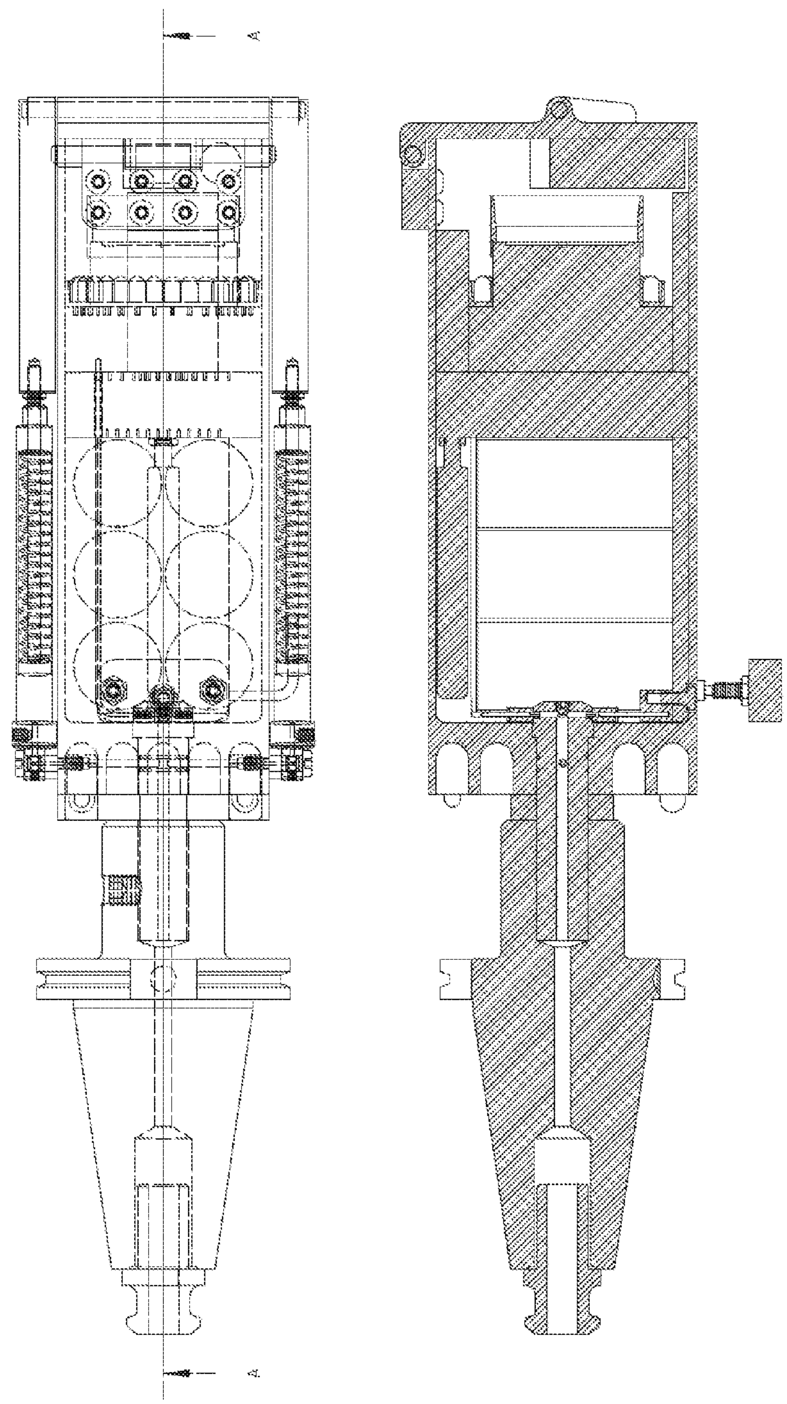
Figure 27:
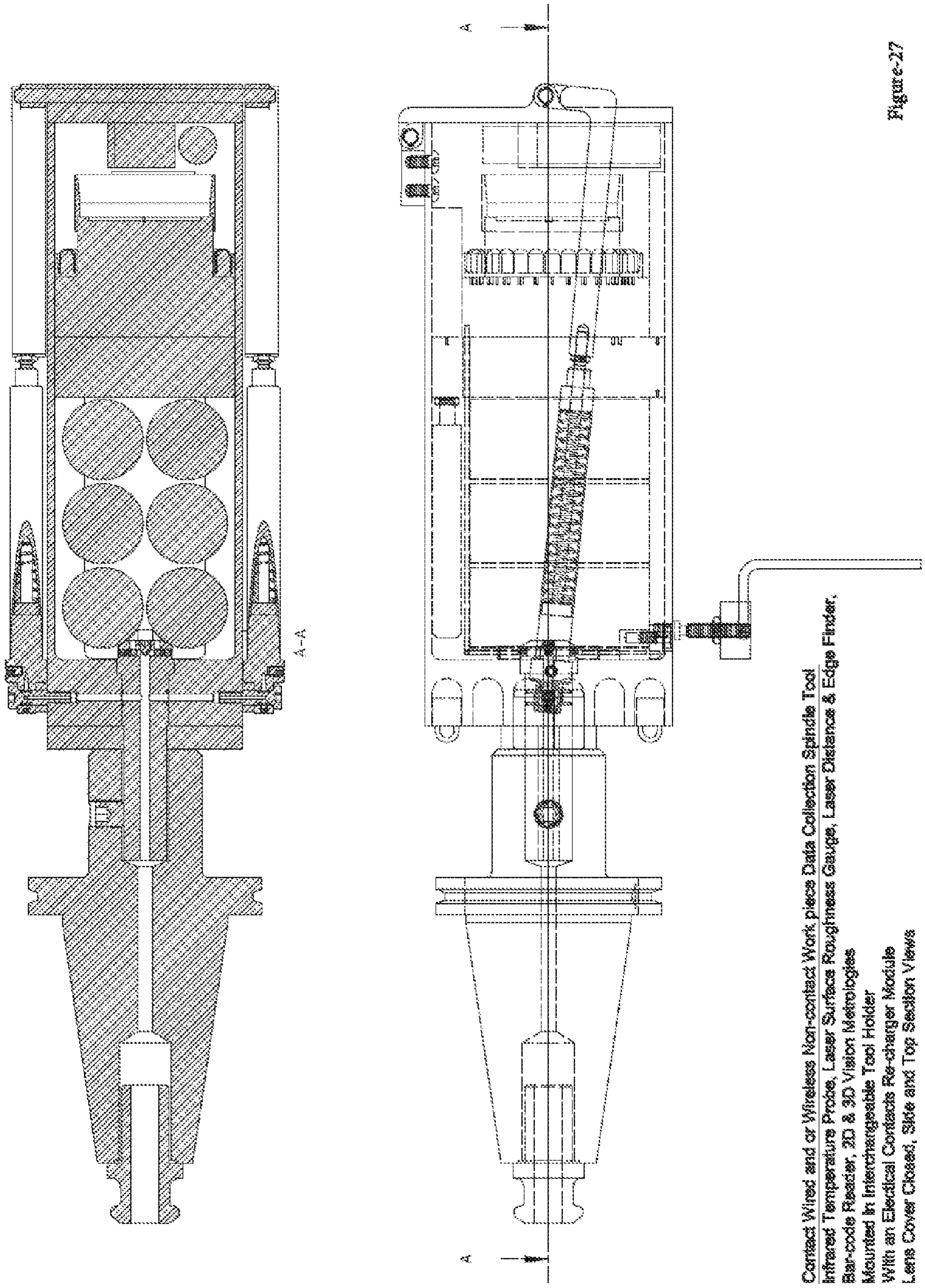
Figure 29:
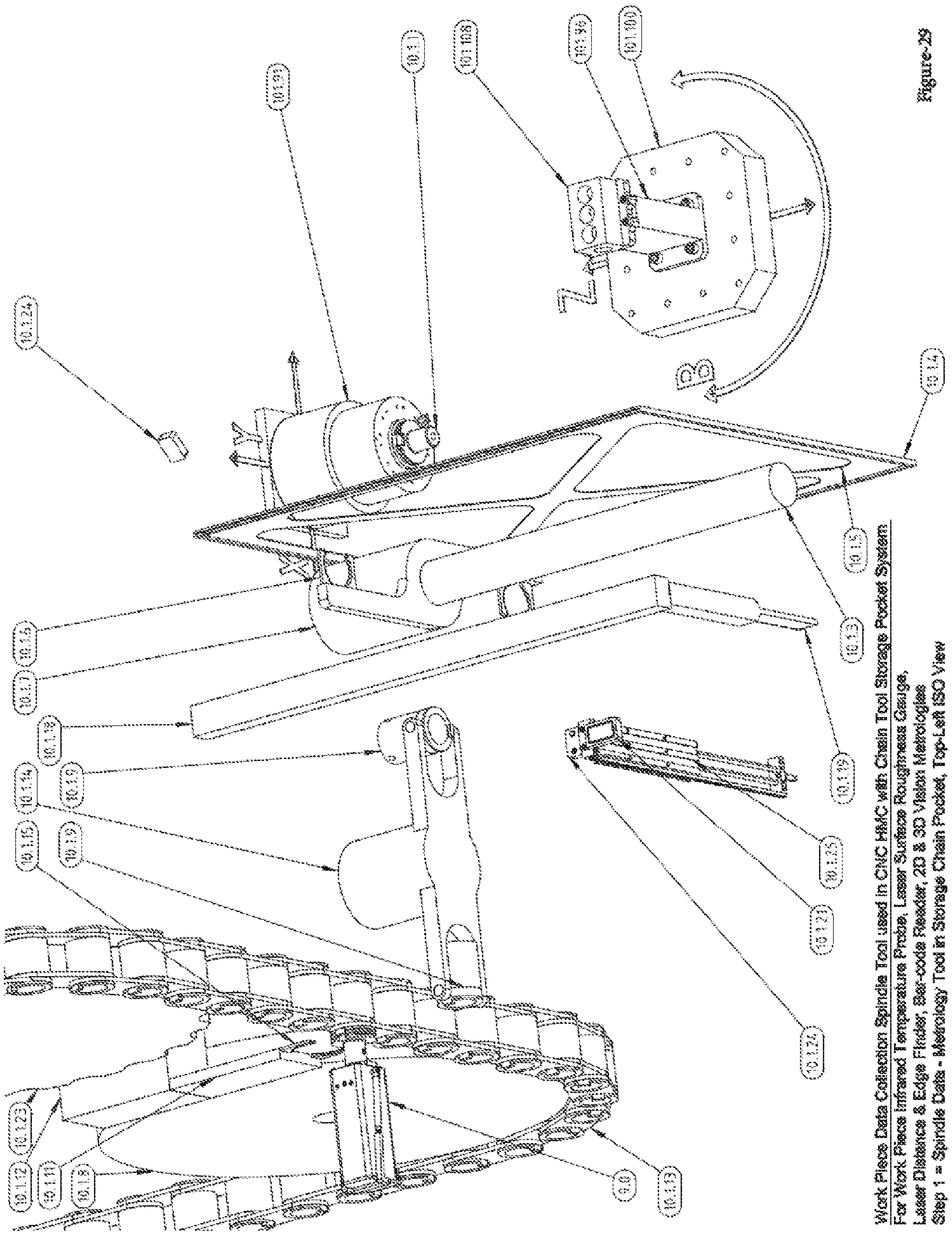
Figure 30:
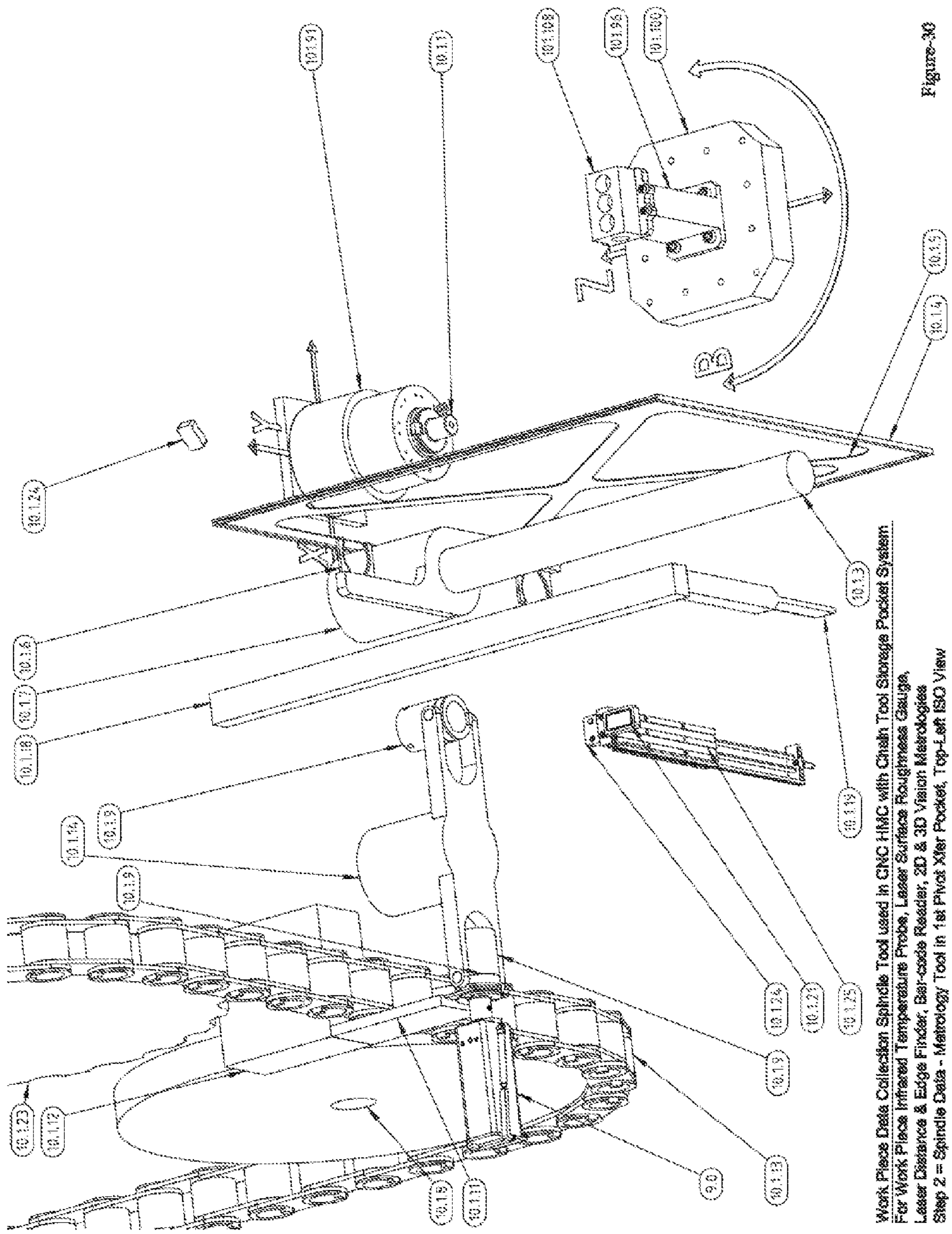
Figure 31:
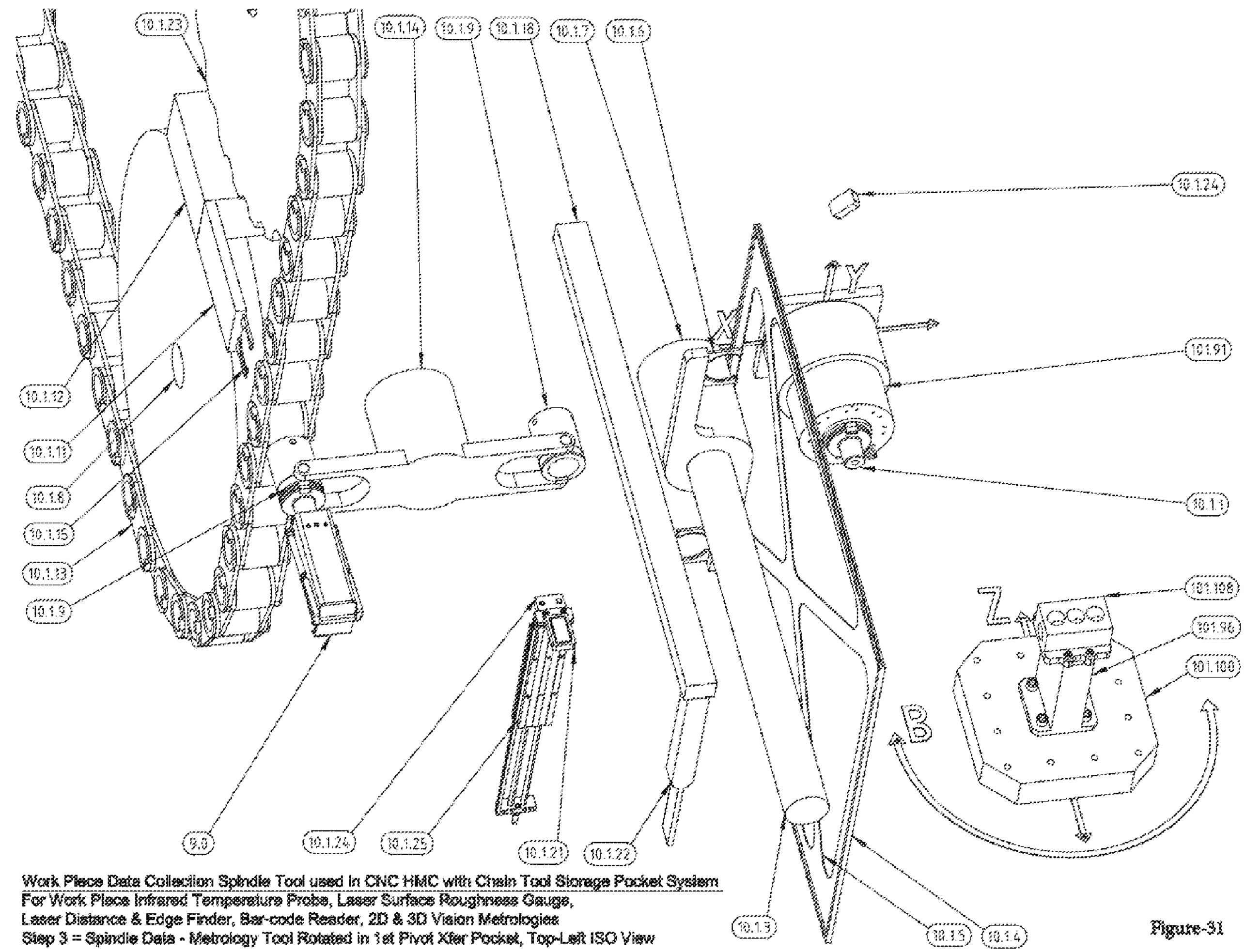
Figure 32:
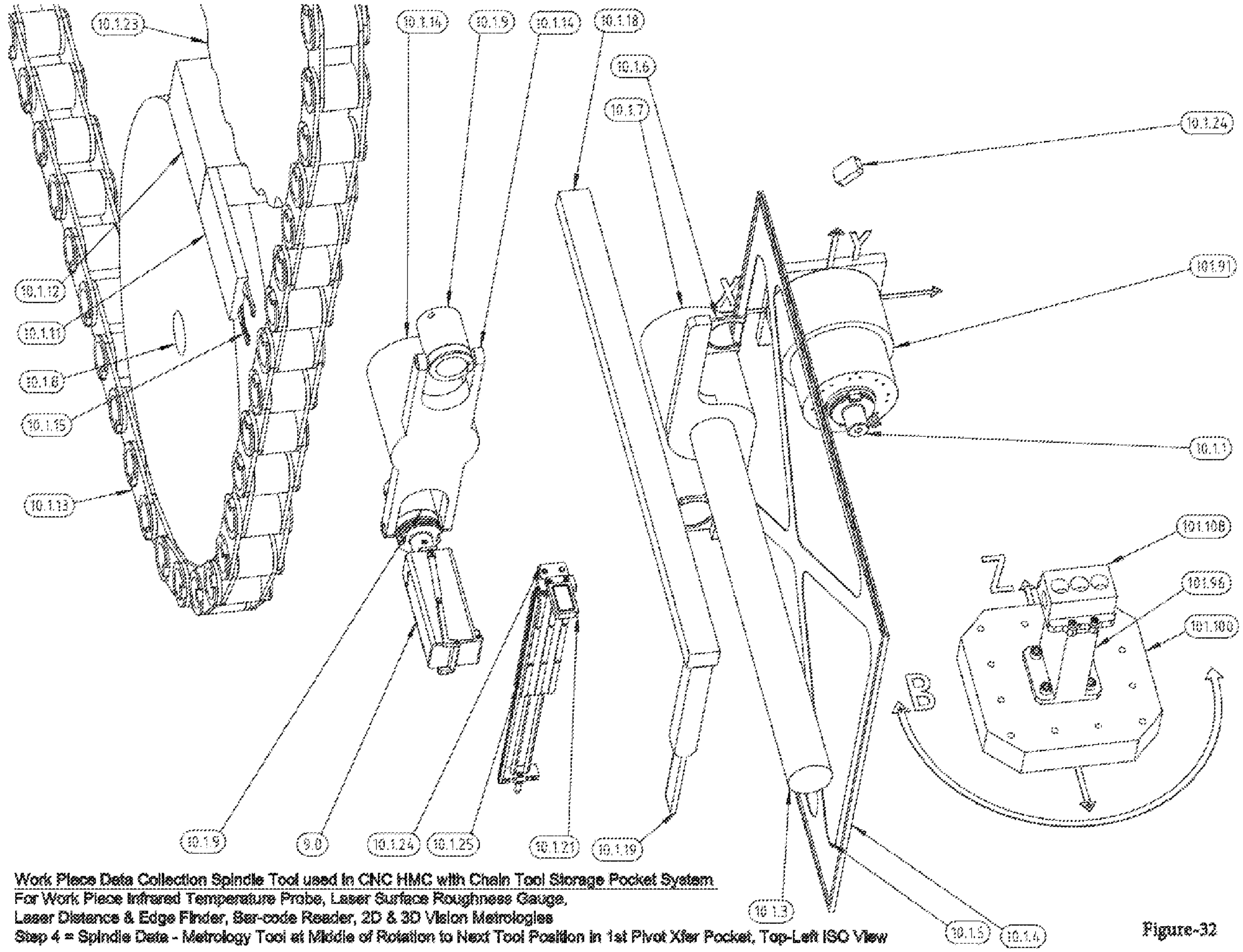
Figure 33:
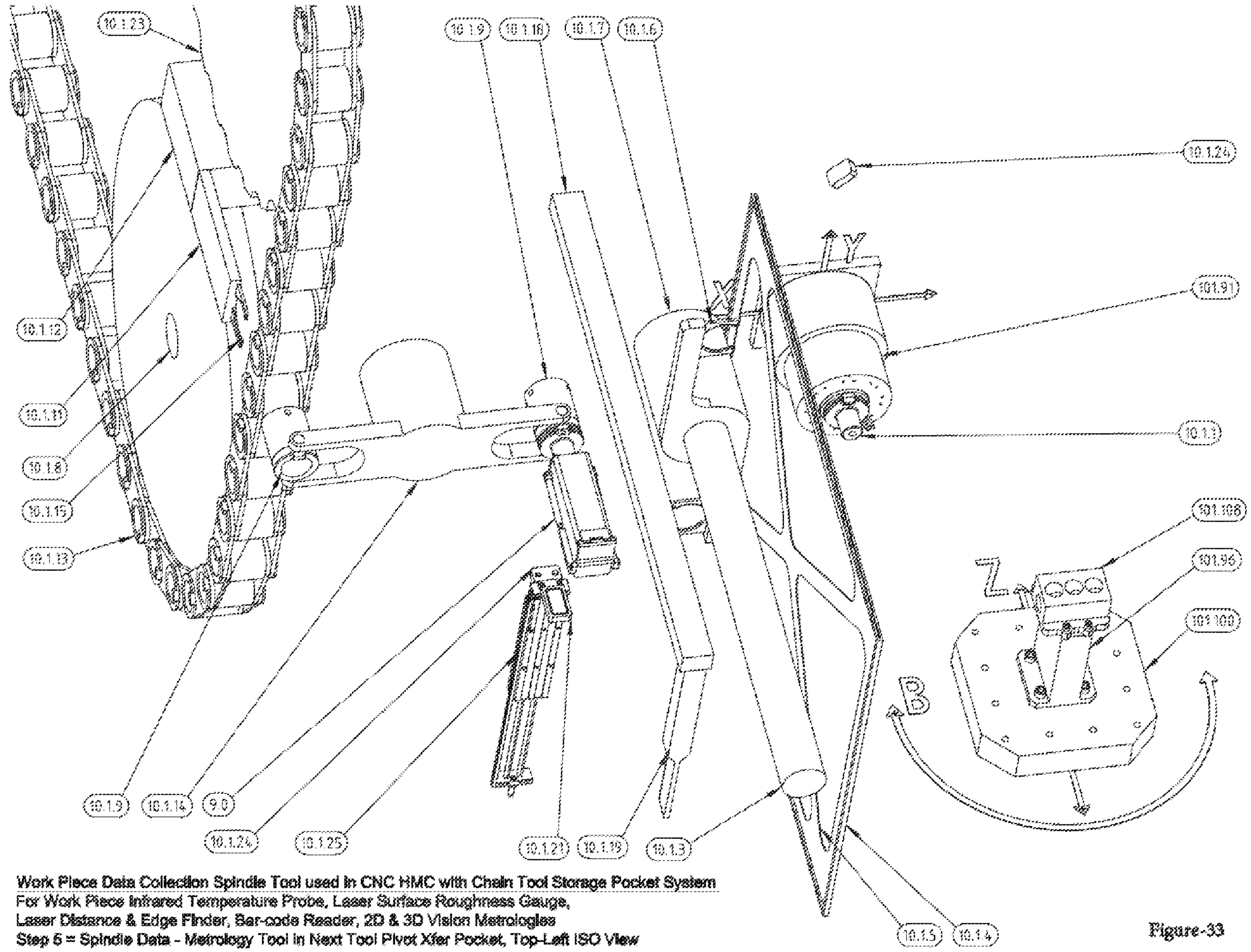
Figure 34:
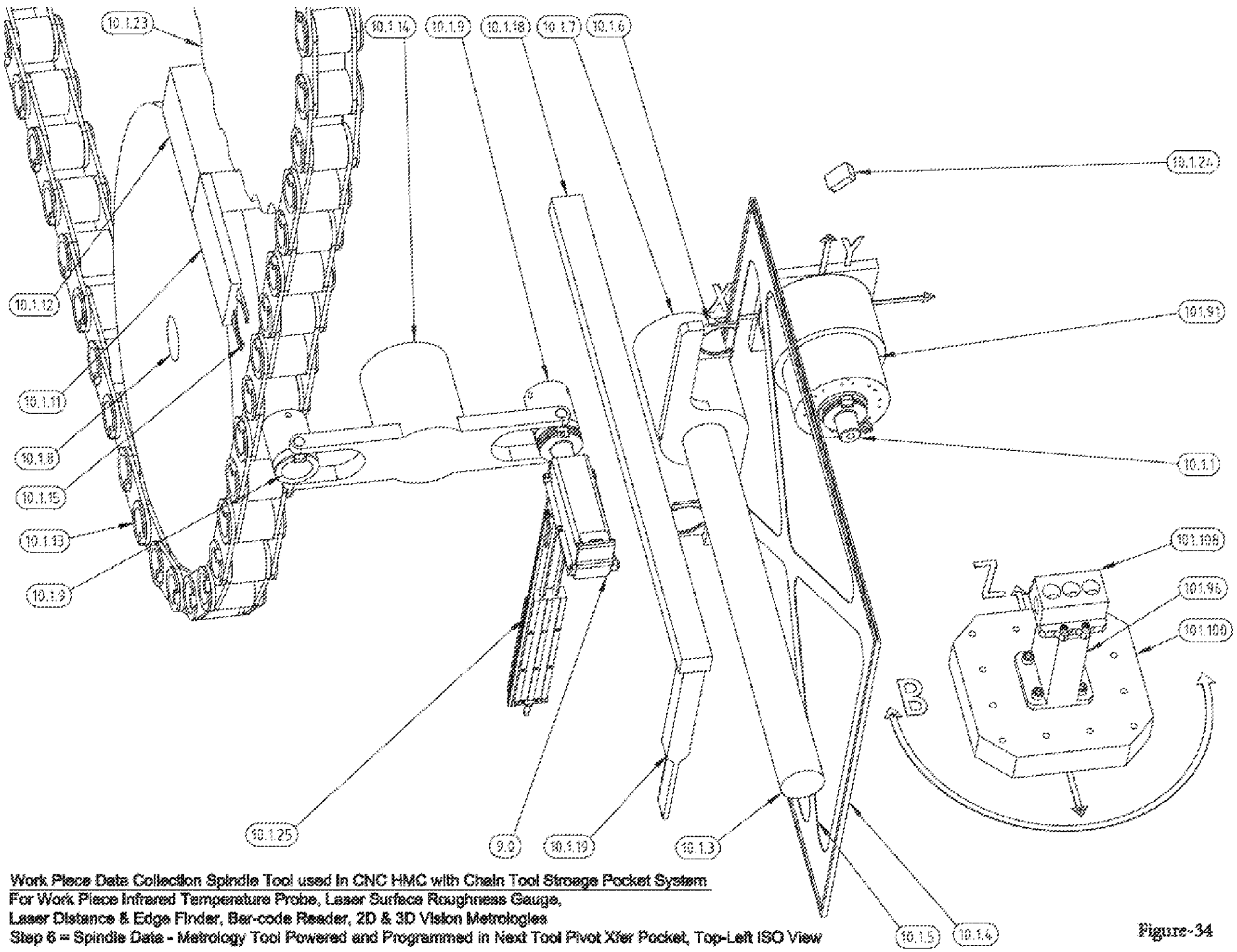
Figure 35:
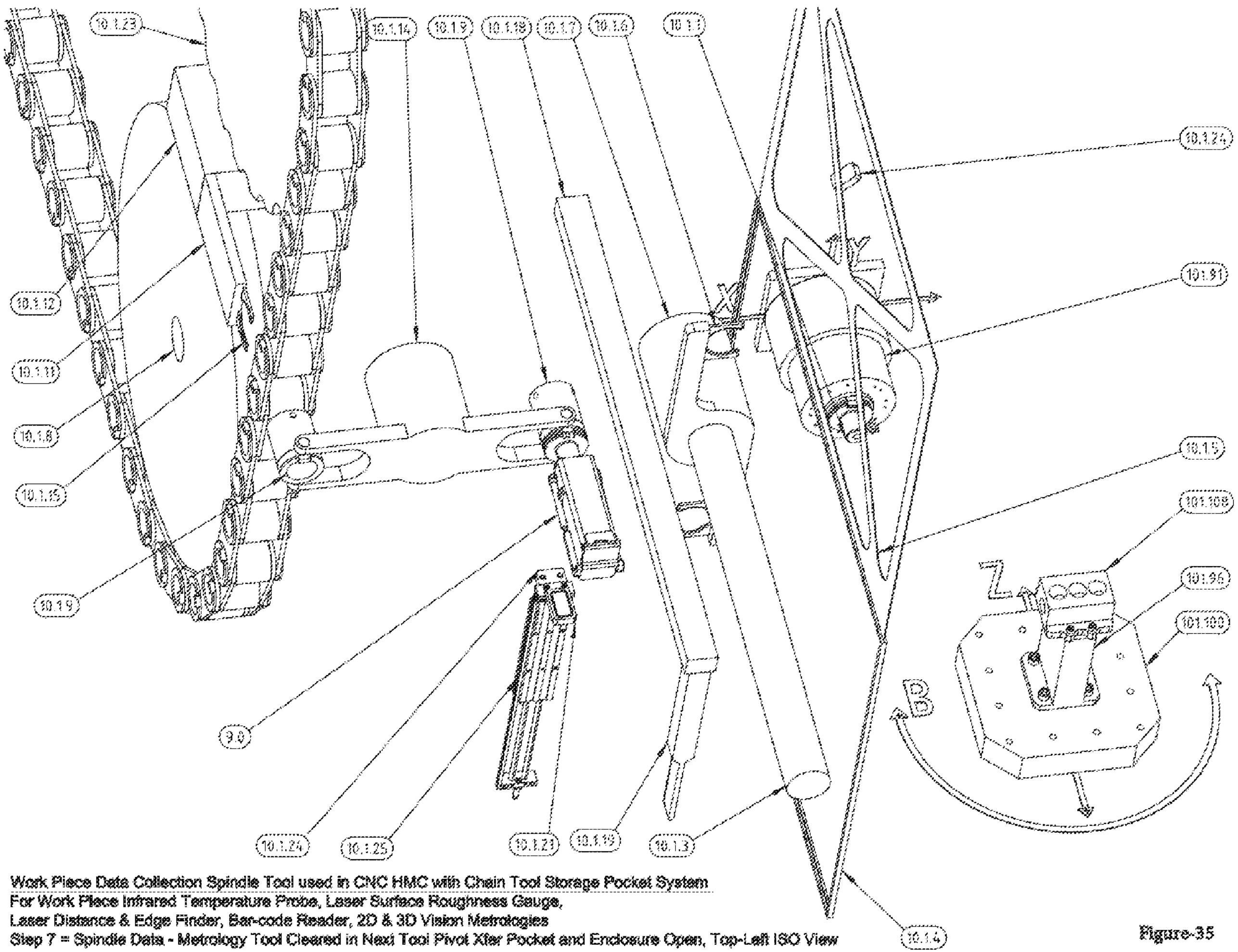
Figure 36:
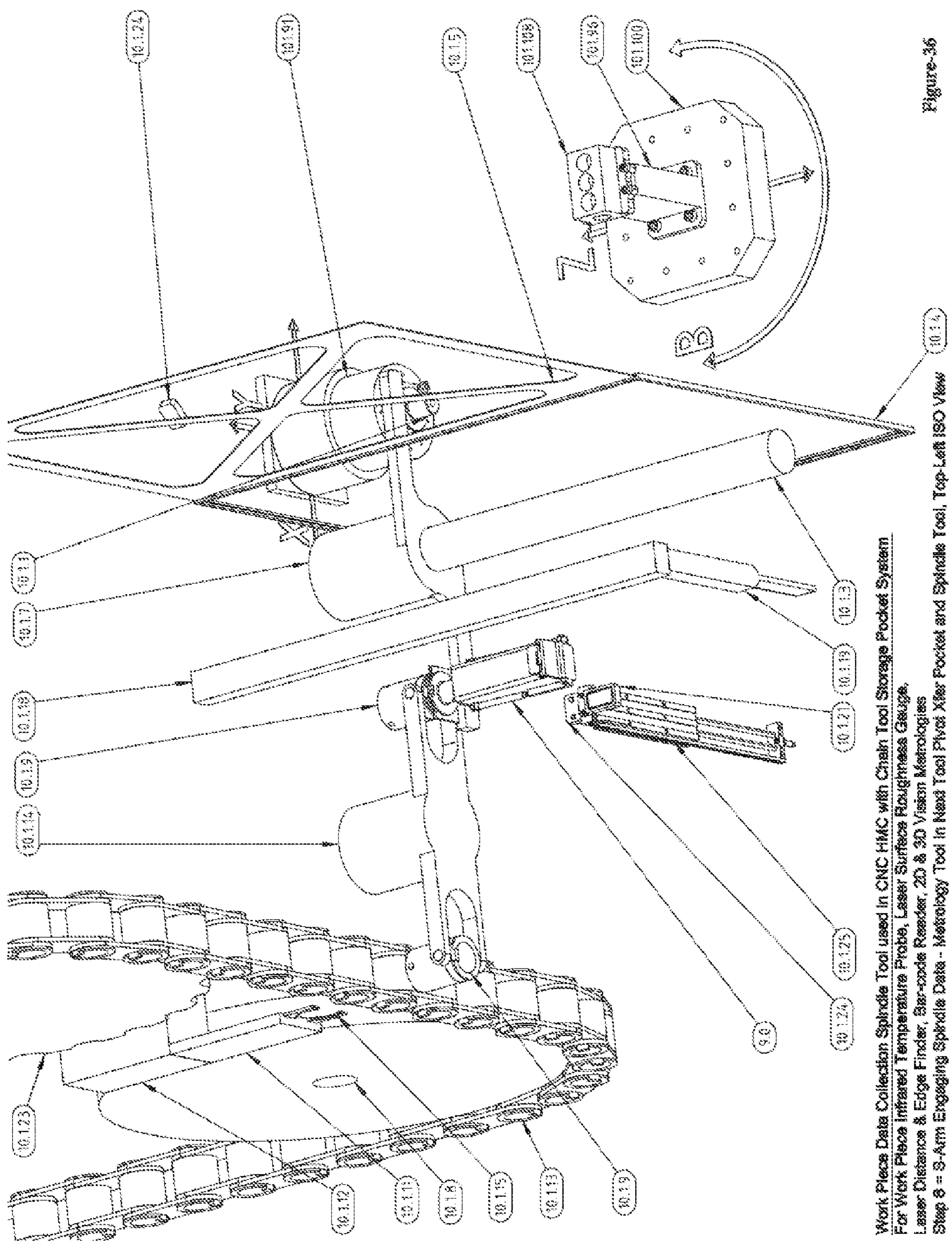
Figure 37:
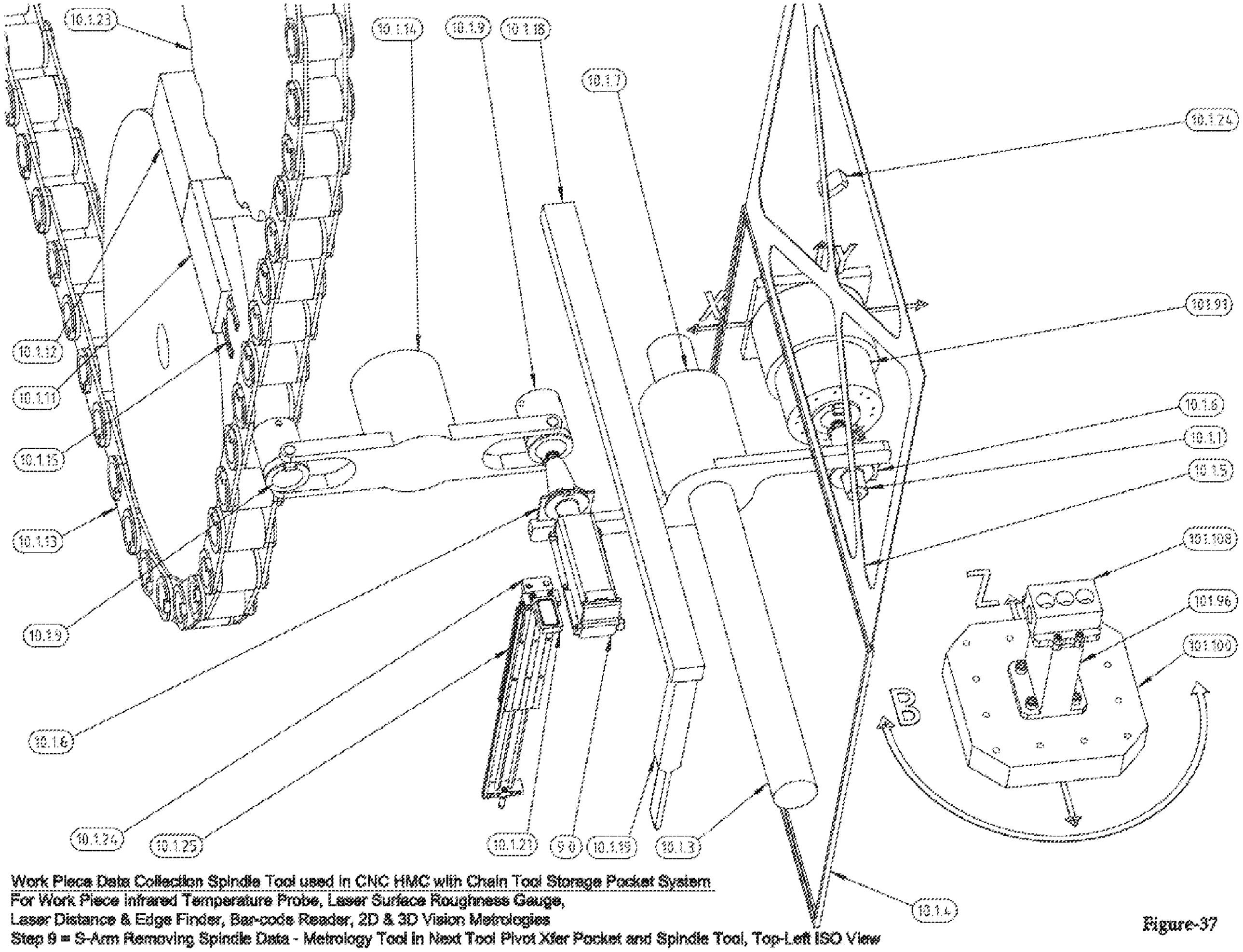
Figure 39:
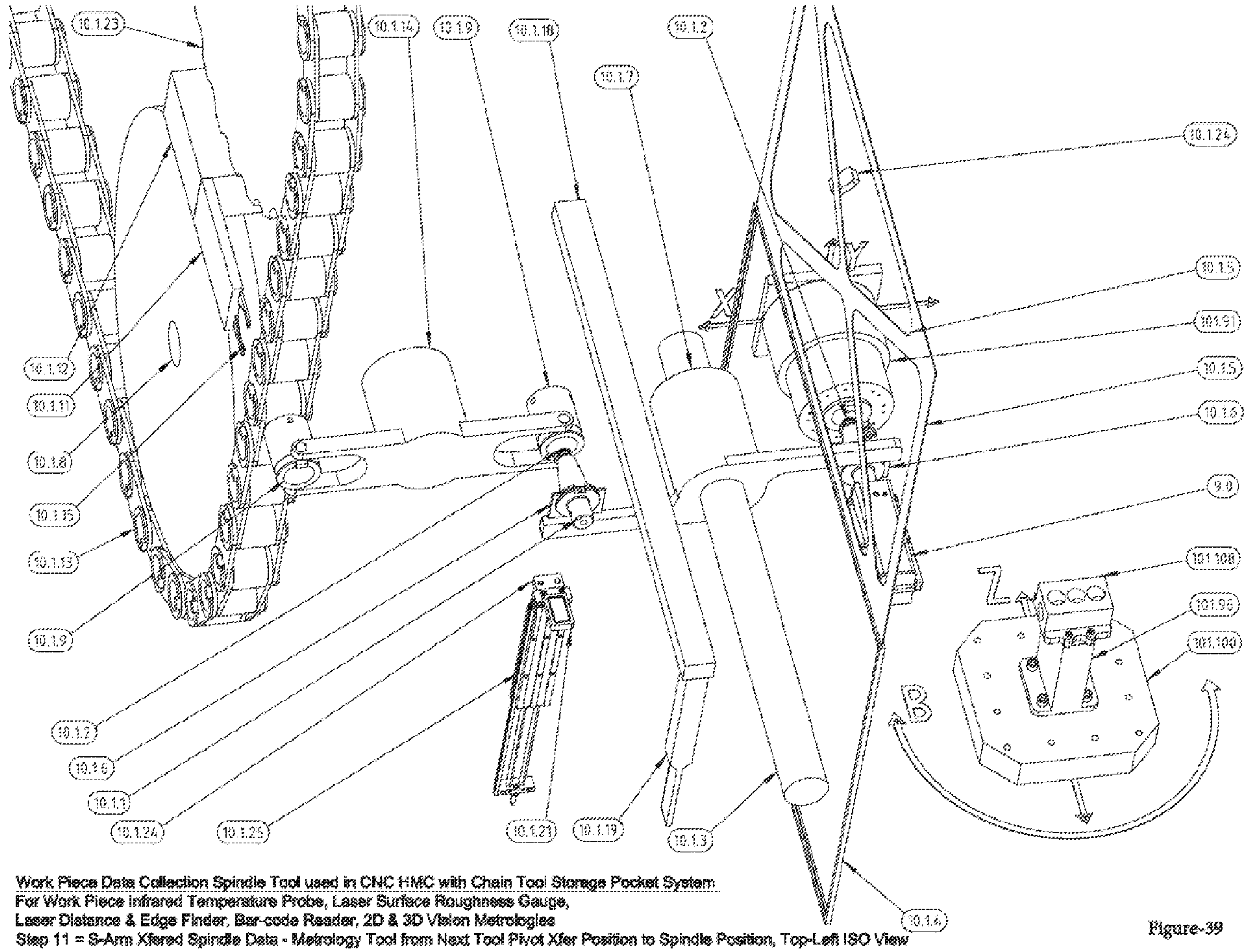
Figure 44:
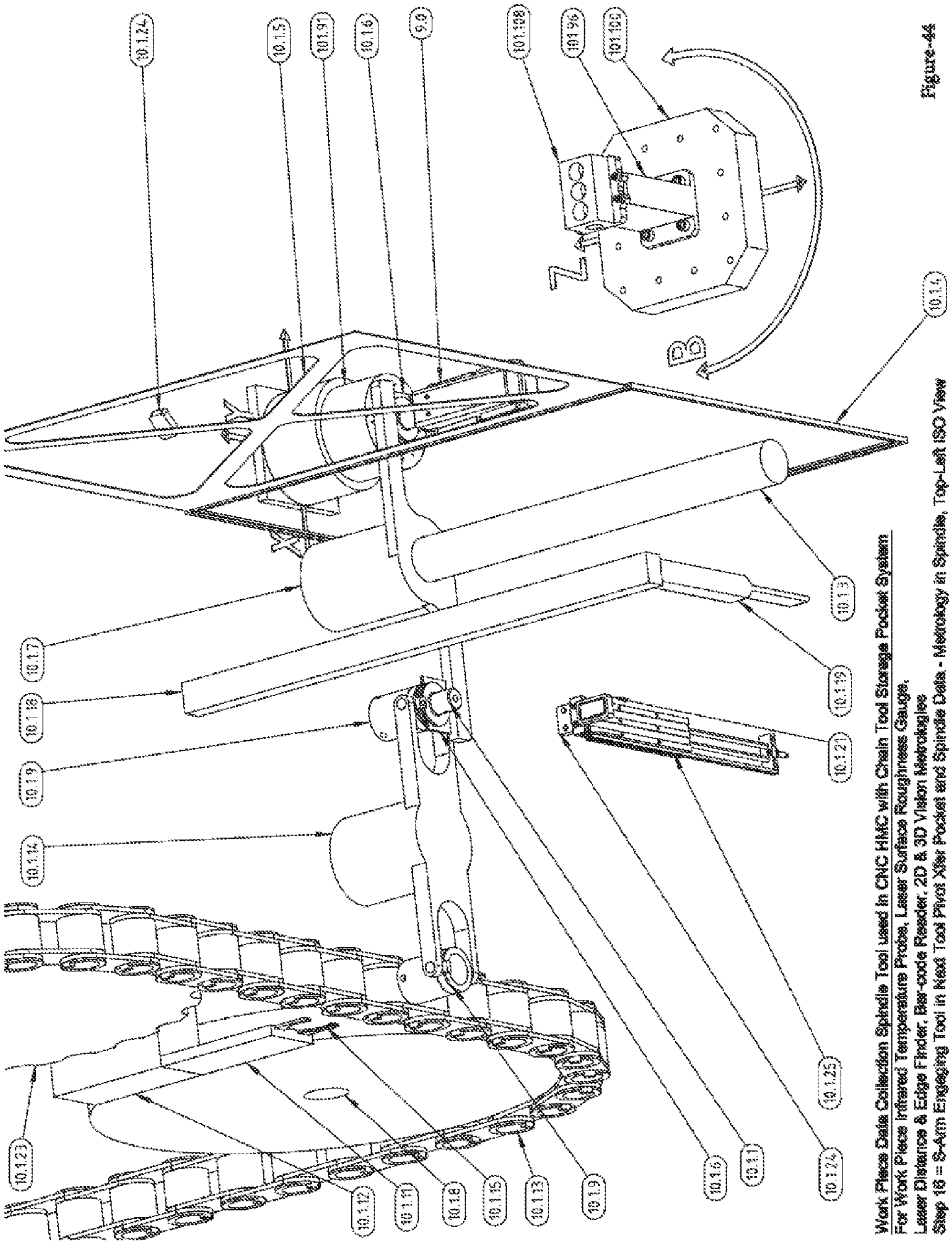
Figure 45:
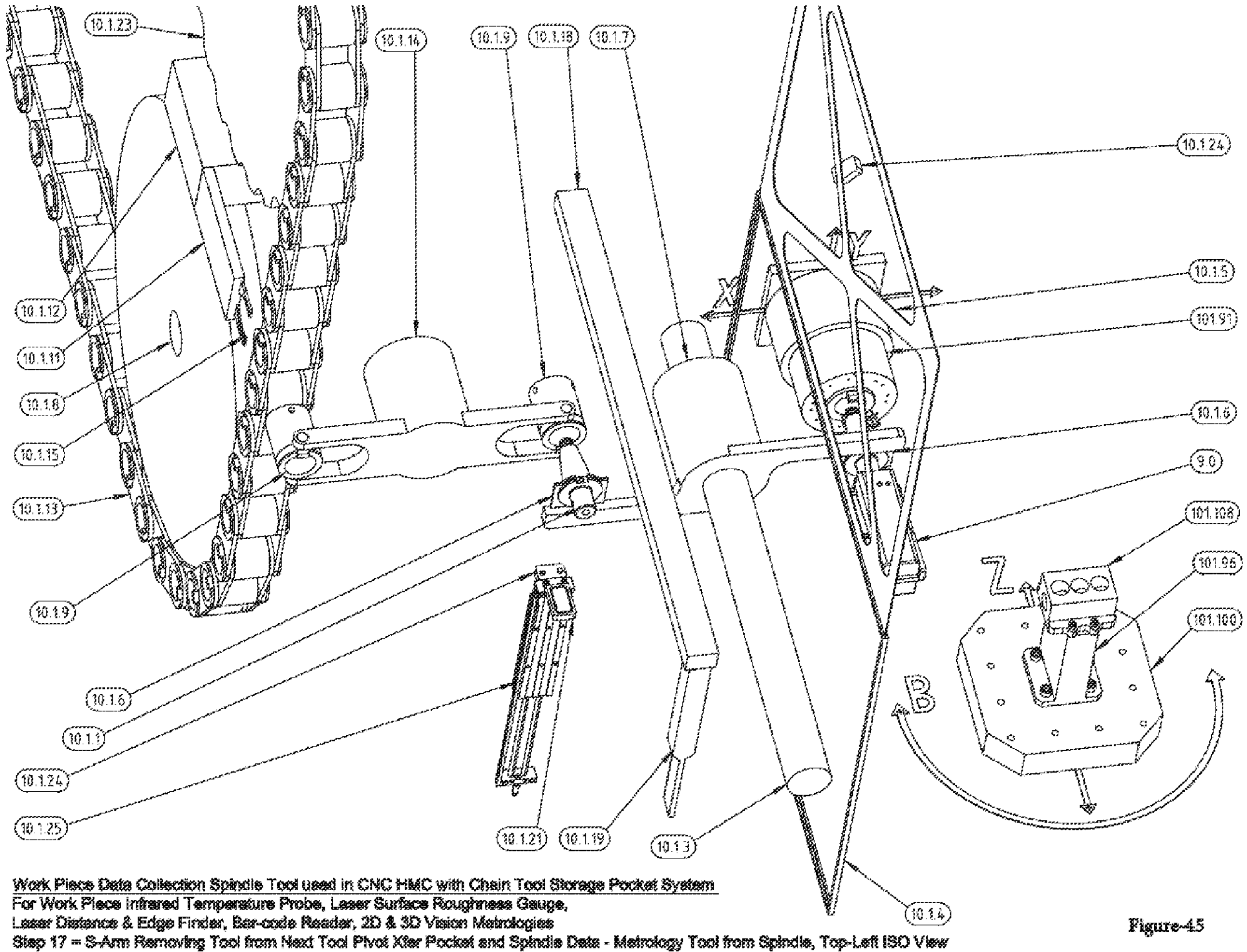
Figure 49:
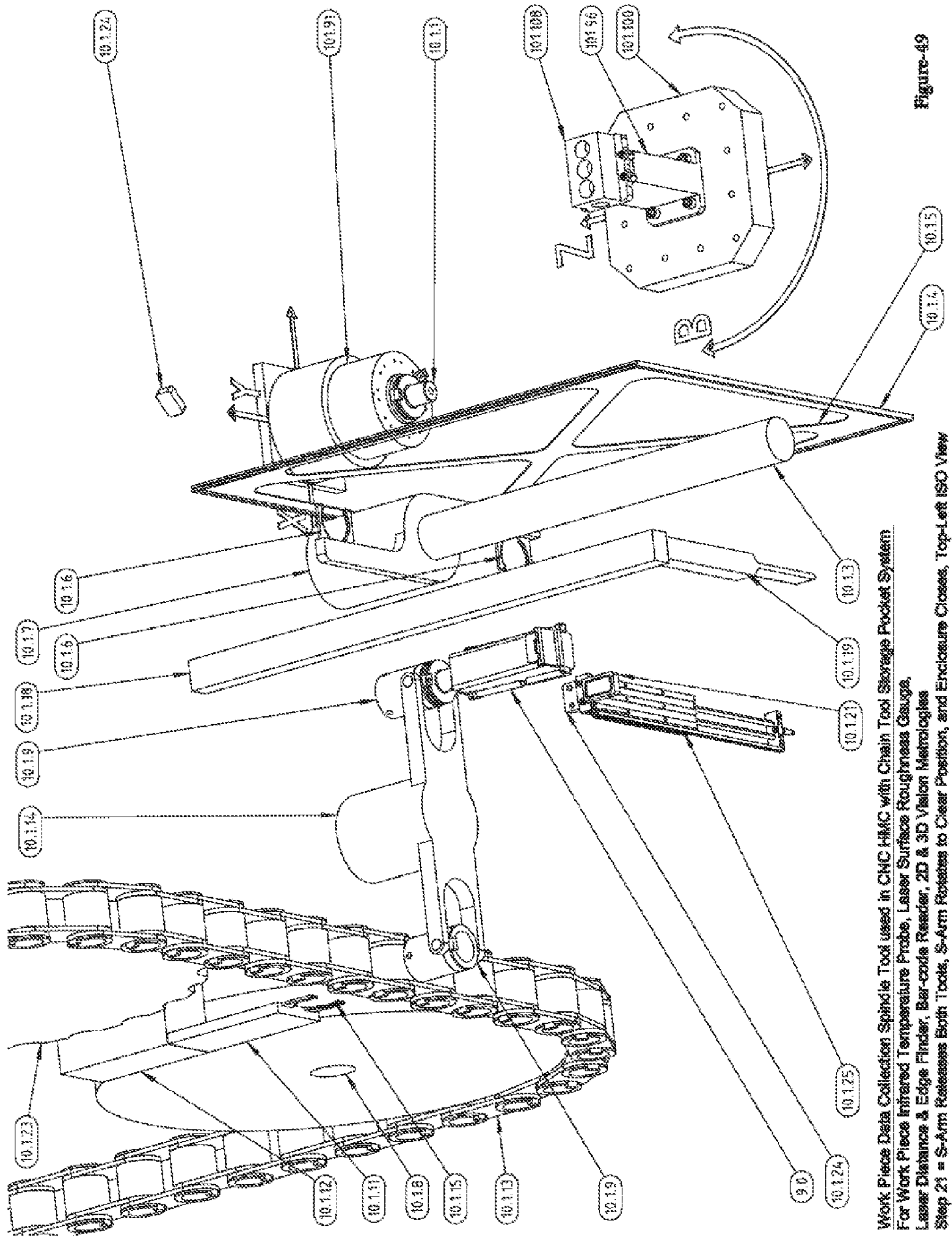
Figure 50:
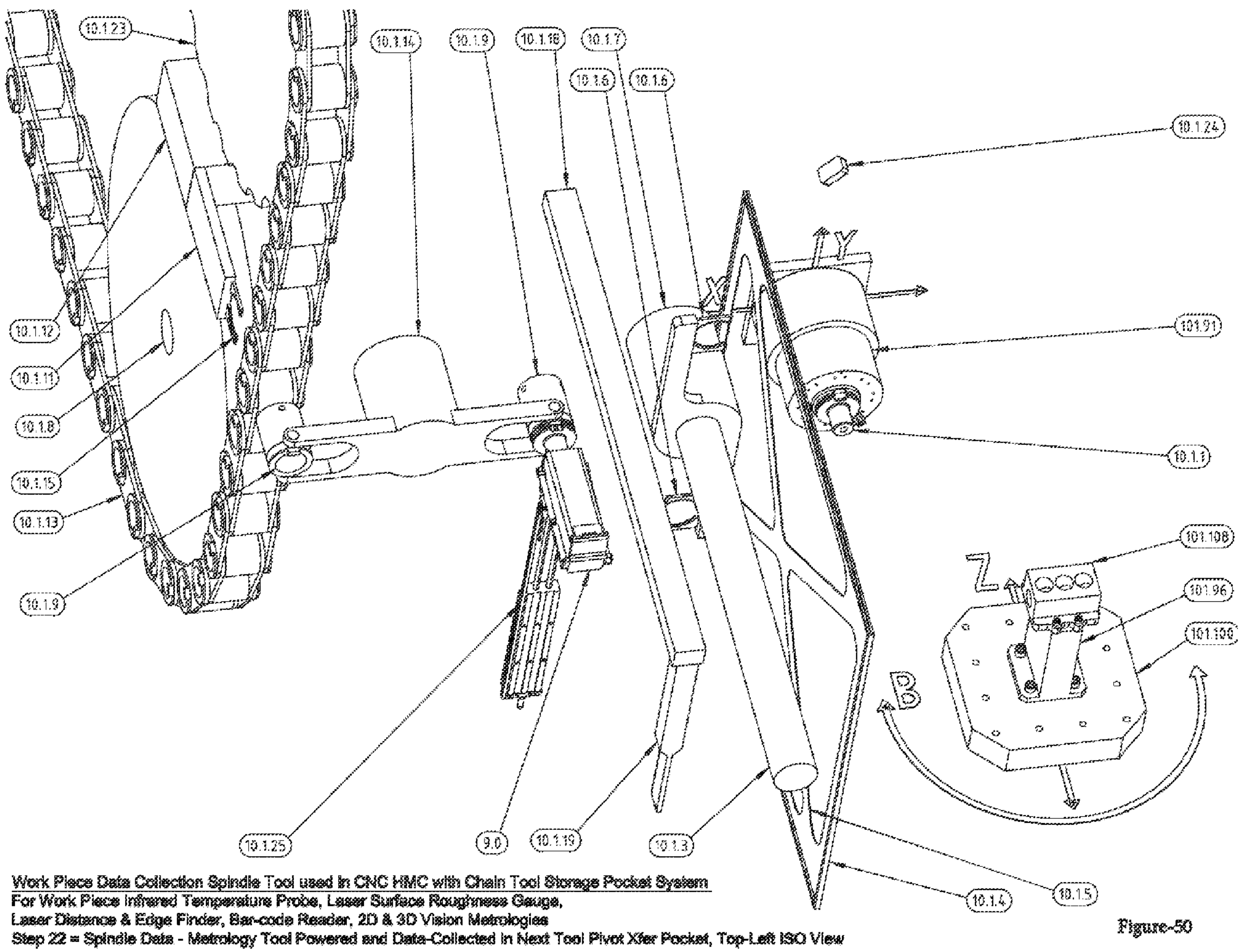
Figure 51:
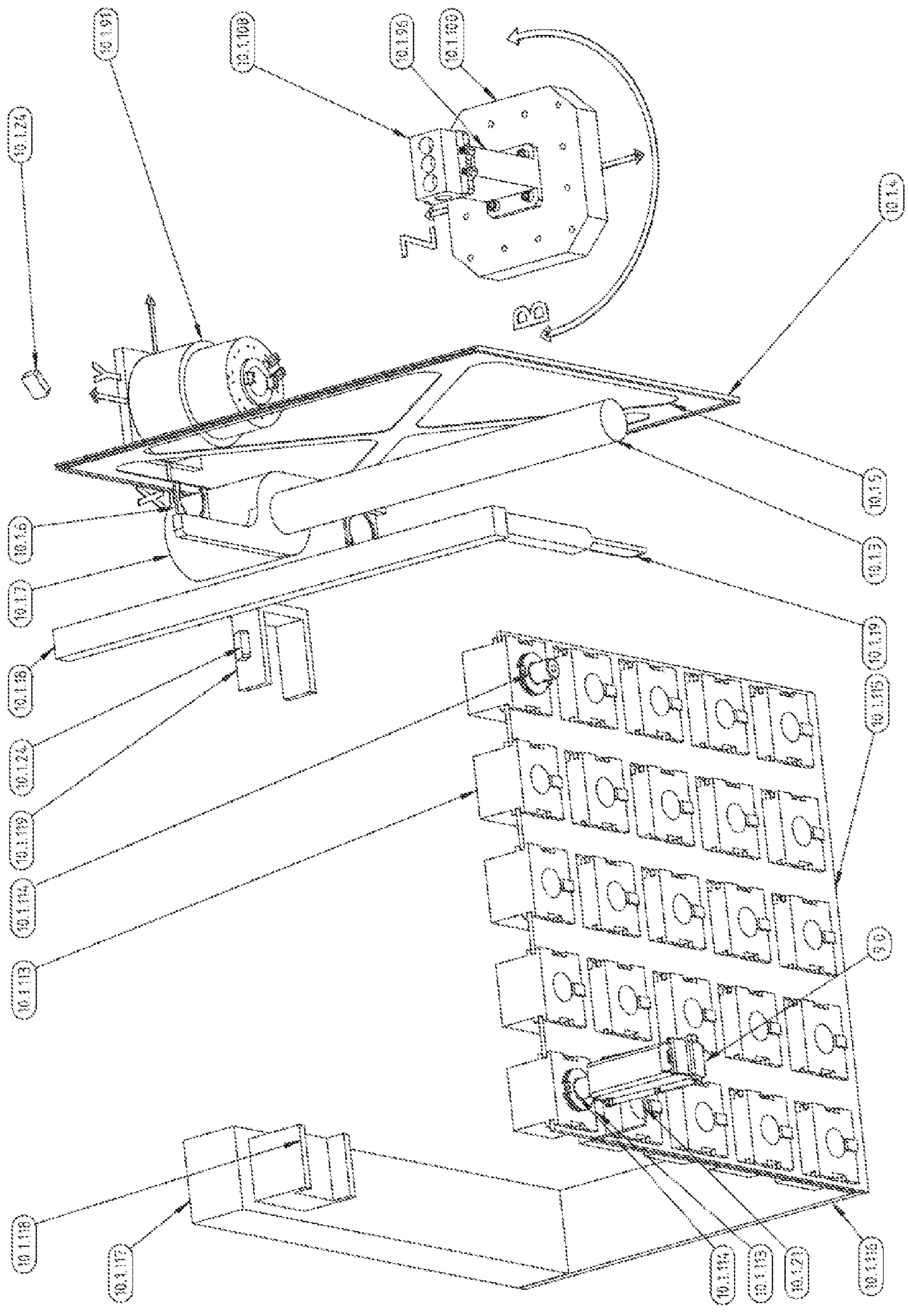
Figure 52:
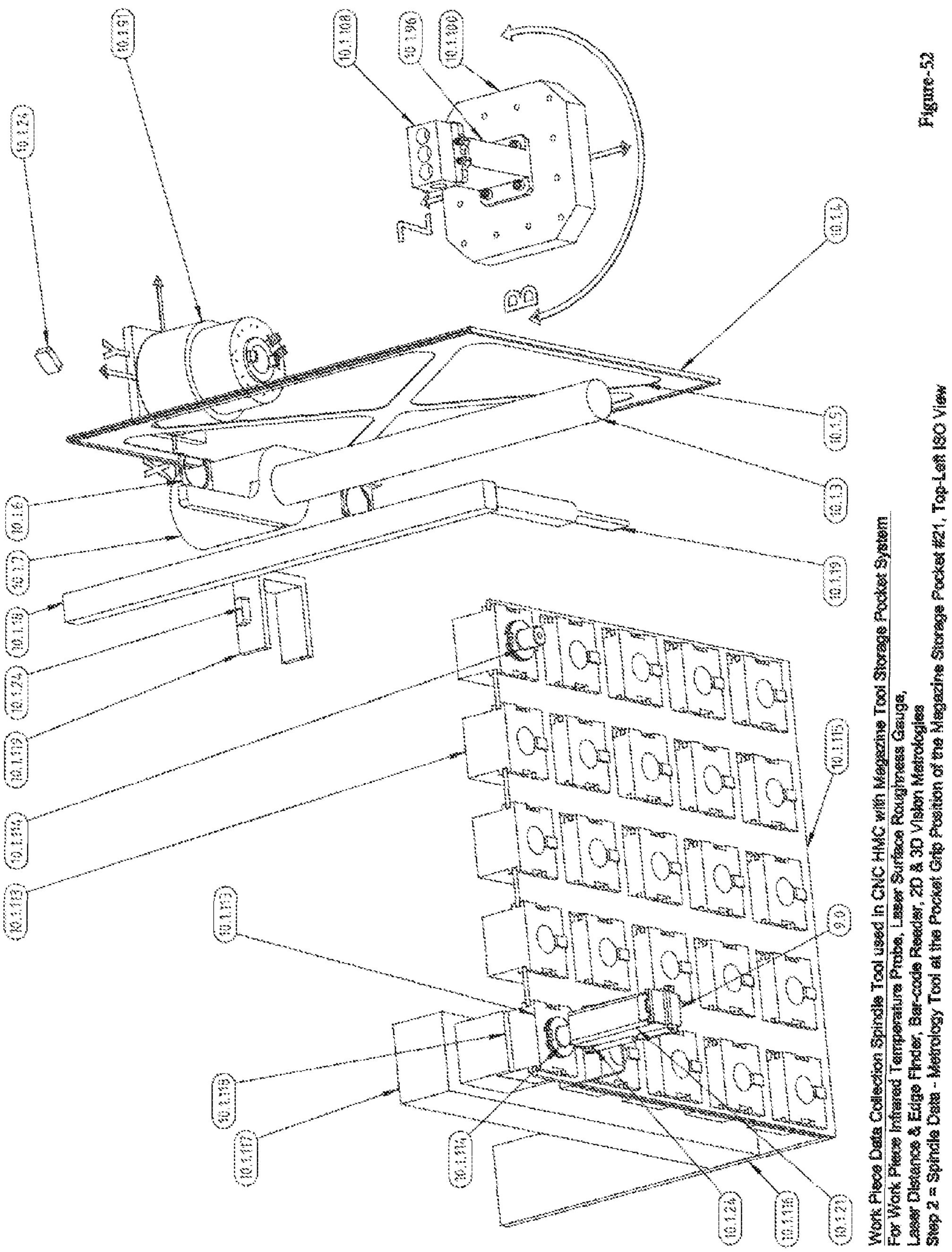
Figure 53:
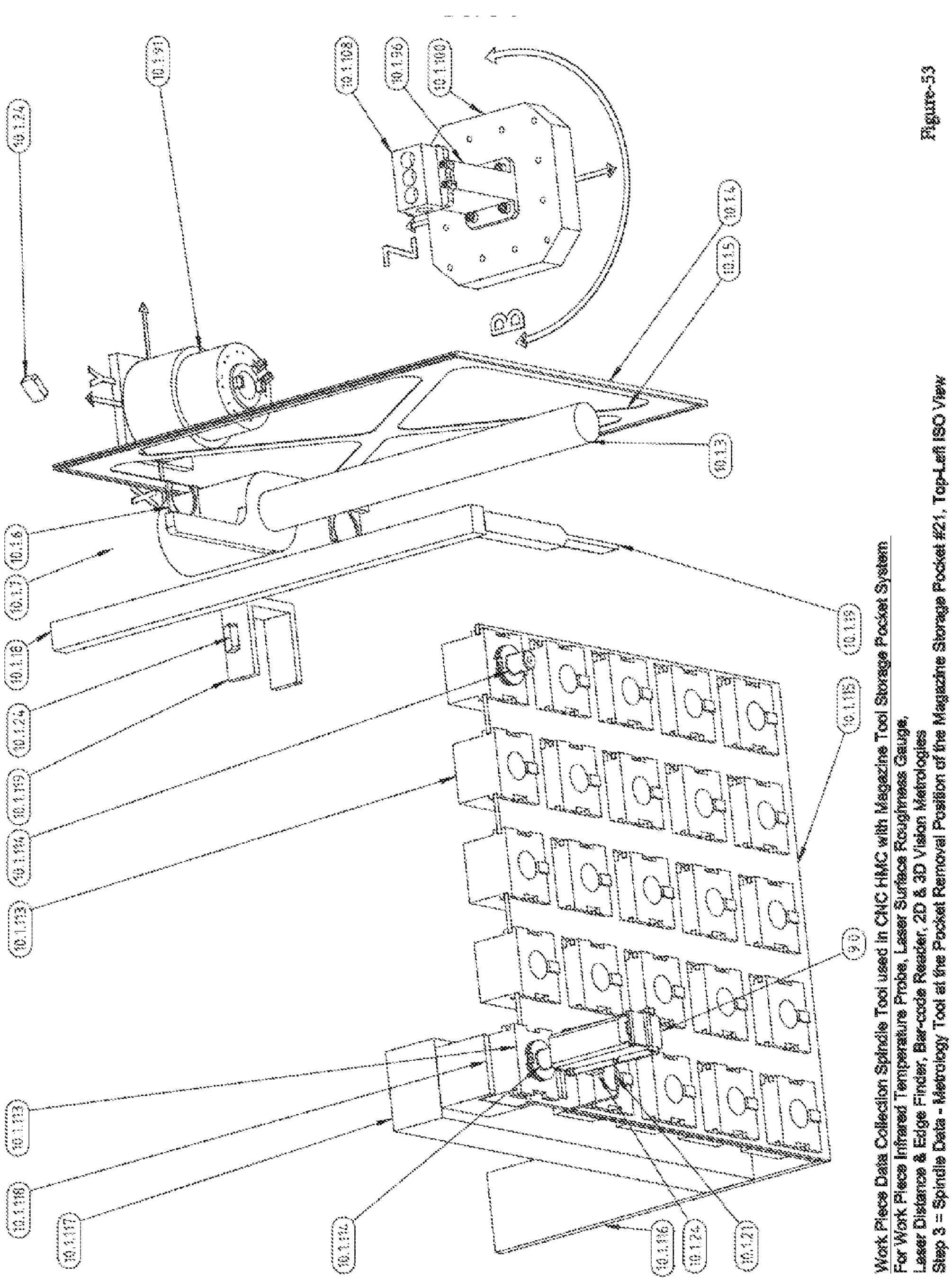
Figure 54:
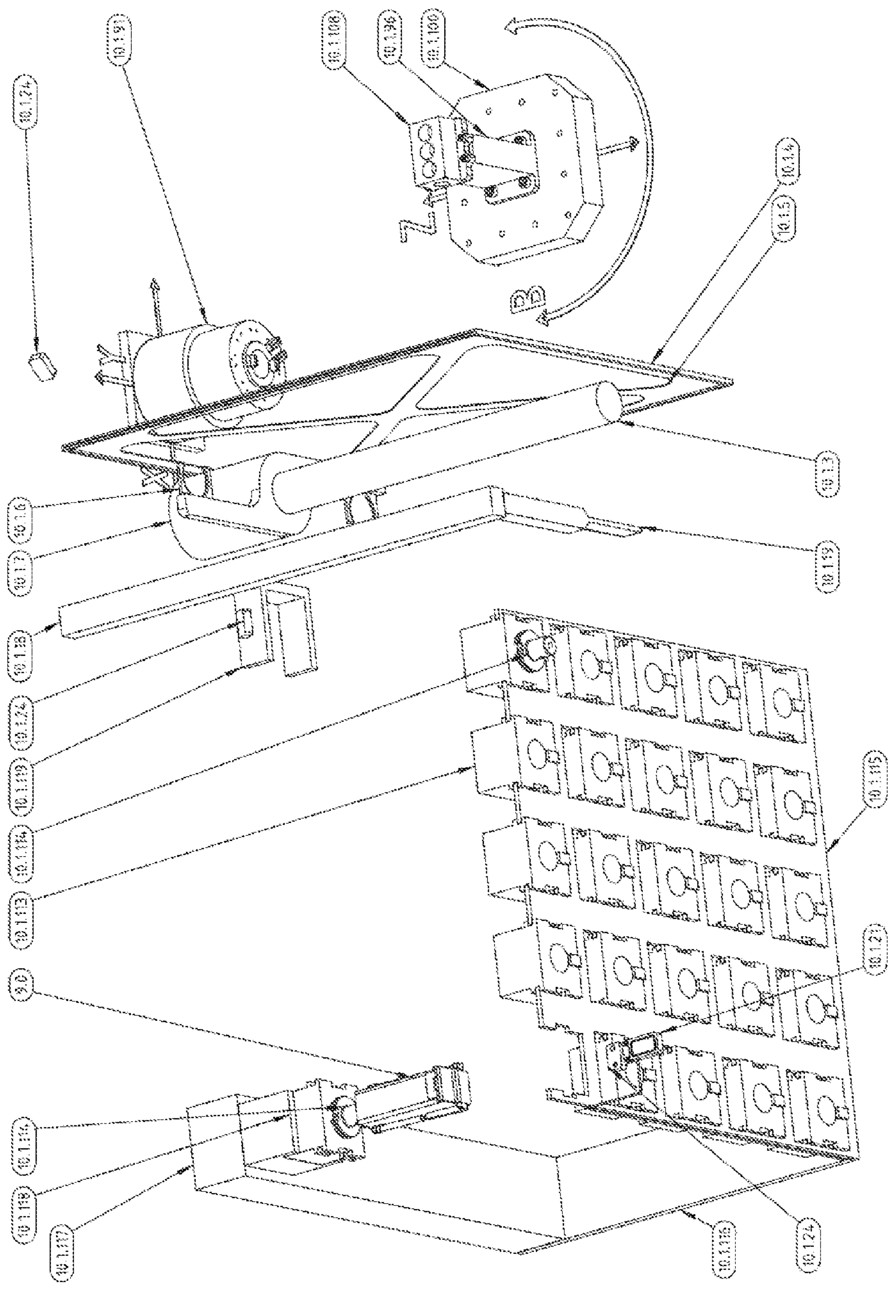
Figure 55:
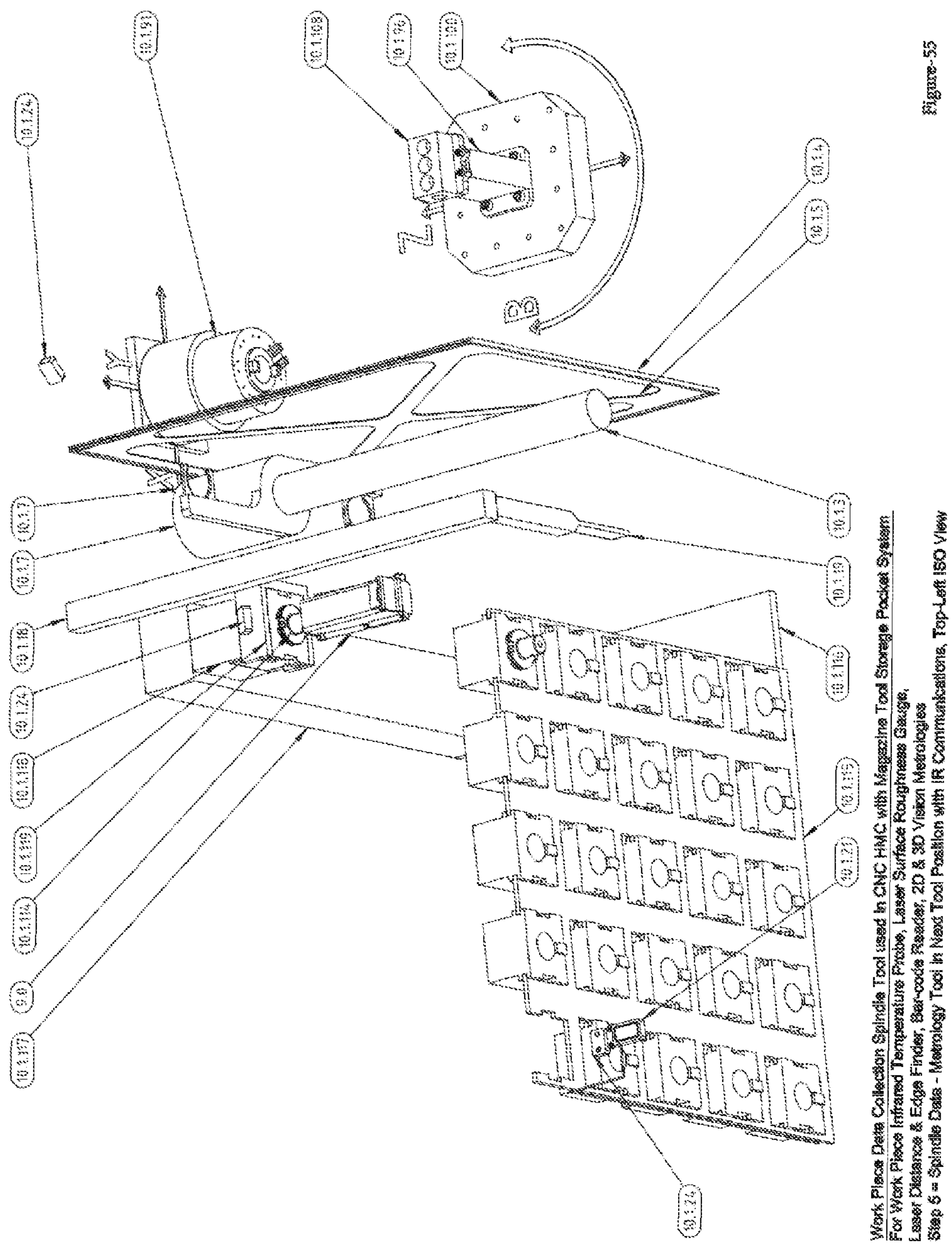
Figure 56:
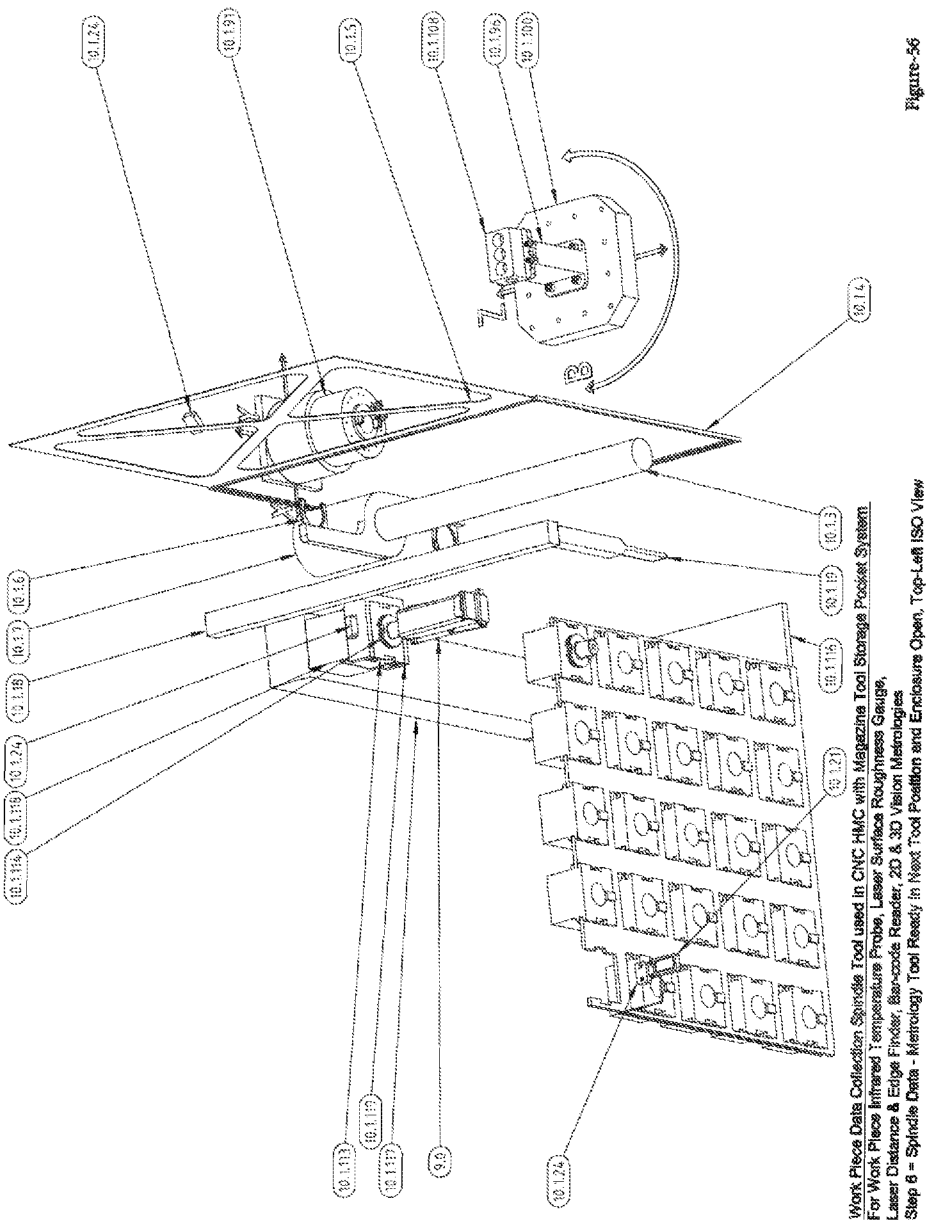
Figure 60:
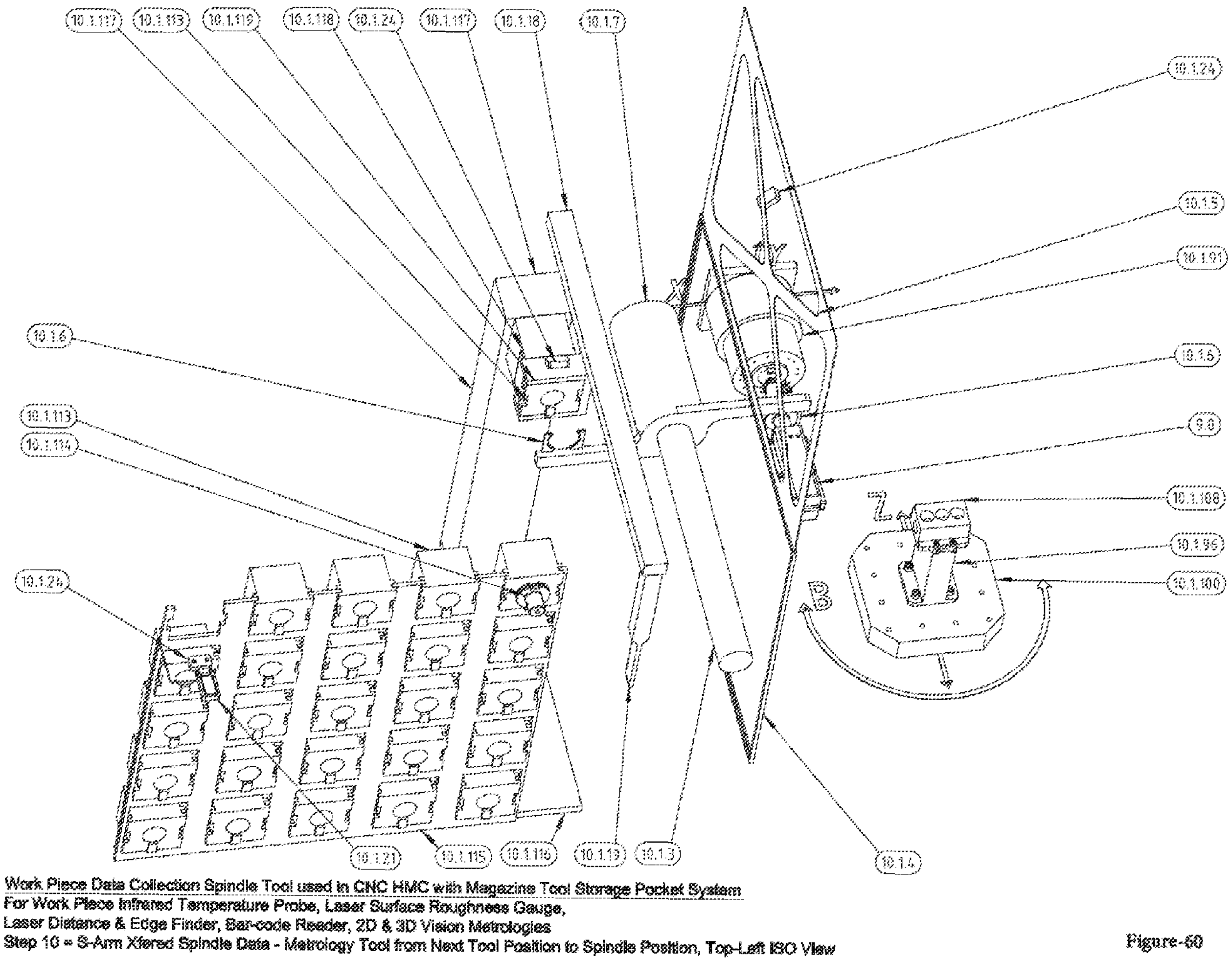
Figure 64:
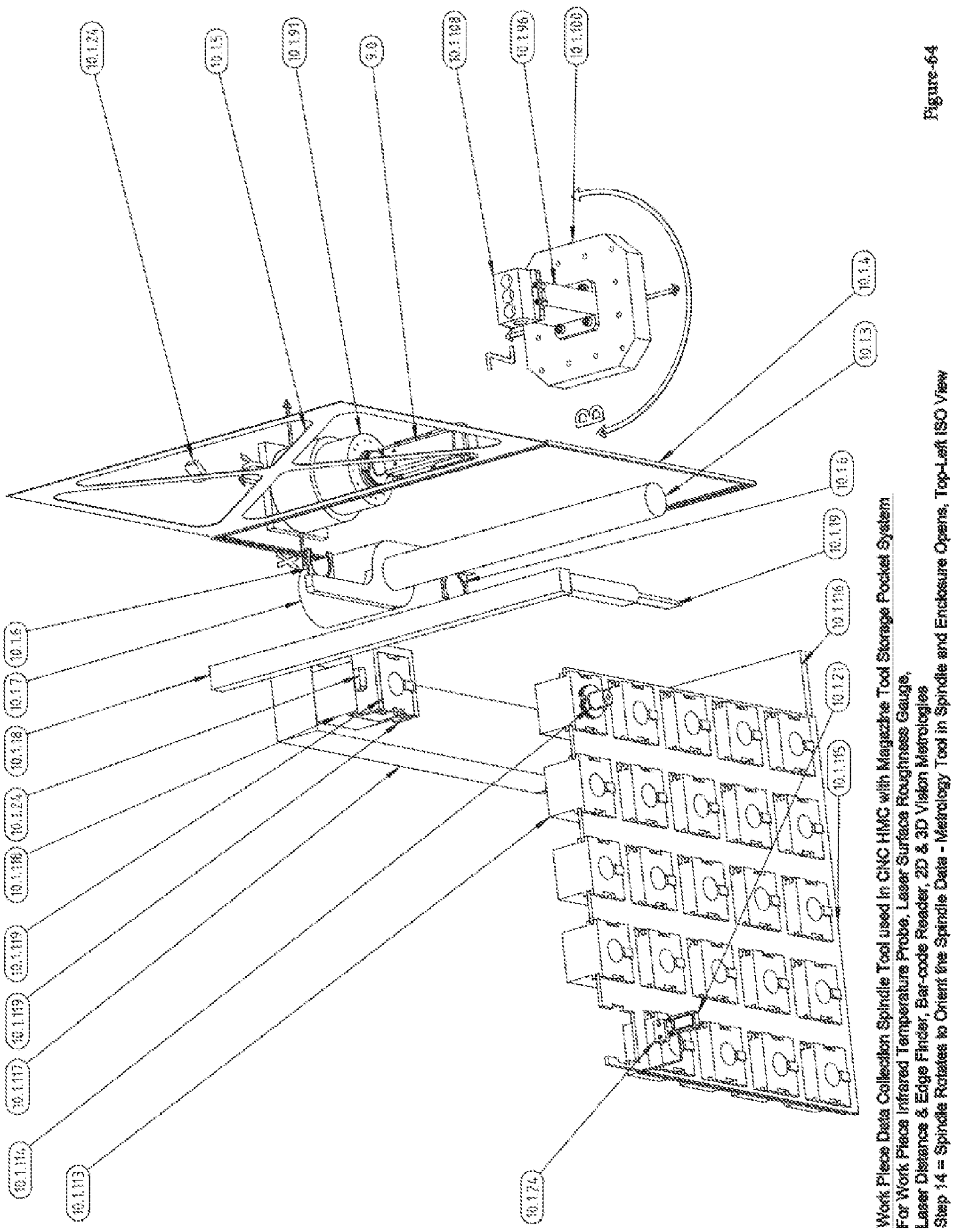
Figure 65:
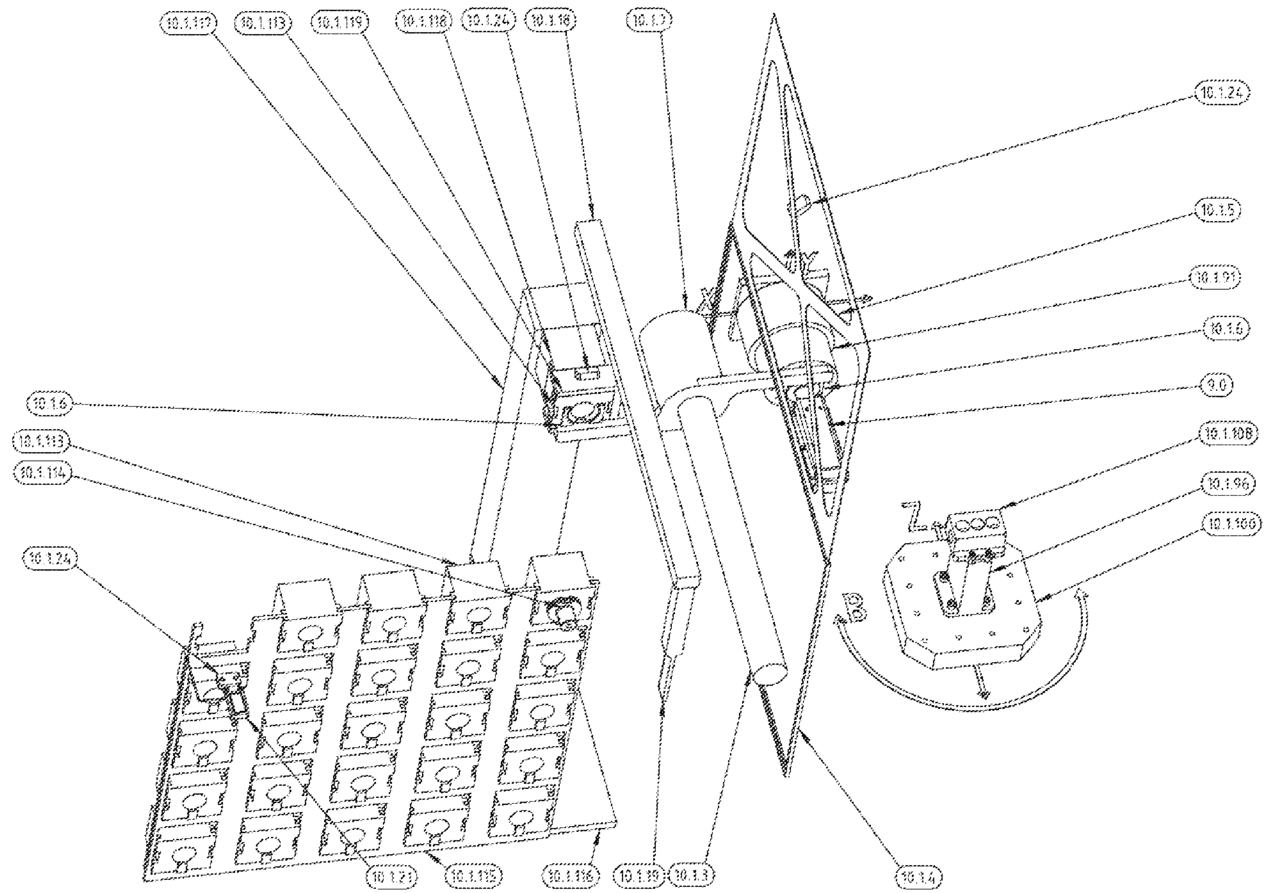
Figure 66:
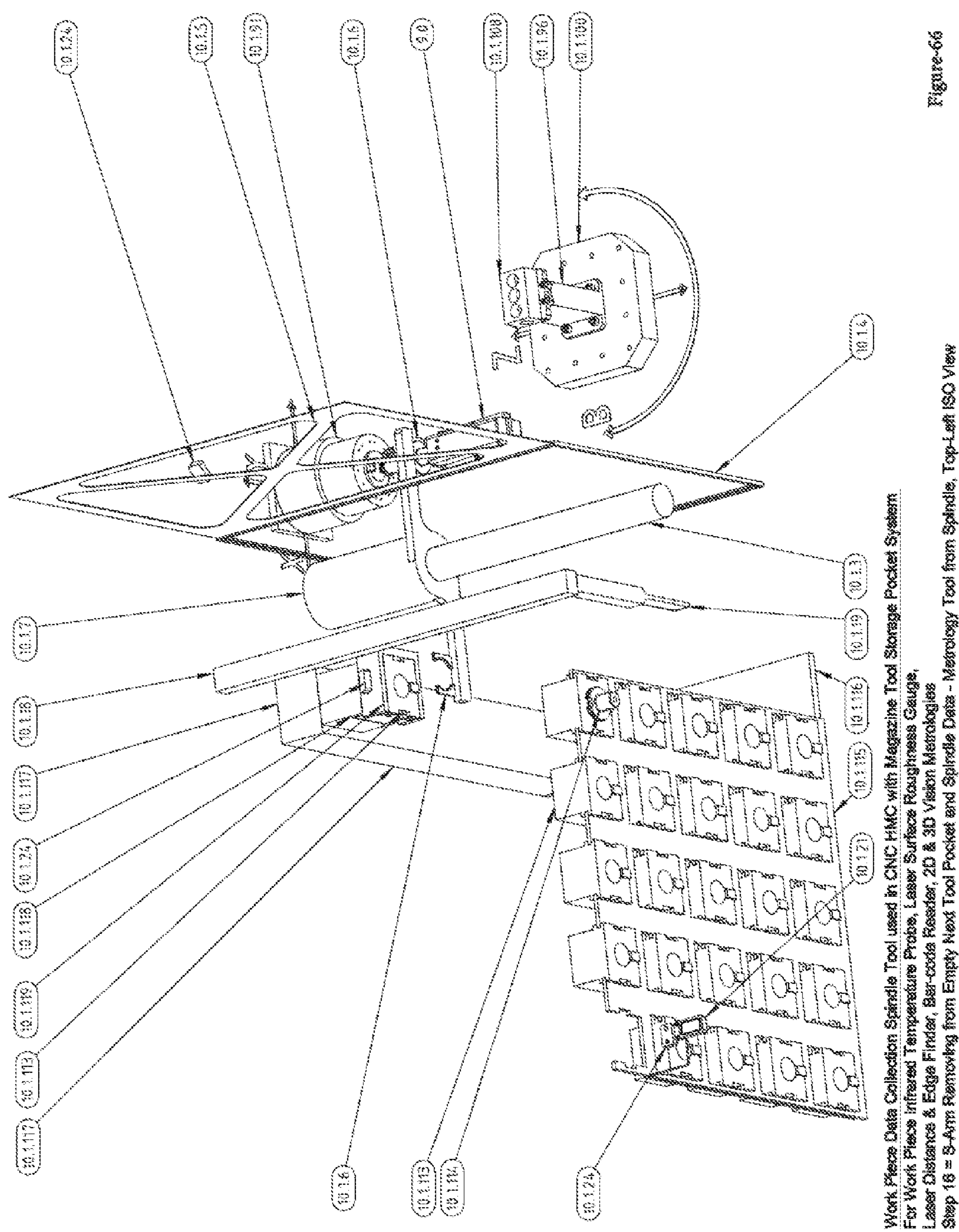
Figure 73:
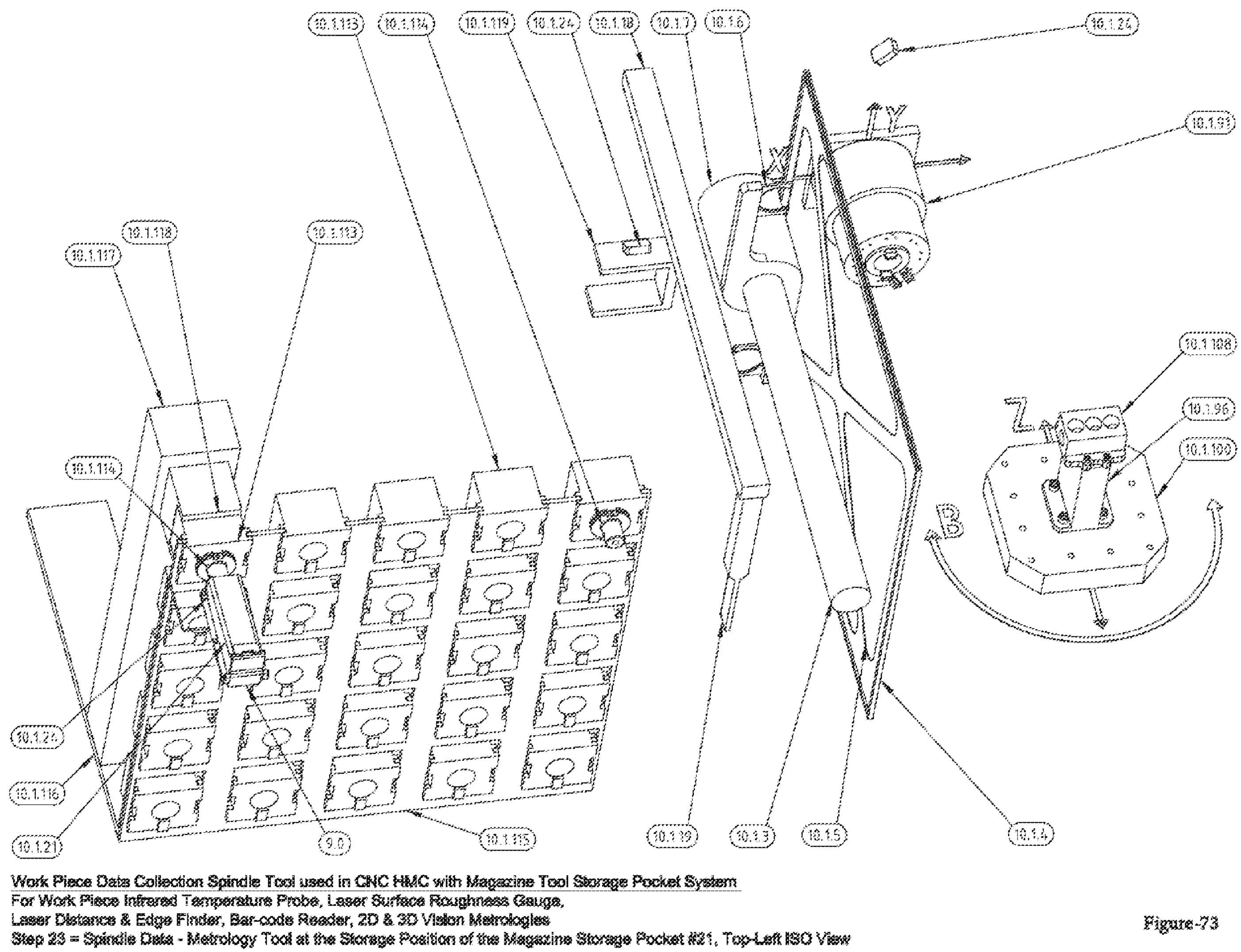

FIG. 26 in FIG. 27 shows the hidden and cutaway views for the internal modules and devices for the spindle mountable camera multiple sensor data acquisition/inspection system of FIG. 15 having the contact recharging module 9.112.

FIG. 28 is the individual descriptions for the typical components for the spindle mountable camera multiple sensor data acquisition/inspection system of FIG. 15.

Harsh Environment Atmospheric Isolating Harsh Environment Vision Camera System Via Multiple, Fail-Safe, Pneumatic and or Selectively Semi-Hermetically Sealed and or Hermetically Sealed Compartments and or Optical Maintenance Method and Means:

The workpiece machining enclosure area of the typical metal removal machine tools where the Harsh Environment/Spindle Mountable Vision Camera System 9.0 is used for image/data acquisition of the workpiece is typically a warmer/high humidity/dripping wet/cutting debris environment from the water, and or petroleum, and or synthetic cutting fluids being used for cooling/lubricating of the workpiece material removal cutting tools and or the workpiece cooling/cutting debris removal/workpiece cleaning, as the machine tool's cooler/ambient adjacent areas used for the cutting tools' transfer and storage, are where there is frequently dripping/splattering cutting fluid/debris from the adjacent cutting tools and mechanisms. The harsh environment of the machining enclosure area for machine tools for a vision camera/sensor system is also consistent with the harsh and variable operating environment for remotely controlled camera systems being operated in remotely operated and or self-guided vehicles, aerial drones, autonomous vehicles, permanent mounting location, etc. having continuous exposure to changing interior and exterior environmental and ambient conditions and the dynamics of operating the vision/sensor system in a vehicle and or mobile system. While the additional mobility of the Harsh Environment camera system increases probability for its being intentionally and/or accidentally physically damaged, incidental ambient environmental damage, theft, etc.

Figure 1:
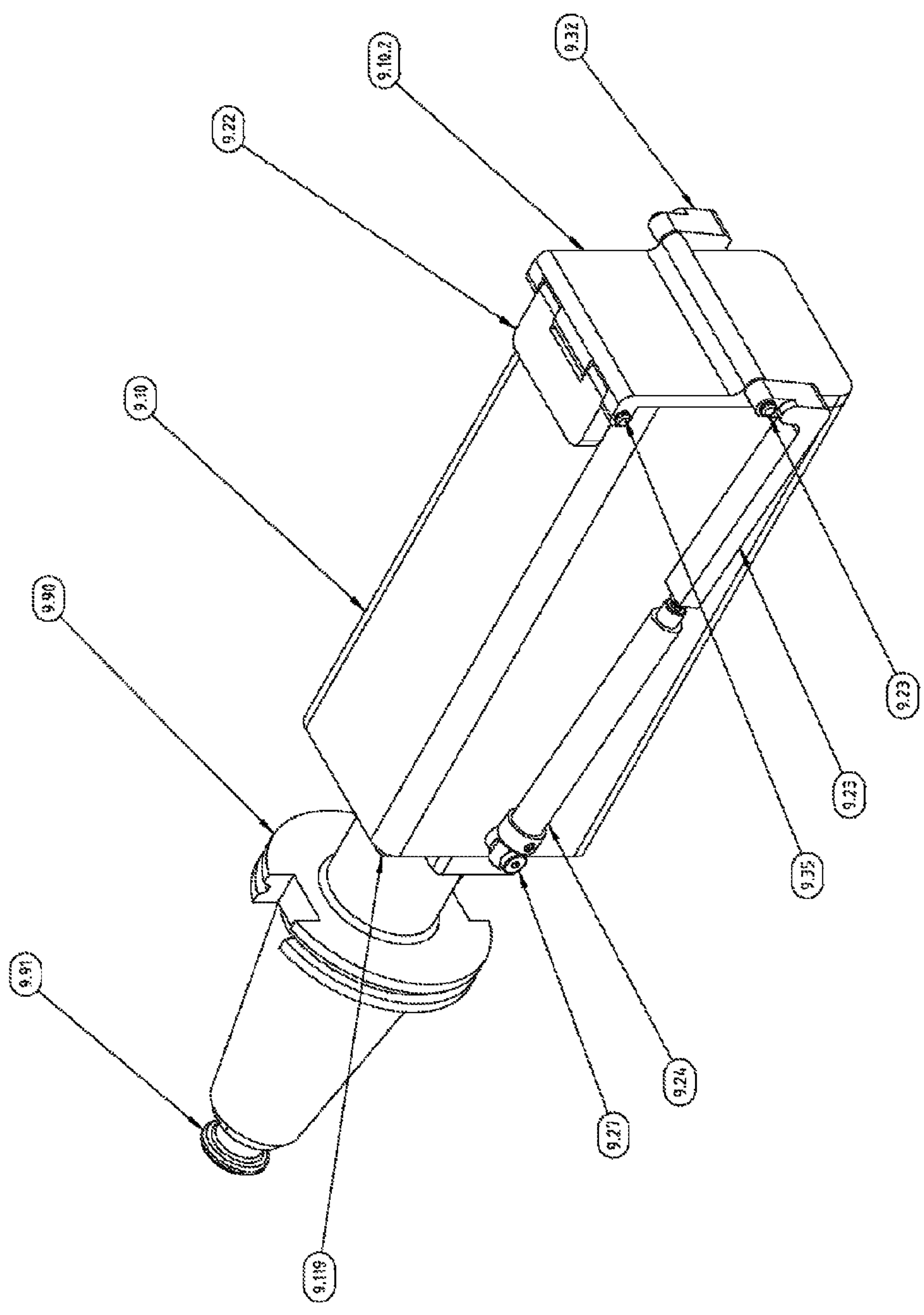
Figure 2:
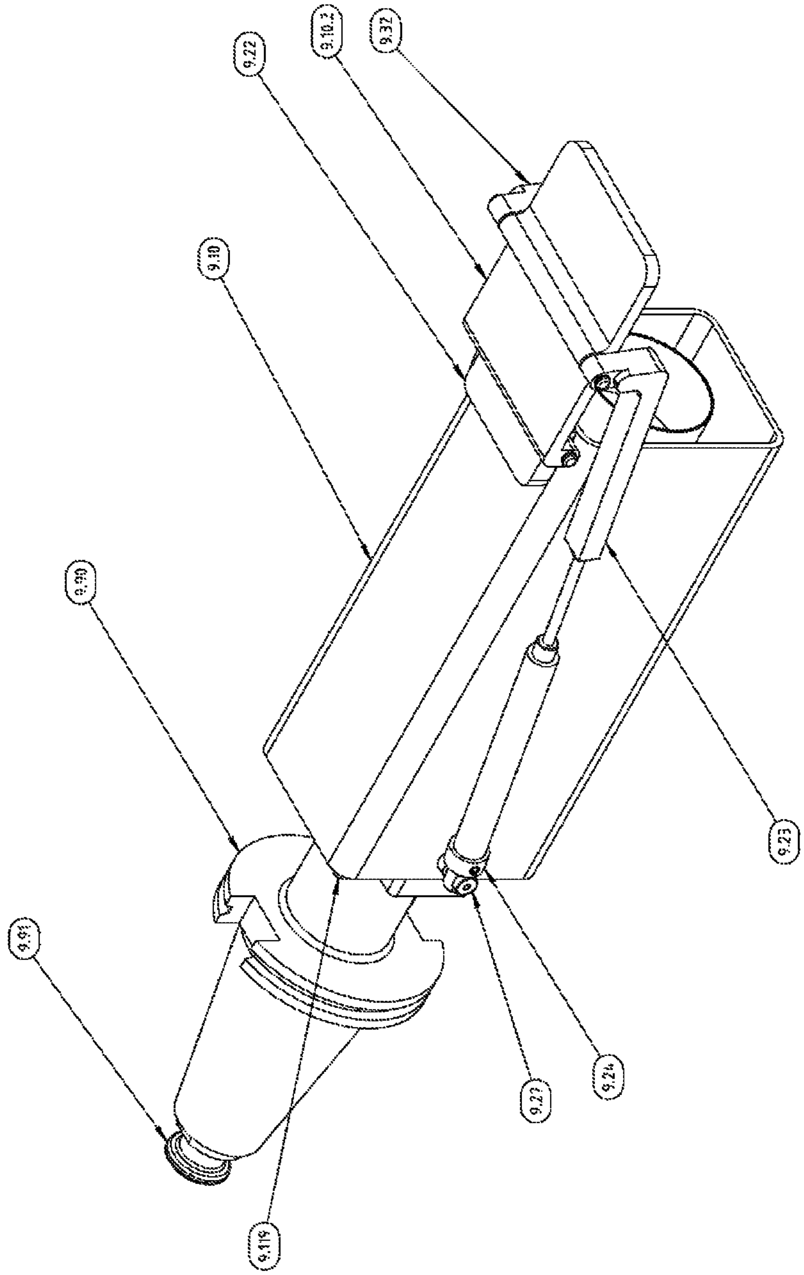
Figure 3:
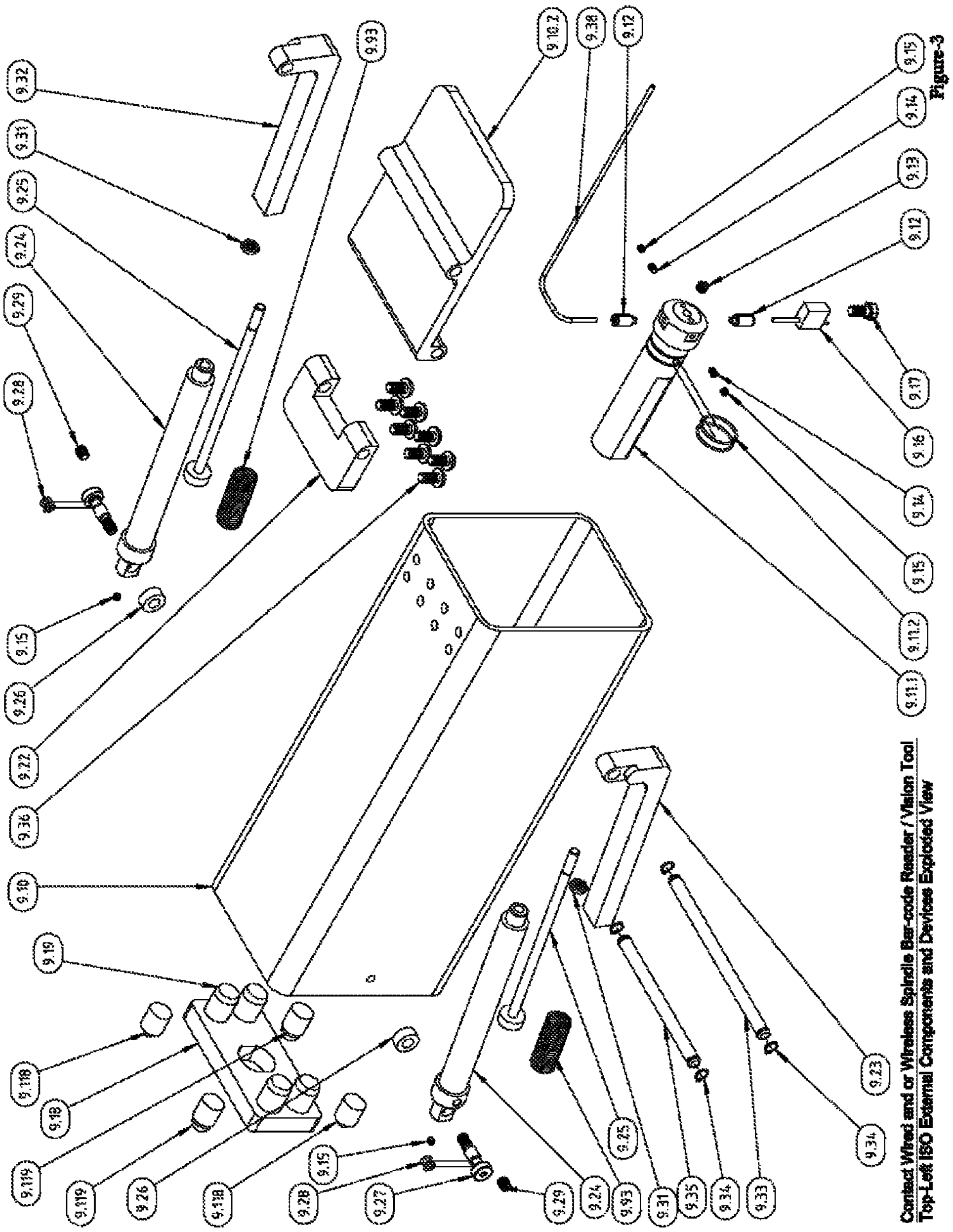
Figure 74:
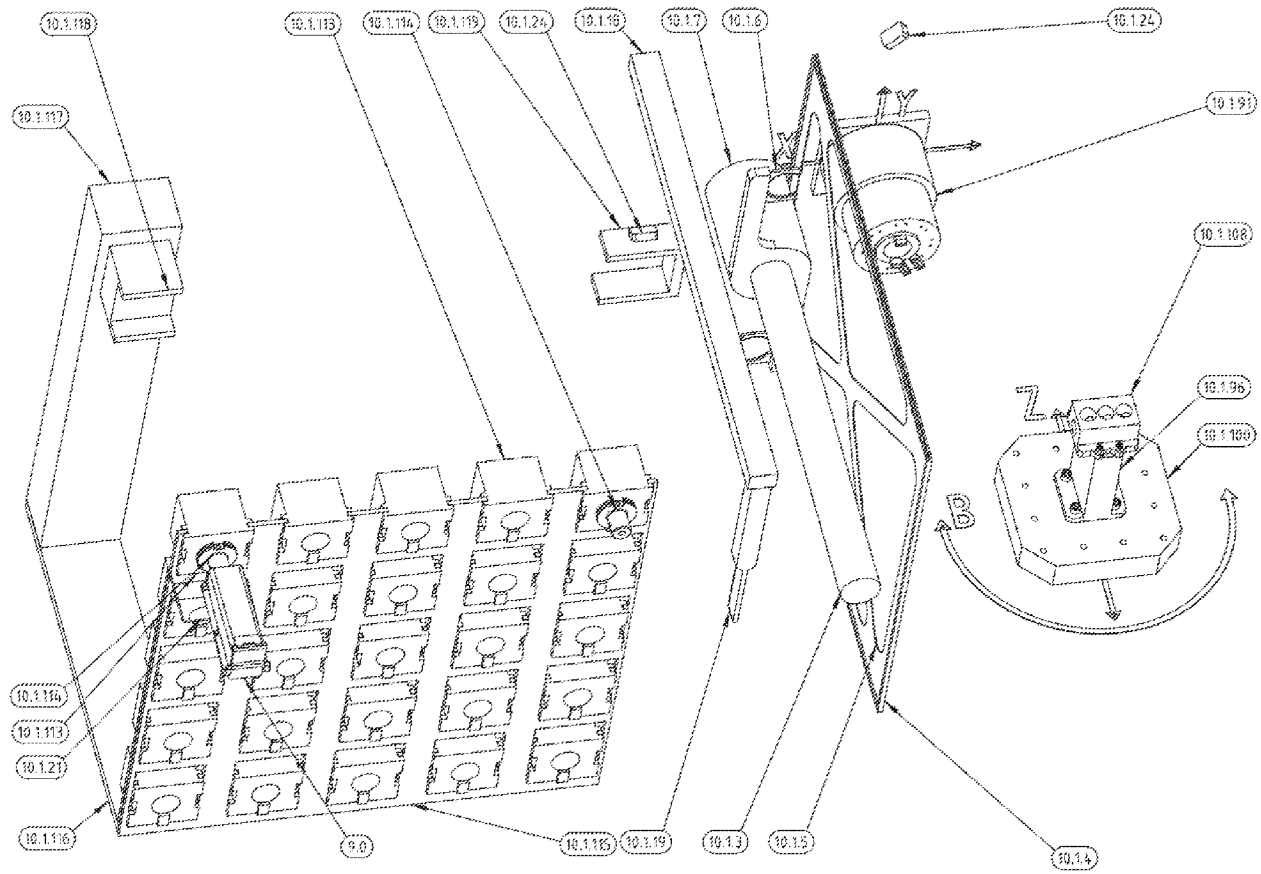

The Harsh Environment Vision Camera System utilizes multiple devices and design details for its reliable operation within the harsh environments of the machine tools' machining, tooling transfer, and storage enclosures, as shown in the FIGS. 1-74, having multiple modes for its protective atmospheric pneumatic isolation from the harsh environments during the Harsh Environment Vision Camera System's transfer/storage, actuation, workpiece image/data acquisition, de-actuation, power/data transfer, storage, cleaning, etc. according to a representative embodiment, as shown in the FIGS. 75-81.

1. The internal design features of the Harsh Environment Vision Camera System 9.0, having the Enclosure Housing 9.10 comprising multiple pneumatic isolating compartments to control and isolate the harsh environments from the internal electronics and power source as its 1st compartment 9.10A being separated via the Wireless Communications Module 9.40 or Wired Communications Module 9.108, having their optionally controlled pass-through pneumatic vias and or via the separate pneumatic passage via the pass-through Camera Air Feed tube 9.38 for having a positive pneumatic atmospheric pressure onto and between the Camera Module's 9.20 Lens Shroud 9.7 and the opening end of the Enclosure Housing 9.10 being the 2nd compartment 9.10B when the Enclosure Lens Cover 9.10.2 is closed via the pneumatic Cylinders 9.24 being dynamically retracted into the closed Enclosure Lens Cover 9.10.2 position via their internal Extended Compression Springs 9.94.
2. The typical components for the atmospheric pneumatic isolation of the multiple internal compartments of the Harsh Environment Vision Camera System 9.0 being installed in the camera's mounting platform/system/vehicle, or its operational equivalents, via a Mounting Stem 9.11.1, or its operational equivalents, that would utilize its compressed air, or its operational equivalents, being directed into the Enclosure Housing 9.10 via the operatively connected internal passages through being directed into the, Mounting Stem 9.11.1, metering Set Screw 9.13, preloaded-directional flow pneumatic sealing Set Screws 9.14 via its compressible elastomeric sealing projecting tip, and or its passive or activated equivalents', locking Set Screws, 9.15, being separated via the Wireless Communications Module 9.40, or Wired Communications Module 9.108, having their optionally controlled pass-through pneumatic vias, KJS Pneumatic Fittings 9.12, pneumatic air Pressure Switch 9.16, its pneumatic Vent 9.17, pass-through Camera Air Feed tube 9.38, and optionally the Air Blow-Off Knife device 9.116, the internal pneumatic vias within the mounting end of the Enclosure Housing 9.10, cylinder mounting Shoulder Screws 9.27, the Pneumatic Cylinders 9.24 and its Actuation Piston Rods 9.25 that are being held in the dynamically retracted position via their corresponding internal Extended Compression Springs 9.94 that are operatively connected via Cylinder Rod Mounts 9.23 being connected to the Enclosure Lens Cover 9.10.2, for facilitating its environmental atmospheric sealing in its closed position, that is pivotally attached to the Lens Cover Pivot Hinge Mount 9.22 being secured to the opening end of the Enclosure Housing 9.10.
3. For the actuation open of the Harsh Environment Vision Camera System 9.0 the typical components used for the operational sequencing for the atmospheric pneumatic isolation of the multiple compartments of the Harsh Environment Vision Camera System 9.0 would utilize the increasing volume/pressure of compressed air, or its operational equivalents, being directed into the Mounting Stem 9.11.1 having its pneumatic flow into the multiple internal compartments of the Enclosure Housing 9.10 being controlled via the metering Set Screw 9.13 for controlling the pneumatic pressure within the Enclosure Housing 9.10 before the extension of the Pneumatic Cylinders 9.24, otherwise being held in the dynamically retracted position via their corresponding internal Extended Compression Springs 9.94, to displace Actuation Piston Rods 9.25 to collapse their internal Compressed Compression Springs 9.93 within the Cylinders 9.24 and open the Enclosure Lens Cover 9.10.2 from its closed atmospherically sealing surfaces being against the open end of the Enclosure Housing 9.10 causing the pneumatic pressure Within the 2nd internal compartment 9.10B to blow-out/off/remove the accumulated debris and or moisture that may be present in and or in proximity to the opposing atmospherically sealing surfaces that could be operatively displaced onto the corresponding internal image/data collection devices comprising but not limited to the Camera Lens Shroud 9.7, Light Ring 9.20.1, Distance Sensor 9.98, Bar-code Reader 9.99, IR-Temperature Sensor 9.117, Surface Finish Profile Meter 9.115, etc. being devices having their image/data collection, capabilities/accuracies functionality/reliability, being negatively affected by debris and or moisture that could become present on those devices, if not for the blow-out/off/removal of the accumulated debris and or moisture from the adjacent opposing atmospherically sealing surfaces of the Enclosure Housing 9.10 and opening of the Enclosure Lens Cover 9.10.2.
4. The operational sequencing for the pneumatic isolation of the multiple compartments as described in Par. 3 can have its blow-out/off/removal of the accumulated debris and or moisture from the opposing atmospherically sealing surfaces of, and in general, the Harsh Environment Vision Camera System 9.0 improved via the controlled rotation of the Machine Tool Spindle 101.91-10.1.91 or its operational equivalents before and or during the partial and or full pneumatic pressurization/activation of the Enclosure Housing 9.10 and opening of the Enclosure Lens Cover 9.10.2.
5. For the image/data acquisition of the Harsh Environment Vision Camera System 9.0 the typical components used for the operational pneumatic isolation of the multiple compartments of the Harsh Environment Vision Camera System 9.0 utilizes the increased volume/pressure of compressed air, or its operational equivalents, being directed into the Mounting Stem 9.11.1 having its pneumatic flow into the multiple internal compartments of the Enclosure Housing 9.10 being controlled via the metering Set Screw 9.13 for controlling the pneumatic pressure within the Enclosure Housing 9.10 while the pneumatically extended Cylinders 9.24 having their pneumatically fully Compressed Compression Springs 9.93 and opened Enclosure Lens Cover 9.10.2 utilizing the Wireless Communications Module 9.40, or Wired Communications Module 9.108, having their optionally controlled pass-through pneumatic vias and or via the separate pneumatic passage via the pass-through Camera Air Feed tube 9.38 to maintain the positive pneumatic atmospheric pressure for the 2nd internal compartment 9.10B to blow-out/off to remove/prevent the accumulated debris and or moisture that may be present in and or in proximity to the workpieces' surfaces and or the harsh environment within the machine tool's enclosure that could otherwise be operatively displaced onto the corresponding internal image/data collection devices and or the adjacent opposing atmospherically sealing surfaces of the Enclosure Housing 9.10 being devices/ components/design details having their image/data collection capabilities/accuracies/functionality/repeatability being negatively affected by debris and or moisture that could become present on those devices/components/design details, if not for the blow-out/off/removal of the accumulated debris and or moisture from the workpiece and or isolated from the harsh environment of the machine tool's enclosure.

6. For the image/data acquisition of the Harsh Environment Vision Camera System 9.0 as described in Par. 5 can have its image/data collection capabilities/accuracies/functionality/repeatability being enhanced and or facilitated and or improved via the controlled rotation of the Machine Tool Spindle 101.91-10.1.91 or its operational equivalents before and or during the partial and or full pneumatic pressurization/activation of the Enclosure Housing 9.10 and opening of the Enclosure Lens Cover 9.10.2 in addition to the pressurized volume of air within the 2$^{nd}$ internal compartment 9.10B to blow-out/off/remove the accumulated debris and or moisture that may be present in and or in proximity to the opposing atmospherically sealing surfaces that could be operatively displaced onto the corresponding internal image/data collection devices comprising but not limited to the Camera Lens Shroud 9.7, Light Ring 9.20.1, Distance Sensor 9.98, Bar-code Reader 9.99, IR-Temperature Sensor 9.117, Surface Finish Profile Meter 9.115, etc. being devices having their image/data collection capabilities/accuracies/functionality/repeatability being negatively affected by debris and or moisture that could become present on those devices, if not for the blow-out/off/removal of the accumulated debris and or moisture from the adjacent opposing atmospherically sealing surfaces while facilitating/improving the effective atmospheric sealing of the Enclosure Housing 9.10 and its Enclosure Lens Cover 9.10.2.

7. For the, fail-safe de-actuation of the Harsh Environment Vision Camera System 9.0 the typical components used for the operational sequencing for the pneumatic isolation of the multiple compartments of the Harsh Environment Vision Camera System 9.0 would utilize the reducing volume/pressure of compressed air, or its operational equivalents, being directed into the Mounting Stem 9.11.1 having its pneumatic flow into the multiple internal compartments of the Enclosure Housing 9.10 being controlled via the metering Set Screw 9.13 for controlling the pneumatic pressure within the Enclosure Housing 9.10 before the completion of the dynamic retraction of the Pneumatic Cylinders 9.24, while the reducing pneumatic pressure facilitates the retraction of the pneumatically extended Cylinders 9.24 via their pneumatically/partially Compressed Compression Springs 9.93 transitioning to the springs' dynamic Extended Compression Springs 9.94 position, to retract the Actuation Piston Rods 9.25 toward their full Extended Compression Springs 9.94 position within the Cylinders 9.24 and the closing Enclosure Lens Cover 9.10.2 toward its closed atmospherically sealing surfaces being against the atmospherically sealing surfaces of the open end of the Enclosure Housing 9.10 causing the pressurized volume of air within the 2$^{nd}$ internal compartment 9.10B to blow-out/off/remove the accumulated debris and or moisture that may be present in and or in proximity to the opposing atmospherically sealing surfaces that could be operatively displaced onto the corresponding internal image/data collection devices comprising but not limited to the Camera Lens Shroud 9.7, Light Ring 9.20.1, Distance Sensor 9.98, Bar-code Reader 9.99, IR-Temperature Sensor 9.117, Surface Finish Profile Meter 9.115, etc. being devices having their image/data collection capabilities/accuracies/functionality/repeatability being negatively affected by debris and or moisture that could become present on those devices, if not for the blow-out/off/removal of the accumulated debris and or moisture from the adjacent opposing atmospherically sealing surfaces while facilitating/improving the effective atmospheric sealing of the Enclosure Housing 9.10 and its Enclosure Lens Cover 9.10.2.

8. The operational sequencing for the pneumatic atmospheric isolation of the multiple compartments as described in Par. 7 can have its blow-out/off/removal of the accumulated debris and or moisture from the opposing atmospherically sealing surfaces of, and in general, the Harsh Environment Vision Camera System 9.0 improved via the controlled rotation Machine Tool Spindle 101.91-10.1.91 or its operational equivalents before and or during the de-actuation of the Harsh Environment Vision Camera System 9.0.

9. For the transfer and storage, power/data transfer, etc. of the Harsh Environment Vision Camera System 9.0 after its de-actuation the typical components used for the operational atmospheric pneumatic isolation of the multiple compartments of the Harsh Environment Vision Camera System 9.0 utilizes the increased volume/pressure of compressed air, or its operational equivalents, being directed into the Mounting Stem 9.11.1 having its pneumatic flow into the multiple internal compartments of the Enclosure Housing 9.10 being controlled via the metering Set Screw 9.13 for maintaining the pneumatic pressure within the 1$^{st}$ compartment 9.10A of the Enclosure Housing 9.10 via the one-way pneumatic flow of the sealing Set Screws 9.14, having their corresponding locking Set Screws, 9.15, for maintaining the positive pneumatic pressure within the 1$^{st}$ compartment 9.10A while being optionally separated via the Wireless Communications Module 9.40, or Wired Communications Module 9.108, having their optionally controlled pass-through pneumatic vias and or optionally via the separate pneumatic passage via the pass-through Camera Air Feed tube 9.38 for also having a positive pneumatic atmospheric pressure within the 2$^{nd}$ compartment 9.10B when the Enclosure Lens Cover 9.10.2 is closed via the pneumatic Cylinders 9.24 being dynamically retracted into the closed Enclosure Lens Cover 9.10.2 position via their internal Extended Compression Springs 9.94.

10. The residual positive pneumatic atmospheric pressure within/isolation of the Harsh Environment Vision Camera System 9.0 after its de-actuation as described in Par. 9 facilitates its storage and optionally its manual and or automatic cleaning operations for the blow-out/off/removal of accumulated debris and or moisture from the external surfaces of the Harsh Environment Vision Camera System 9.0 that could otherwise be operatively displaced onto the corresponding internal image/data collection devices and or the adjacent opposing atmospherically sealing surfaces of the Enclosure Housing 9.10 being devices/components/design details having their image/data collection capabilities/accuracies/functionality/repeatability being negatively affected by debris and or moisture that could become present on those devices/components/design details, if not for the residual positive pneumatic atmospheric pressure within/isolation of the Harsh Environment Vision Camera System 9.0.

11. The residual positive pneumatic pressure within and for the pneumatic atmospheric isolation of the Harsh Environment Vision Camera System 9.0 as detailed in Par. 7, 8, 9, and 10 facilitates its being transferred to and from the hotter and or more humid environments to be subsequently moved into the relatively cooler and/or less humid storage areas or its operational equivalents while having the Harsh Environment Vision Camera System 9.0 actuated, utilized, and its de-actuation in the hotter and more humid environments while being heated or cooled via the direct contacting of the Machine Tool Spindle 101.91-10.1.91, camera's mobile system, permanent mounting location, or its operational equivalents and the radiated, ambient, and or incidental heating within the viewing environment that could typically create an operational temperature differential for the Harsh Environment Vision Camera System 9.0 otherwise having a tendency to transition/draw moisture/condensation within the Harsh Environment Vision Camera System 9.0 that could otherwise be mechanically and or acoustically vibratory displaced into the internal electronics and or the corresponding internal image/data collection being internal electronics components/devices having their image/data collection capabilities/accuracies/functionality/repeatability being negatively affected by moisture/condensation that could become present on internal electronics components/devices.
12. The residual positive pneumatic pressure within and for the atmospheric isolation of the Harsh Environment Vision Camera System 9.0 as described in Par. 11 facilitates the continued pneumatic atmospheric isolation from the environmental atmospheric barometric conditions changing over a period of time.
13. The image/data collection capabilities/accuracies/functionality/repeatability of the activated optical and data sensory devices are improved and or maintained via the continuous defrosting, defogging, and or drying of their exposed sensory surfaces via the heated and dried pressurized air of the Harsh Environment Vision Camera System 9.0 as detailed in Par. 1, 2, 3, 5, 6, and 7 being heated in the 1$^{st}$ compartment via the activation of the power source and or its associated electronic devices, and or its passive or activated equivalents', before being utilized as a positive pneumatic atmospheric pressure being directed onto and between the Camera Module's 9.20 Lens Shroud 9.7 and the opening end of the Enclosure Housing 9.10B via the Wireless Communications Module 9.40, or Wired Communications Module 9.108, having their optionally controlled pass-through pneumatic vias and or via the separate pneumatic passage via the pass-through Camera Air Feed tube 9.38.
14. The filtered and dried compressed air for the Harsh Environment Vision Camera System 9.0 being described in Par. 2 can be exchanged for an inert gas such as $CO_2$ and or $N_2$ and or its equivalents' as could be required for use with combustible and or volatile petroleum and or synthetic cutting fluids being used for cooling/lubricating of the workpiece material removal cutting tools and or the workpiece cooling/cutting debris removal/workpiece cleaning and or utilization/operation in a flammable gas atmosphere.
15. The length of flexible pneumatic tubing (not shown) for optionally connecting the exit end of the pass-through Camera Air Feed tube 9.38 to the Air Blow-Off Knife device 9.116 mounted on the Enclosure Lens Cover 9.10.2 can be positioned for its being pneumatically shut off when the Enclosure Lens Cover 9.10.2 is in its closed position by the flexible pneumatic tubing being bent/kinked, while the flexible pneumatic tubing would be opened by its being straightened/aligned when the Enclosure Lens Cover 9.10.2 is in its open position.

Figure 75:
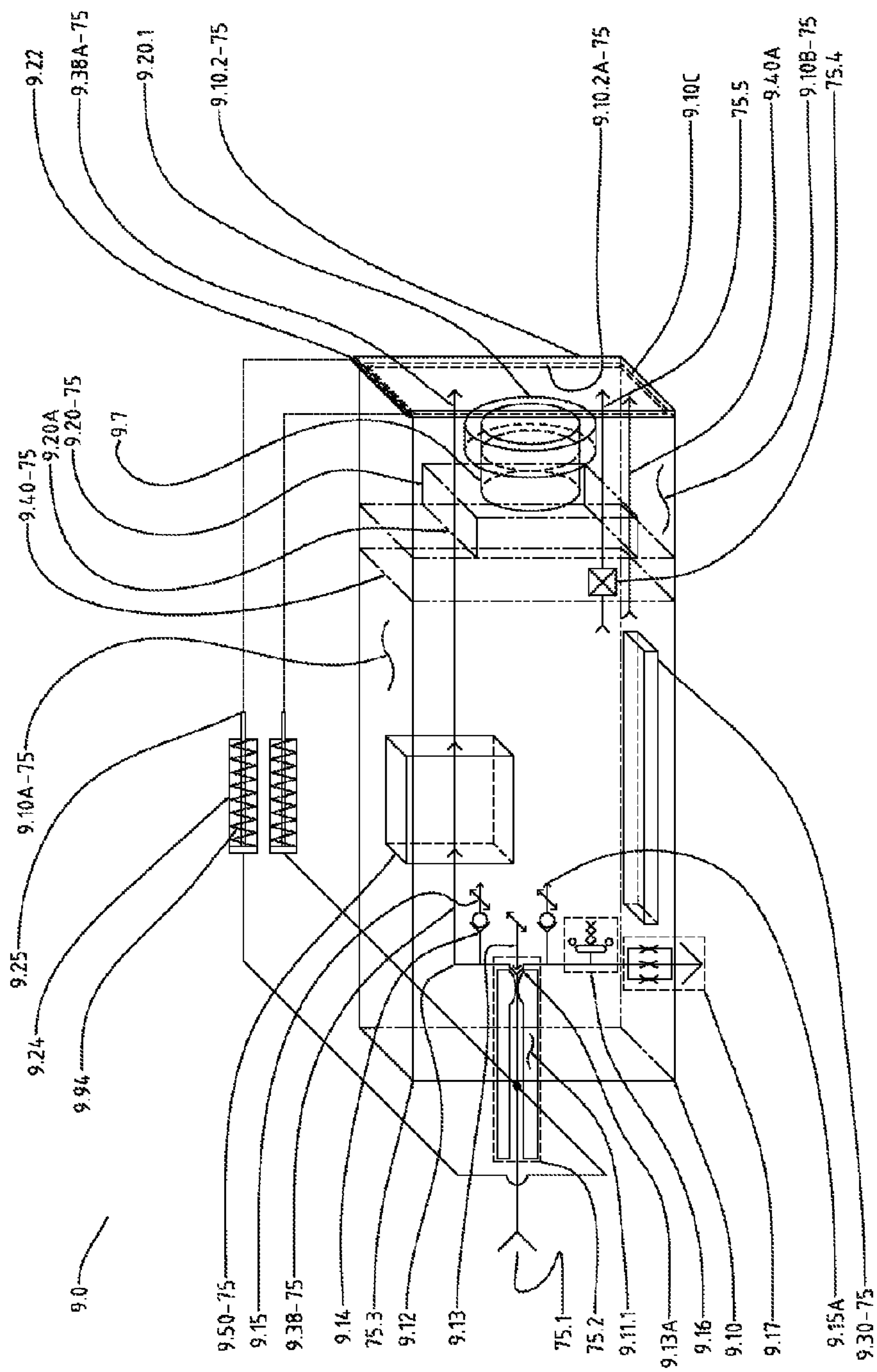
FIG. 75 is an isometric diagram illustrating a Harsh Environment Vision Camera System according to a first representative embodiment of the present technology.

FIG. 75 is an isometric diagram illustrating a representative embodiment of a closed Harsh Environment Vision Camera System 75.3. The Harsh Environment Vision Camera System 75.3 having a straight mounting stem 75.2 to facilitate the compressed air 75.1 being fed into its internal passage where it's gas flow would be regulated via the metering Set Screw or orifice 9.13 that utilizes the natural Joule-Thomson/Joule-Kelvin thermodynamics affect 9.13A, or its operational equivalents, to cool the incoming gas traveling within the Mounting Stem 9.11.1 causing the moisture in the incoming gas to condense, separate, and to be subsequently dispelled via the pneumatic Vent 9.17, having the partial balance of the cooled and dried compressed gas being discharged within and partially pressurizing the 1$^{st}$ compartment 9.10A via the preloaded-directional flow pneumatic sealing Set Screws 9.14 having its flow being regulated by the corresponding locking Set Screws 9.15 where the cooled incoming air is heated by both the residual heat of the induction module 9.30 charging the batteries and during the operation of the internal electrical components 9.40 and other modules of the vision camera system, and the remaining balance flowing through tube 9.38 into the onboard battery compartment 9.50, or its operational equivalents, where the flowing air is heated by both the residual heat of charging the batteries and the batteries internal heat generated during its discharge for the operation of the internal electrical components 9.40 and other modules of the vision camera system before passing into the 2$^{nd}$ compartment 9.10B via tube 9.38A into its appropriate diffuser (not shown) as may be required to have the dried and heated compressed air, initially if required and, continually defrost and or defog and or dry the vision camera optics 9.7. Having the pressurized and heated air of the 1$^{st}$ internal part 9.10A being directed into the 2nd compartment 9.10B by the continuous via tube 9.40A passing through an electronics module 9.40 and in addition to being selectively control by the actuated flow/proportional pneumatic valve 75.4 via tube 75.5 for adjacent devices/sensors (not shown) as may be required to have the dried and heated compressed air, initially if required and, continually defrost and or defog and or dry the adjacent devices/sensors.

In a representative embodiment, a harsh environment camera system 9.0 can include an enclosure 9.10 having an electronics compartment 9.10A and a camera compartment 9.10B with a camera opening. A camera module 9.20 can be disposed within the camera compartment 9.10B and one or more electronic components, such as a battery module 9.50, capable of generating heat can be positioned in the electronics compartment 9.10A. A compressed gas connector 9.11.1, connectable to a gas source, can be mounted on the enclosure 9.10. A metering orifice 9.13 having an inlet and an outlet is in fluid communication with the connector 9.11.1. The metering orifice 9.13 is operative to cool a gas flowing therethrough, thereby condensing moisture from the gas. A gas conduit 9.38 is in fluid communication with the outlet of the orifice 9.13 and extends through the electronics compartment 9.10A to the camera compartment 9.10B. A portion of the gas conduit 9.38 is positioned in close proximity to the one or more electronic components 9.50, whereby the gas is heated prior to entering the camera compartment 9.10B. In some embodiments, a vent line 9.17 is connected in fluid communication with the outlet and configured to channel the moisture away from the metering orifice 9.13. In some embodiments, a secondary gas conduit 75.5 interconnects the camera compartment 9.10B and the electronics compartment 9.10A. In some embodiments, a flow control valve 75.4 is positioned along the secondary gas conduit 75.5 for selectively allowing gas flow between the camera and electronics compartments.

Figure 76:
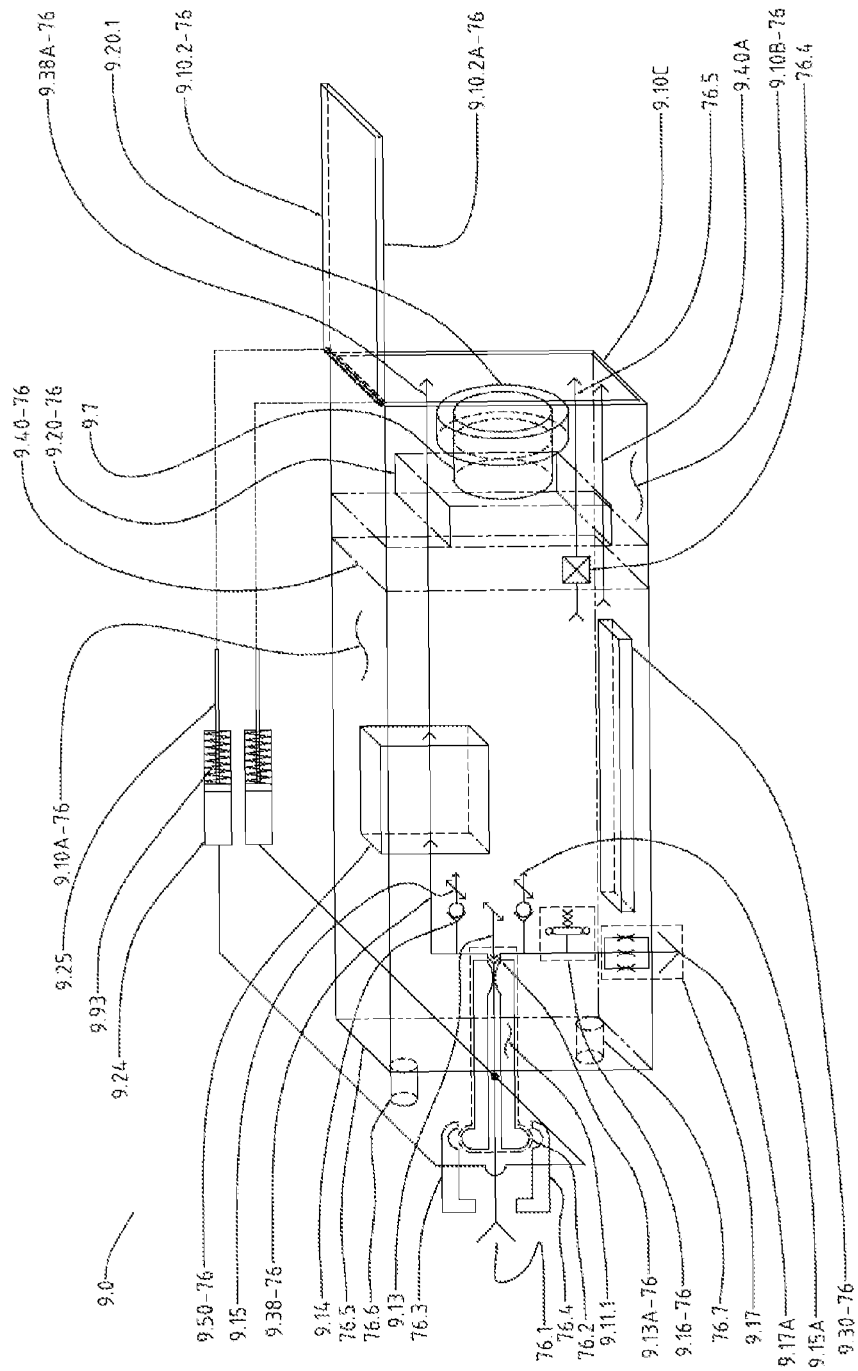
FIG. 76 is an isometric diagram illustrating a Harsh Environment Vision Camera System according to a second representative embodiment of the present technology.

FIG. 76 is an isometric diagram illustrating a representative embodiment of a functional equivalent of the actuated open Harsh Environment Vision Camera System 76.5 for having the actuated open Harsh Environment Vision Camera System 77.5 having a retention knob mounting stem 76.2 to facilitate the compressed air 77.3 being fed into its internal passage where it's gas flow is regulated via the metering Set Screw 9.13 that utilizes the natural Joule-Thomson/Joule-Kelvin thermodynamics affect 9.13A to cool the incoming gas traveling within the Mounting Stem 9.11.1 causing the moisture in the incoming gas to condense, separate, and be subsequently dispelled via the pneumatic Vent 9.17, having a pair of opposing retention devices 76.3 and 76.4 operatively secure the Mounting Stem 9.11.1, while optionally being able to use a pair of fixed retention fasteners 76.6 and 76.7 either as shown in FIG. 76 or in combination with the straight mounting stem 75.2 of the Harsh Environment Vision Camera System 75.3.

Figure 77:
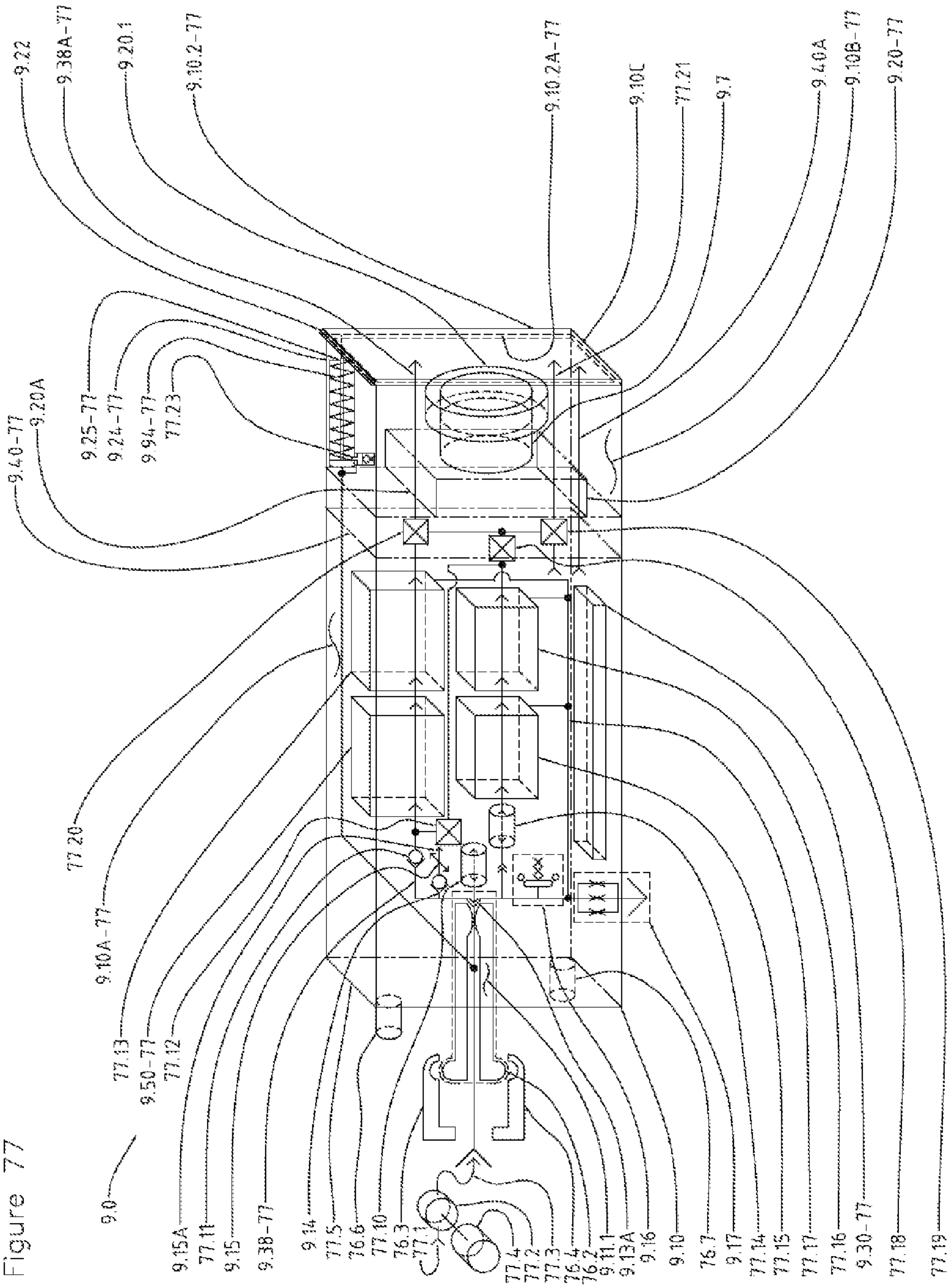
FIG. 77 is an isometric diagram illustrating a Harsh Environment Vision Camera System according to a third representative embodiment of the present technology.

FIG. 77 is an isometric diagram illustrating a representative embodiment of a closed functional equivalent of the Harsh Environment Vision Camera System 75.3 for having the internally locked closed 77.23 Harsh Environment Vision Camera System 77.5 having a retention knob mounting stem 76.2 to facilitate having the intake of ambient air 77.1 being compressed by the pump 77.2, or its equivalents, being driven by an adjacent motor 77.4, or its equivalents, to supply the compressed air 77.3 being fed into its internal passage where it's gas flow is regulated via the metering Set Screw 9.13 that utilizes the natural Joule-Thomson/Joule-Kelvin thermodynamics affect 9.13A to cool the incoming gas traveling within the Mounting Stem 9.11.1 causing the moisture in the incoming gas to condense, separate, and to be subsequently dispelled via the pneumatic Vent 9.17, having the fail-safe retract spring 9.94 of the pneumatic cylinder actuator 9.24 and its actuation rod 9.25 being concealed and securely located entirely within the sealed enclosure of the Harsh Environment Vision Camera System 77.5 to operatively retain the lens opening cover 9.10.2 in its closed 9.10.2-77 and sealed position via the maintained contact of the opposing enclosure opening sealing face 9.10C and enclosure lens cover sealing face 9.10.2A-77.

Figure 78:
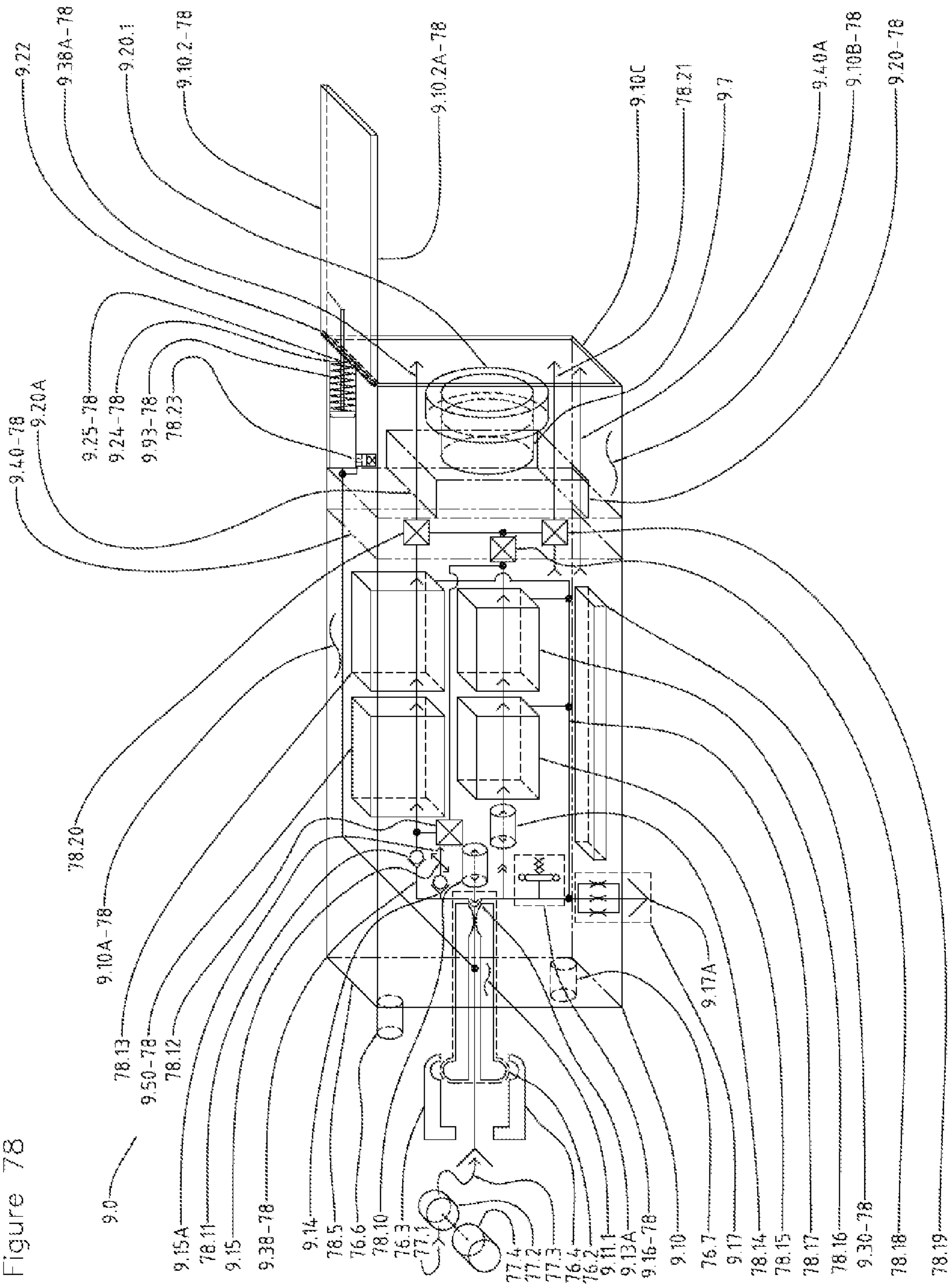
FIG. 78 is an isometric diagram illustrating a Harsh Environment Vision Camera System according to a fourth representative embodiment of the present technology.

FIG. 78 is an isometric diagram illustrating a representative embodiment of a functional equivalent of the actuated Harsh Environment Vision Camera System 77.5 for having the internally unlocked 78.23 actuated open Harsh Environment Vision Camera System 78.5 having a retention knob mounting stem 76.2 to facilitate the compressed air 77.3 being fed into its internal passage where it's gas flow is regulated via the controlled/actuated metering flow/proportional valve 77.10 that utilizes the natural Joule-Thomson/Joule-Kelvin thermodynamics affect 9.13A to cool the incoming gas traveling within the Mounting Stem 9.11.1 causing the moisture in the incoming gas to condense, separate, and is subsequently dispelled 9.17A via the pneumatic Vent 9.17, having the partial balance of the cooled and dried compressed gas being discharged within and partially pressurizing the 1st compartment 9.10A via the preloaded-directional flow pneumatic sealing Set Screws 9.14 having its flow being regulated by the corresponding locking Set Screws 9.15 and where the cooled incoming air is heated by both the residual heat of the induction module 9.30 charging the batteries and during the operation of the internal electrical components 9.40 and other modules of the vision camera system, and the remaining balance flowing through tube 9.38 into the onboard battery compartment 9.50 where the flowing air is heated by both the residual heat of charging the batteries and the batteries internal heat generated during its discharge for the operation of the internal electrical components 9.40 and other modules of the vision camera system before passing into an independent Solid State Heating/Cooling module 78.13, having an additional parallel pneumatic path via the controlled/actuated metering flow/proportional valve 78.14 into a sequential set of independent Solid State reversible Peltier effect Heating/Cooling modules 78.15 and 78.16 having all of the independent Solid State reversible Peltier effect Heating/Cooling modules, or its operational equivalents, having a common drain 78.17 that connects to Vent 9.17 to subsequently dispelled the accumulated and condensed moisture 9.17A from the compressed air 77.3 and or 77.1, having an arrangement of a flow check valve 78.11, multiple controlled/actuated metering/mixing flow/proportional valves 78.12, 78.18, 78.19, 78.20, being selectively and automatically actuated by the internal control system 9.40 having data from its corresponding internal and or external sensors as required to initiate/maintain/optimize the performance actuated Harsh Environment Vision Camera System 78.5, facilitating multiple pneumatic sequential and alternating heating and cooling paths comprising parallel or sequential airflows.

Figure 79:
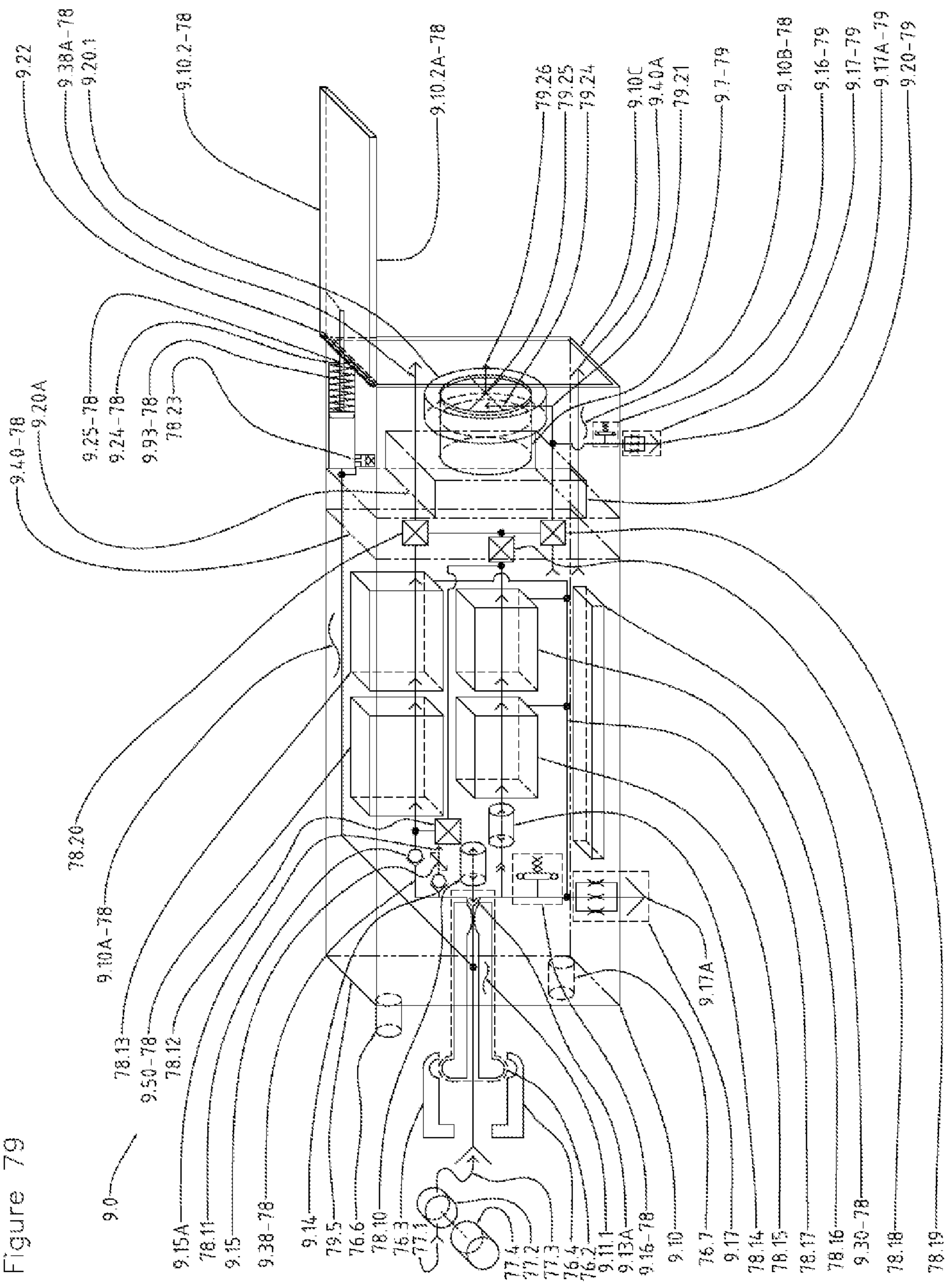
FIG. 79 is an isometric diagram illustrating a Harsh Environment Vision Camera System according to a fifth representative embodiment of the present technology.

FIG. 79 is an isometric diagram illustrating a representative embodiment of a functional equivalent of the actuated Harsh Environment Vision Camera System 78.5 for having the internally unlocked 78.23 actuated open Harsh Environment Vision Camera System 79.5 having a retention knob mounting stem 76.2 to facilitate the compressed air 77.3 being fed into its internal passage where it's gas flow is regulated via the controlled/actuated metering flow/proportional valve 77.10 that utilizes the natural Joule-Thomson/Joule-Kelvin thermodynamics affect 9.13A to cool the incoming gas traveling within the Mounting Stem 9.11.1 causing the moisture in the incoming gas to condense, separate, and is subsequently dispelled 9.17A via the pneumatic Vent 9.17, having the controlled/actuated metering/mixing flow/proportional valve 78.19 being selectively and automatically actuated by the internal control system 9.40 having data from its corresponding internal and or external sensors to direct its pneumatic flow via tube 79.21, having a pneumatic pressure sensor 9.16-79 and its corresponding vent 9.17-79, into the cameras optical lens opening cavity to create a positive pneumatic pressure 79.24 against the SCHOTT Nanoporous Glass optical glass lens cover 79.25, or its operational equivalents, to facilitate its self-cleaning via the exiting of the positive pneumatic pressure through the multiple nanoporous openings 79.26 of the SCHOTT Nanoporous Glass optical glass lens cover 79.25 as required to initiate/maintain/optimize the performance of the Harsh Environment Vision Camera System 79.5.

Figure 80:
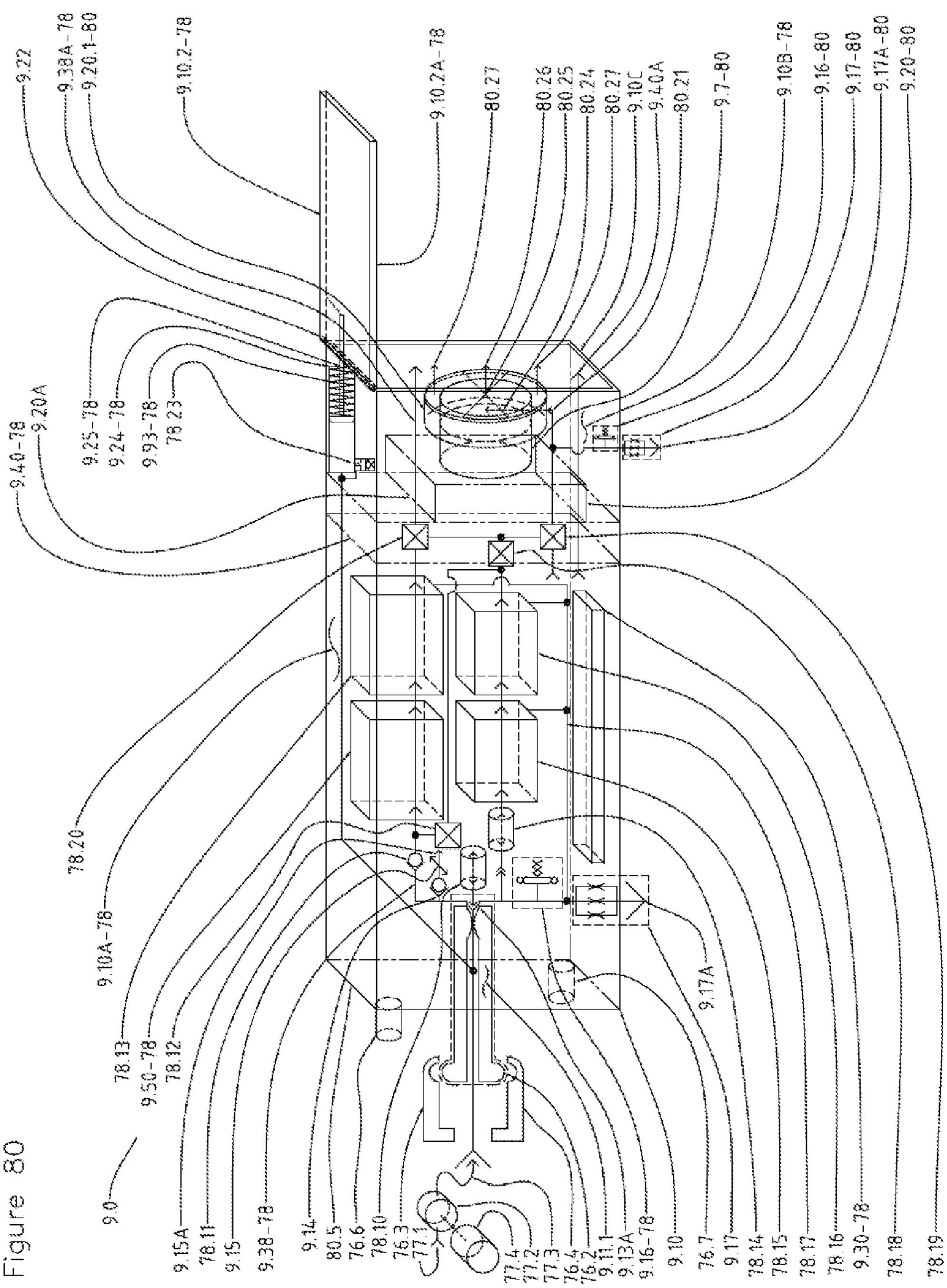
FIG. 80 is an isometric diagram illustrating a Harsh Environment Vision Camera System according to a sixth representative embodiment of the present technology.

FIG. 80 is an isometric diagram illustrating a representative embodiment of a functional equivalent of the actuated Harsh Environment Vision Camera System 79.5 for having the internally unlocked 78.23 actuated open Harsh Environment Vision Camera System 80.5 having a retention knob mounting stem 76.2 to facilitate the compressed air 77.3 being fed into its internal passage where it's gas flow is regulated via the controlled/actuated metering flow/proportional valve 77.10 that utilizes the natural Joule-Thomson/Joule-Kelvin thermodynamics affect 9.13A to cool the incoming gas traveling within the Mounting Stem 9.11.1 causing the moisture in the incoming gas to condense, separate, and is subsequently dispelled 9.17A via the pneumatic Vent 9.17, having the controlled/actuated metering/mixing flow/proportional valve 78.19 being selectively and automatically actuated by the internal control system 9.40 having data from its corresponding internal and or external sensors to direct its pneumatic flow via tube 80.21, having a pneumatic pressure sensor 9.16-80 and its corresponding vent 9.17-80, into the cameras optical lens opening cavity and light-ring 9.20.1-80 cover to create a positive pneumatic pressure 80.24 against the SCHOTT Nanoporous Glass optical glass lens cover 80.25 and light-ring 80.27 cover, or its operational equivalents, to facilitate its self-cleaning via the exiting of the positive pneumatic pressure through the multiple nanoporous openings 80.26 of the SCHOTT Nanoporous Glass optical glass lens cover 80.25 and light-ring 9.20.1-80 cover as required to initiate/maintain/optimize the performance of the Harsh Environment Vision Camera System 80.5.

Figure 81:
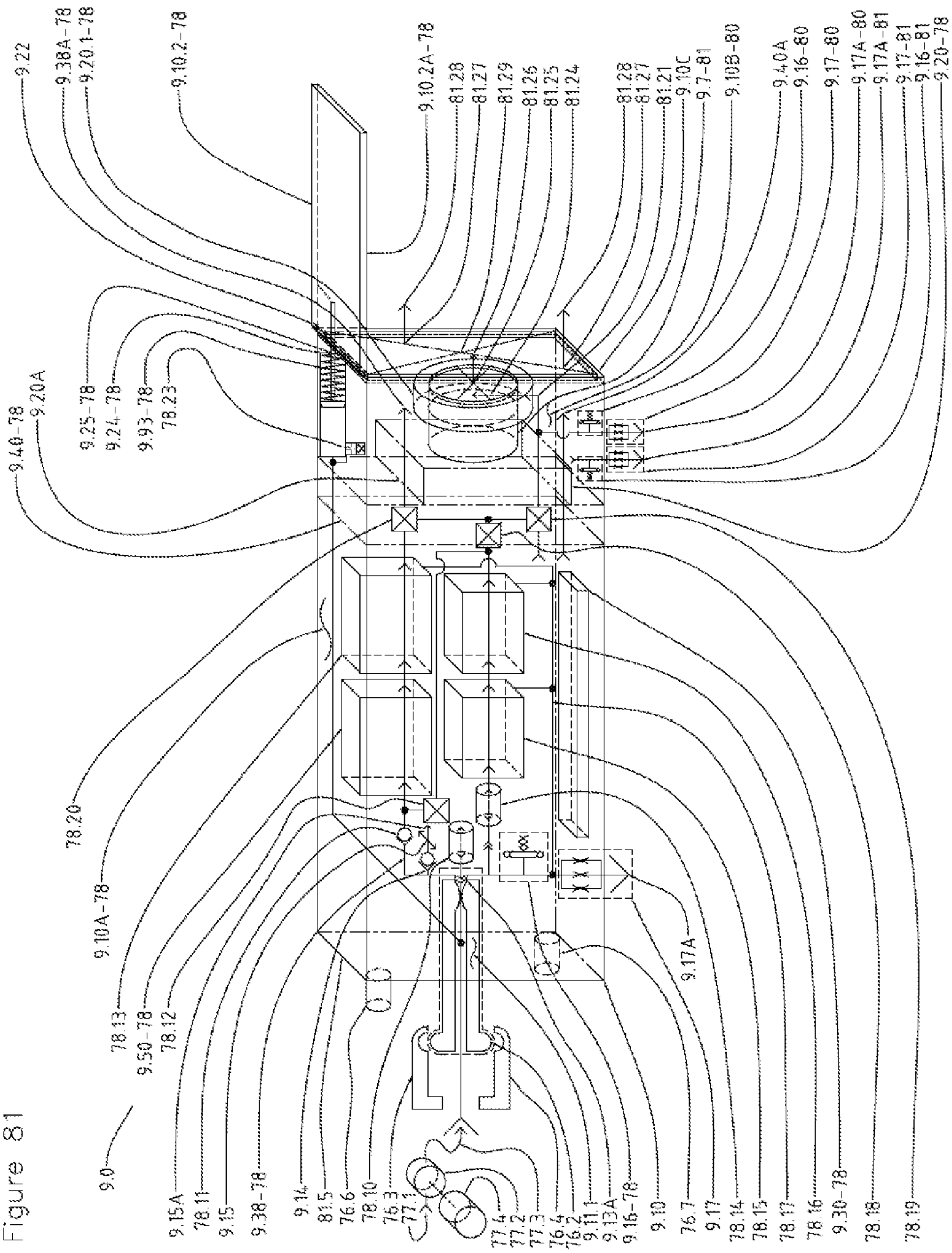
FIG. 81 is an isometric diagram illustrating a Harsh Environment Vision Camera System according to a seventh representative embodiment of the present technology.

FIG. 81 is an isometric diagram illustrating a representative embodiment of a functional equivalent of the actuated Harsh Environment Vision Camera System 80.5 for having the internally unlocked 78.23 actuated open Harsh Environment Vision Camera System 81.5 having a retention knob mounting stem 76.2 to facilitate the compressed air 77.3 being fed into its internal passage where it's gas flow is regulated via the controlled/actuated metering flow/proportional valve 77.10 that utilizes the natural Joule-Thomson/Joule-Kelvin thermodynamics affect 9.13A to cool the incoming gas traveling within the Mounting Stem 9.11.1 causing the moisture in the incoming gas to condense, separate, and is subsequently dispelled 9.17A via the pneumatic Vent 9.17, having the controlled/actuated metering/mixing flow/proportional valve 78.19 being selectively and automatically actuated by the internal control system 9.40 having data from its corresponding internal and or external sensors to direct its pneumatic flow via tube 81.21, having a pneumatic pressure sensor 9.16-81 and its corresponding vent 9.17-81, into the cameras optical lens opening cavity to create a positive pneumatic pressure 81.24 against the SCHOTT Nanoporous Glass optical glass lens cover 81.25 to facilitate its self-cleaning via the exiting of the positive pneumatic pressure through the multiple nanoporous openings 81.26 of the SCHOTT Nanoporous Glass optical glass lens cover 81.25 as required to initiate/maintain/optimize the performance actuated Harsh Environment Vision Camera System 81.5, having a $2^{nd}$ positive pressure pneumatic compartment 9.10B-80 behind the SCHOTT Nanoporous Glass optical glass enclosure opening lens cover 81.29, or its operational equivalents, creating an external self-cleaning optical lands via the exiting of the positive pneumatic pressure through the multiple. Nanoporous openings 81.27 of the SCHOTT Nanoporous Glass optical glass enclosure opening lens cover 81.29 as required to initiate/maintain/optimize the performance of the Harsh Environment Vision Camera System 81.5.

Spindle Tooling for Work-Piece Verification, Data Collection, Utilization, and Exchange:

Via the real-time and automatic spindle tooling comprising either separately and or a combination of Vision Inspection, Vision Pattern Recognition, Vision Capture, Optical Character Recognition, Bar-code scanning, Surface Roughness Measurement, and work holding fixture temperature and work-piece parts' temperature real time data being verified and/or correlated to a specific and unique work-piece parts' identification number and its processing requirements and or specifications. There are multiple configurations for the work-piece part's/article's data collection tooling from having a single task sensor with an optional integral air work-piece part machining chip and cutting coolant blow-off being initially operated by the spindle's pressurized air to open the protective enclosure cover and activate the data collection tool, or having the multi-functionality for Illuminated Vision inspection, laser bar code scanning, and laser distance gauging, as shown in FIGS. 1-14, or advanced functionality having the fore mentioned single task sensor and multi-functionality plus a laser surface roughness gauge and a laser scanning surface profiler for measuring finished bored details, radiuses, etc., as shown in FIGS. 15-28.

The real-time work-piece data temperature collection and the correlated machining corrections has become a requirement for the cost effective machining of precision work-piece parts as the utility cost for maintaining a stable temperature manufacturing environment, that is traceable to National Institute of Standards and Technology measurements being temperature compensated to 68° F. and other standards, can be more expensive than the facilities and utilities needed for machining the work-piece part/article.

The spindle probe tool is a routine method for determining the correct loading of work pieces prior to machining; however, it is a time-consuming portion of the machining operation that can result in the destruction of the spindle probe tool and render it and the machining center that it is installed in operative when the spindle probe tool collides with, and is destroyed or damaged by contact with, an incorrectly loaded work-piece part.

The spindle probe tool is a routine method for determining the location and dimensions of features of the work-piece part; however, without the real-time temperatures of the work-piece part(s), work holding fixture, and the machine tool, the dimensional corrections to the NC-program could be erroneous and an additional source of manufacturing defects.

The following are common examples of the multiple benefits to inspecting the raw casting and or incoming work-piece part/article before the machining operation to determine:

1. The real-time temperatures of the work piece(s) and the machining work holding fixture prior to machining is required to adjust the machine tool's NC-Program for correctly machining the work piece(s).
2. The real-time temperatures of the work piece(s) and the machining work holding fixture during the machining operation being used to adjust the machine tool's NC-Program for correctly machining to the precision tolerances that may be required for the work-piece part/article utilizing the NC-Programs and finish machining work holding fixture.
3. The capturing of the work-piece casting's integral data and identification that may be machined away during the subsequent machining operation being the upper left portion of the raised date code "casting stamp" that was removed by the machining operations for the round port detail and the lower right portion of the raised day code "casting stamp" that was removed by the machining operations for the work piece's engraved identification data detail.
4. The capturing of the information on the casting's permanent and or non-permanent identification and or routing labels that may be machined away during the machining operation.
5. That the specific work pieces are being loaded into the work holding fixture have had their respective machining operation(s) being done correctly.
6. That the work-piece is loaded correctly into the work holding fixture for its correct and safe operation are of an event that can happen when the work-piece part is not loaded correctly.
7. That the work-piece part is loaded correctly into the work holding fixture and that it is secured for its machining operation such as the inadequate hydraulic work holding fixture clamping pressure, or the risk of destructive consequences of having inadequate hydraulic pressure to secure the work-piece part.
8. That the specific work-piece parts are loaded into the multiple work holding fixture locations for their respective machining operation, having the bottom center work-piece part loaded incorrectly or the consequences of a work-piece part having not been loaded correctly and then machined incorrectly.

There are multiple benefits to inspecting the work-piece during the machining operation to determine:

1. That the work-piece part did not move in its work holding fixture during the previous machining operation, where the work-piece part was moved in the work holding fixture during the multiple machining operations.
2. The real-time temperature corrected correlation for the differential of the thermal expansions of the machine tool, work-piece part(s), and the machining work-piece part holding fixture prior to final finish machining operation to adjust the machine tool's NC-Program for correctly machining the work-piece parts(s).

There are multiple benefits to inspecting the work-piece at the end of the machining operation to determine:

1. That the correct surface finish(es) of the machined work piece before the unacceptable machined surface finish work-piece part is released/un-clamped from the pallet/work-piece holding fixture and loses the work-piece parts' datum references as would be needed to re-machine the unacceptable machined surface finish.
2. That the machined details of the work-piece are correct before releasing/un-clamping from the pallet/work-piece holding fixture and losing the work-piece parts' datum references as would be needed to re-machine the unacceptable machined detail.
3. That the manufacturing discrepancies are traceable to the specific machining operations for the work-piece part, the specific machine tool, and its operational variables at the time that it was machined.
4. That all of the initial information, either being via marking ink/pen, label, imprint, pattern and or work-piece part identification, on the work-piece part is captured and correlated to the work-piece part's subsequent identification.
5. That the engraved work-piece part identification data, its operational data, and optionally its encoded engraving land data, is correct and captured in real-time for the integrity of the work piece's data exchange interface(s) and its traceability, as the time and expense for inspection can be more than the time and expense to machine the work-piece parts, while the initial results for both the machining and inspection operations may not be reproducible when the machined details are measured and reported to the millionth of an inch [0.000001].

Advantages of Real-Time Spindle Tooling for Work-Piece Data Collection:

The real-time Spindle Tooling for Work-piece data collection will improve the utilization of machine tools via the elimination of downtime being caused by operator errors, improve the precision of machined work-piece part(s), and improve the environmental safety for the machine tool operators as:

There is a "no load" plus/minus 0.000200" repeatability limitation for the pallet transfer mechanisms, that is typical, of machining centers, for the work-piece part holding pallets' transferring for unloading and reloading the pallet/work-piece holding fixture. As the operator would have to transfer the work-piece part work holding fixture pallet from the internal enclosed machining area, out to the external access area for the operator to inspect the machined work-piece part(s), then transfer the pallet and its work-piece part(s) back into the internal enclosed machining area for the corrective machining operation(s) as required. However the plus/minus 0.000200" repeatability limitation of the machine tool effectively eliminates the benefits of any corrections that could be made via the re-machining of a work-piece part where the true position tolerance for features would need to be more than 0.000400" for a work-piece part having multiple details requiring less of a tolerance.

There are multiple immediate safety and environmental hazards for the operator entering the internal enclosed machining area to inspect the work-piece part(s) in situ, as this area of the machine tool is not designed to be occupied by the operator on a regular basis, such as slippery combustible mineral-based cutting fluids that requires an automatic fire suppression system for the machine's safe operation that could become fatal for the operator if it was activated while the operator was in the enclosed area. Alternatively, slippery water-based cutting fluids can become a bacterial hazard for the operator creating multiple medical risks ranging from a minor asthma attack to fatal bacterial pneumonia, while the long-term human exposure risks to the consumable cutting materials, coatings, and the material being removed by machining operation from the work-piece parts/articles are being determined, there are several materials such as beryllium-copper, graphite, silica, etc. . . . having known human exposure risk.

The in-process inspection of the work-piece part/article during the machining operation is required by the tolerances required for some finish bored hole machining operations that can be done by the means of a "gauge cut" being done semi-automatically via the NC-Program O3173 for the T1760 Rough and Semi-finish rotor bore tool, and the T1757 Finish Rotor bore tool. The operator's selection of the machine tool's "gauge cut" option causes the work-piece part/article to be bored only to a limited depth, which is not critical to the operation of the assembled work-piece part, for the bored feature to be measured and the boring tool's cutter being either (a) used as is, (b.1) adjust the insert(s) actual cutting diameter, (b.2) repeat the "gauge cut" machining operation, (b.3) measure the bored diameter to determine the actual cutting diameter, (b.4) go back to the previous step a or b.1, or (c) replace the boring tool's cutter(s) via (c.1) replacing the worn cutting insert(s), (c.2) backing off the insert(s) effective cutting diameter several thousandths of an inch as determined by operational experience for installing new insert(s), (c.3) repeat the "gauge cut" machining operation, (c.4) measure the bored diameter to determine the new insert(s) actual cutting diameter, (c.5) go to the previous step a or b.1, to machine an acceptable finish bored work-piece.

For the measurement of the bored feature(s) of the work-piece part/article for the cast iron work-piece part "317", the work-piece part must remain in the machining enclosure for its in-process measurements, as the variability of transferring the work-piece part from and back to the machining enclosure is greater than its specified machining tolerance. While having the rough machining cutters' wear condition affecting the temperature rise of the work-piece part/article during the machining operations, the shop's ambient temperature, and the timing for the operator to take measurements of the work-piece part/article after its machining operations are done affecting the measurement's uncertainty ratio. The uncertainty ratio can be as unfavorable as 1:1.6 for the work-piece part/article that has not cooled to near the ambient temperature of the carbon steel master reference bore ring, that is traceable to the National Institute for Standards and Testing for measurements being done at 68 F, used by the operator for the point-of-use comparison measurement of the bored hole(s) inside diameter using a certified dial indicator gauge.

The hours of time required for cooling the work-piece part/article inside of the machining enclosure of an idle machine tool, instead of machining, is considered to be too expensive to be practical. While the variability of the machine tool operator taking the temperature of the work-piece part/article can be unfavorable to the measurement's uncertainty ratio and could expose the operator to multiple immediate safety and environmental hazards for the operator entering the internal enclosed machining area.

Generally, an uncertainty ratio of 1:5 is considered as being practical with a ratio of 1:10 being considered ideal for measurement uncertainty.

Utilizing the spindle touch probe for tight tolerance measurements can negatively affect the uncertainty ratio, as the heat of the machine tool can influence the high resolution glass encoder scale(s) and introduce more uncertainty.

Manual Finish Boring Tooling's Adjustment:

The Spindle Tooling for Work-piece data collection would provide for an automatic real-time point-of-use temperature sensing and measurement(s) to advise the operator of the actual temperatures needed to accurately compensate the measurement(s) for the bored hole dimensional feature(s) that would have to be larger for a work-piece part/article that is warmer than the National Institute for Standards and Testing for measurements being done at 68 F.

Automatic Finish Boring Tooling'S Adjustment:

The Spindle Tooling for Work-piece data collection would provide for an automatic real-time point-of-use temperature sensing and measurement(s) of the work-piece part/article's bored hole feature(s) that could be used with the Kennametal/Romicron finish hole boring tooling, via the CLB Pin for automatic Closed Loop Boring, to make Ø.000080" incremental adjustments, via the mechanical rotation of the spindle, to adjust the hole boring tooling's effective cutting diameter as required. Or the RIGIBORE/ActiveEdge finish hole boring tooling for automatic Closed Loop Boring to make Ø.000040" incremental adjustments electronically, via the wire-less ActiveEdge Interface to the adjustable cartridge holding the interchangeable cutting insert, to adjust the hole boring tooling's effective cutting diameter as required, or either of these Closed Loop Boring Tools' equivalents.

The above description and drawings are illustrative and are not to be construed as limiting. Numerous specific details are described to provide a thorough understanding of the disclosure. However, in some instances, well-known details are not described in order to avoid obscuring the description. Further, various modifications may be made without deviating from the scope of the embodiments. Accordingly, the embodiments are not limited except as by the appended claims.

Reference in this specification to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, nor are separate or alternative embodiments mutually exclusive of other embodiments. Moreover, various features are described which may be exhibited by some embodiments and not by others. Similarly, various requirements are described which may be requirements for some embodiments but not for other embodiments.

The terms used in this specification generally have their ordinary meanings in the art, within the context of the disclosure, and in the specific context where each term is used. It will be appreciated that the same thing can be said in more than one way. Consequently, alternative language and synonyms may be used for any one or more of the terms discussed herein, and any special significance is not to be placed upon whether or not a term is elaborated or discussed herein. Synonyms for some terms are provided. A recital of one or more synonyms does not exclude the use of other synonyms. The use of examples anywhere in this specification, including examples of any term discussed herein, is illustrative only and is not intended to further limit the scope and meaning of the disclosure or of any exemplified term. Likewise, the disclosure is not limited to various embodiments given in this specification. Unless otherwise defined, all technical and scientific terms used herein have the same meaning as commonly understood by one of ordinary skill in the art to which this disclosure pertains. In the case of conflict, the present document, including definitions, will control.

What is claimed is:

1. A harsh environment camera system, comprising:

an enclosure including an electronics compartment and a camera compartment having a camera opening;

a camera module disposed within the camera compartment;

one or more electronic components capable of generating heat positioned in the electronics compartment;

a compressed gas connector connectable to a gas source;

a metering orifice including an outlet, and an inlet in fluid communication with the connector, the metering orifice operative to cool a gas flowing therethrough, thereby condensing moisture from the gas; and a gas conduit connected to the metering orifice adjacent the outlet, extending downstream through the electronics compartment and into the camera compartment, wherein at least a portion of the gas conduit is positioned in close proximity to the one or more electronic components, whereby the gas is heated prior to entering the camera compartment.

2. The camera system of claim 1, further comprising a vent line in fluid communication with the outlet configured to channel the moisture away from the metering orifice.

3. The camera system of claim 1, further comprising a communication module disposed between the camera compartment and the electronics compartment.

4. The camera system of claim 1, wherein the one or more electronic components includes a battery module.

5. The camera system of claim 1, further comprising a camera cover pivotably mounted to the enclosure proximate the camera opening and moveable between an open position wherein the camera opening is uncovered and a closed position wherein the camera opening is covered.

6. The camera system of claim 5, further comprising one or more actuators connected between the enclosure and the camera cover, operative to move the camera cover between the open position and the closed position.

7. The camera system of claim 5, further comprising one or more pneumatic cylinders extending between the enclosure and the camera cover and connected to the compressed gas connector, wherein the one or more pneumatic cylinders are operative to move the camera cover between the open position and the closed position.

8. A harsh environment camera system, comprising:
- an enclosure including an electronics compartment and a camera compartment having a camera opening;
- a communication module disposed between the camera compartment and the electronics compartment;
- a camera module disposed within the camera compartment;
- a camera cover pivotably mounted to the enclosure proximate the camera opening and moveable between an open position wherein the camera opening is uncovered and a closed position wherein the camera opening is covered;
- one or more battery modules positioned in the electronics compartment;
- a compressed gas connector connectable to a gas source;
- a metering orifice including an outlet, and an inlet in fluid communication with the connector, the metering orifice operative to cool a gas flowing therethrough, thereby condensing moisture from the gas;
- a gas conduit connected to the metering orifice adjacent the outlet, extending downstream through the electronics compartment and into the camera compartment, wherein at least a portion of the gas conduit is positioned in close proximity to the one or more electronic components, whereby the gas is heated prior to entering the camera compartment; and
- a vent line in fluid communication with the outlet configured to channel the moisture away from the metering orifice.

9. The camera system of claim 8, further comprising one or more actuators connected between the enclosure and the camera cover, operative to move the camera cover between the open position and the closed position.

10. The camera system of claim 8, further comprising one or more pneumatic cylinders extending between the enclosure and the camera cover and connected to the compressed gas connector, wherein the one or more pneumatic cylinders are operative to move the camera cover between the open position and the closed position.

11. The camera system of claim 8, further comprising a secondary gas conduit interconnecting the camera compartment and the electronics compartment.

12. The camera system of claim 11, further comprising a flow control valve positioned along the secondary gas conduit.

13. A harsh environment camera system, comprising:
- an enclosure including an electronics compartment and a camera compartment having a camera opening;
- a camera module disposed within the camera compartment;
- a heating module positioned in the electronics compartment;
- a cooling module positioned in the electronics compartment;
- a compressed gas connector connectable to a gas source;
- a metering orifice including an outlet, and an inlet in fluid communication with the connector; and
- a gas conduit connected to the metering orifice adjacent the outlet, extending downstream through the electronics compartment and into the camera compartment, wherein a first portion of the gas conduit extends through the cooling module and a second portion of the gas conduit extends through the heating module, whereby the gas can be selectively heated and/or cooled prior to entering the camera compartment.

14. The camera system of claim 13, further comprising a communication module disposed between the camera compartment and the electronics compartment.

15. The camera system of claim 14, further comprising a camera cover pivotably mounted to the enclosure proximate the camera opening and moveable between an open position wherein the camera opening is uncovered and a closed position wherein the camera opening is covered.

16. The camera system of claim 15, further comprising one or more actuators connected between the enclosure and the camera cover, operative to move the camera cover between the open position and the closed position.

17. The camera system of claim 15, further comprising one or more pneumatic cylinders extending between the enclosure and the camera cover and connected to the compressed gas connector, wherein the one or more pneumatic cylinders are operative to move the camera cover between the open position and the closed position.

* * * * *

UNITED STATES PATENT AND TRADEMARK OFFICE

CERTIFICATE OF CORRECTION

PATENT NO. : 9,930,230 B2
APPLICATION NO. : 15/435855
DATED : March 27, 2018
INVENTOR(S) : Larry Costa It is certified that error appears in the above-identified patent and that said Letters Patent is hereby corrected as shown below:

In Column 1, Line 47, delete “and or” and insert -- and/or --, therefor.

In Column 1, Line 56, delete “and or” and insert -- and/or --, therefor.

In Column 1, Line 62, delete “and or” and insert -- and/or --, therefor.

In Column 2, Line 25, delete “and or” and insert -- and/or --, therefor.

In Column 2, Lines 34-35, delete “and or” and insert -- and/or --, therefor.

In Column 2, Line 35, delete “and or” and insert -- and/or --, therefor.

In Column 2, Line 36, delete “and or” and insert -- and/or --, therefor.

In Column 2, Line 48, delete “and or” and insert -- and/or --, therefor.

In Column 2, Line 49, delete “and or” and insert -- and/or --, therefor.

In Column 2, Line 58, delete “and or” and insert -- and/or --, therefor.

In Column 2, Lines 59-60, delete “and or” and insert -- and/or --, therefor.

In Column 3, Line 21, delete “and or” and insert -- and/or --, therefor.

In Column 3, Line 26, delete “and or” and insert -- and/or --, therefor.

In Column 3, Line 28, delete “and or” and insert -- and/or --, therefor.

In Column 3, Line 33, delete “and or” and insert -- and/or --, therefor.

Signed and Sealed this
Fifth Day of June, 2018

Andrei Iancu
*Director of the United States Patent and Trademark Office*

In Column 3, Line 64, delete "and or" and insert -- and/or --, therefor.

In Column 4, Line 1, delete "and or" and insert -- and/or --, therefor.

In Column 5, Line 14, delete "and or" and insert -- and/or --, therefor.

In Column 6, Line 7, delete "and or" and insert -- and/or --, therefor.

In Column 6, Line 9, delete "and or" and insert -- and/or --, therefor.

In Column 8, Line 11, delete "and or" and insert -- and/or --, therefor.

In Column 8, Line 52, delete "and or" and insert -- and/or --, therefor.

In Column 9, Line 7, after "10.1.14" insert -- . --.

In Column 14, Line 31, before "Selectively" delete "and or" and insert -- and/or --, therefor.

In Column 14, Line 31, after "Sealed" delete "and or" and insert -- and/or --, therefor.

In Column 14, Line 32, delete "and or" and insert -- and/or --, therefor.

In Column 14, Line 39, after "water," delete "and or" and insert -- and/or --, therefor.

In Column 14, Line 39, before "synthetic" delete "and or" and insert -- and/or --, therefor.

In Column 14, Line 41, delete "and or" and insert -- and/or --, therefor.

In Column 14, Line 51, delete "and or" and insert -- and/or --, therefor.

In Column 14, Line 55, delete "and or" and insert -- and/or --, therefor.

In Column 15, Line 12, delete "and or" and insert -- and/or --, therefor.

In Column 15, Line 35, delete "and or" and insert -- and/or --, therefor.

In Column 16, Line 11, delete "and or" and insert -- and/or --, therefor.

In Column 16, Line 12, delete "and or" and insert -- and/or --, therefor.

In Column 16, Line 21, delete "and or" and insert -- and/or --, therefor.

In Column 16, Line 24, delete "and or" and insert -- and/or --, therefor.

In Column 16, Line 31, delete "and or" and insert -- and/or --, therefor.

In Column 16, Line 36, before “during” delete “and or” and insert -- and/or --, therefor.

In Column 16, Line 36, after “partial” delete “and or” and insert -- and/or --, therefor.

In Column 16, Line 56, delete “and or” and insert -- and/or --, therefor.

In Column 16, Line 61, after “debris” delete “and or” and insert -- and/or --, therefor.

In Column 16, Line 61, after “in” delete “and or” and insert -- and/or --, therefor.

In Column 16, Line 62, delete “and or” and insert -- and/or --, therefor.

In Column 16, Lines 65-66, delete “and or” and insert -- and/or --, therefor.

In Column 17, Line 3, delete “and or” and insert -- and/or --, therefor.

In Column 17, Line 6, delete “and or” and insert -- and/or --, therefor.

In Column 17, Line 7, delete “and or” and insert -- and/or --, therefor.

In Column 17, Line 12, delete “and or” and insert -- and/or --, therefor.

In Column 17, Line 13, delete “and or” and insert -- and/or --, therefor.

In Column 17, Line 15, delete “and or” and insert -- and/or --, therefor.

In Column 17, Line 16, delete “and or” and insert -- and/or --, therefor.

In Column 17, Line 20, delete “and or” and insert -- and/or --, therefor.

In Column 17, Line 21, delete “and or” and insert -- and/or --, therefor.

In Column 17, Line 30, delete “and or” and insert -- and/or --, therefor.

In Column 17, Line 33, delete “and or” and insert -- and/or --, therefor.

In Column 17, Line 63, delete “and or” and insert -- and/or --, therefor.

In Column 17, Line 64, delete “and or” and insert -- and/or --, therefor.

In Column 18, Line 6, delete “and or” and insert -- and/or --, therefor.

In Column 18, Line 9, delete “and or” and insert -- and/or --, therefor.

In Column 18, Line 17, delete “and or” and insert -- and/or --, therefor.

In Column 18, Line 22, delete "and or" and insert -- and/or --, therefor.

In Column 18, Line 44, delete "and or" and insert -- and/or --, therefor.

In Column 18, Line 55, delete "and or" and insert -- and/or --, therefor.

In Column 18, Line 57, delete "and or" and insert -- and/or --, therefor.

In Column 18, Line 61, delete "and or" and insert -- and/or --, therefor.

In Column 18, Line 66, delete "and or" and insert -- and/or --, therefor.

In Column 19, Line 8, delete "and or" and insert -- and/or --, therefor.

In Column 19, Lines 18-19, delete "and or" and insert -- and/or --, therefor.

In Column 19, Line 25, delete "and or" and insert -- and/or --, therefor.

In Column 19, Line 26, delete "and or" and insert -- and/or --, therefor.

In Column 19, Line 41, delete "and or" and insert -- and/or --, therefor.

In Column 19, Line 42, delete "and or" and insert -- and/or --, therefor.

In Column 19, Line 47, delete "and or" and insert -- and/or --, therefor.

In Column 19, Line 48, delete "and or" and insert -- and/or --, therefor.

In Column 19, Line 55, delete "and or" and insert -- and/or --, therefor.

In Column 19, Line 61, after "CO2" delete "and or" and insert -- and/or --, therefor.

In Column 19, Line 61, After "N2" delete "and or" and insert -- and/or --, therefor.

In Column 19, Line 62, delete "and or" and insert -- and/or --, therefor.

In Column 19, Line 63, delete "and or" and insert -- and/or --, therefor.

In Column 19, Line 65, delete "and or" and insert -- and/or --, therefor.

In Column 19, Line 66, delete "and or" and insert -- and/or --, therefor.

In Column 20, Line 43, after "defrost" delete "and or" and insert -- and/or --, therefor.

In Column 20, Line 43, after "defog" delete "and or" and insert -- and/or --, therefor.

In Column 20, Line 51, delete "and or" and insert -- and/or --, therefor.

In Column 20, Line 52, delete "and or" and insert -- and/or --, therefor.

In Column 22, Line 26, delete "and or" and insert -- and/or --, therefor.

In Column 22, Line 31, delete "and or" and insert -- and/or --, therefor.

In Column 22, Line 52, delete "and or" and insert -- and/or --, therefor.

In Column 23, Line 13, delete "and or" and insert -- and/or --, therefor.

In Column 23, Line 43, delete "and or" and insert -- and/or --, therefor.

In Column 23, Line 67, delete "and or" and insert -- and/or --, therefor.

In Column 24, Line 7, delete "and or" and insert -- and/or --, therefor.

In Column 24, Line 48, delete "and or" and insert -- and/or --, therefor.

In Column 25, Line 5, after "permanent" delete "and or" and insert -- and/or --, therefor.

In Column 25, Line 5, after "identification" delete "and or" and insert -- and/or --, therefor.

In Column 25, Line 58, delete "and or" and insert -- and/or --, therefor.

In Column 26, Line 5, delete "[0.000001]." and insert -- [0.000001″]. --, therefor.

In Column 27, Line 51, delete "Tooling'S" and insert -- Tooling's --, therefor.